(12) United States Patent
Zeng

(10) Patent No.: US 12,072,176 B2
(45) Date of Patent: Aug. 27, 2024

(54) MEASURING APPARATUS AND METHOD OF WAFER GEOMETRY

(71) Applicant: Nanjing ZhongAn Semiconductor Equipment Ltd, Nanjing (CN)

(72) Inventor: An Andrew Zeng, Nanjing (CN)

(73) Assignee: Nanjing ZhongAn Semiconductor Equipment Ltd, Nanjing (CN)

( * ) Notice: Subject to any disclaimer, the term of this patent is extended or adjusted under 35 U.S.C. 154(b) by 334 days.

(21) Appl. No.: 17/561,902

(22) Filed: Dec. 24, 2021

(65) Prior Publication Data

US 2022/0120559 A1 Apr. 21, 2022

Related U.S. Application Data

(63) Continuation-in-part of application No. PCT/US2020/049009, filed on Sep. 2, 2020.

(60) Provisional application No. 62/953,696, filed on Dec. 26, 2019.

(30) Foreign Application Priority Data

| Dec. 25, 2020 | (CN) | 202011567672.2 |
| Dec. 25, 2020 | (CN) | 202011567675.6 |
| Dec. 25, 2020 | (CN) | 202011569046.7 |
| Dec. 25, 2020 | (CN) | 202011569092.7 |
| Dec. 25, 2020 | (CN) | 202023202278.7 |
| Apr. 13, 2021 | (CN) | 202110396624.X |

(51) Int. Cl.
*G01B 11/24* (2006.01)
*G01B 11/06* (2006.01)
*G01B 11/30* (2006.01)

(52) U.S. Cl.
CPC .......... *G01B 11/2441* (2013.01); *G01B 11/06* (2013.01); *G01B 11/306* (2013.01); *G01B 2210/56* (2013.01)

(58) Field of Classification Search
CPC ... G01B 11/2441; G01B 11/06; G01B 11/306; H01L 22/20; H01L 22/12
See application file for complete search history.

(56) References Cited

U.S. PATENT DOCUMENTS 5,511,005 A * 4/1996 Abbe ............... H01L 22/20
324/750.25
6,184,994 B1 * 2/2001 Freischlad ......... G01B 9/02083
356/511

(Continued)

*Primary Examiner* — Jonathan M Hansen
(74) *Attorney, Agent, or Firm* — Westbridge IP LLC

(57) ABSTRACT

Embodiments of the present application provide a measuring apparatus and method of a wafer geometry. The measuring apparatus of the wafer geometry includes: an air-bearing chuck, configured to generate an air cushion to keep a wafer to be measured floating up on a top surface of the air-bearing chuck; and an interferometer, disposed on one side, away from the air-bearing chuck, of the wafer, and configured to obtain an interference fringe image of a front surface of the wafer to measure a geometry of the wafer based on the interference fringe image. An air cushion is generated by utilizing an air-bearing chuck to keep a wafer to be measured floating up on a top surface of the air-bearing chuck, thereby avoiding damage of the original shape of the wafer or contamination of the wafer by a clamping tool, and further reducing errors during measurement.

19 Claims, 23 Drawing Sheets

(56) References Cited

U.S. PATENT DOCUMENTS

| | | | |
|---|---|---|---|
| 7,604,439 B2 * | 10/2009 | Yassour | H01L 21/6838 414/676 |
| 2002/0142493 A1 * | 10/2002 | Halliyal | C23C 14/547 118/712 |
| 2008/0229811 A1 * | 9/2008 | Zhao | F16C 32/0603 73/104 |
| 2016/0153769 A1 * | 6/2016 | Pareschi | G01B 11/0675 356/503 |
| 2018/0226304 A1 * | 8/2018 | Chen | G01B 11/306 |

* cited by examiner

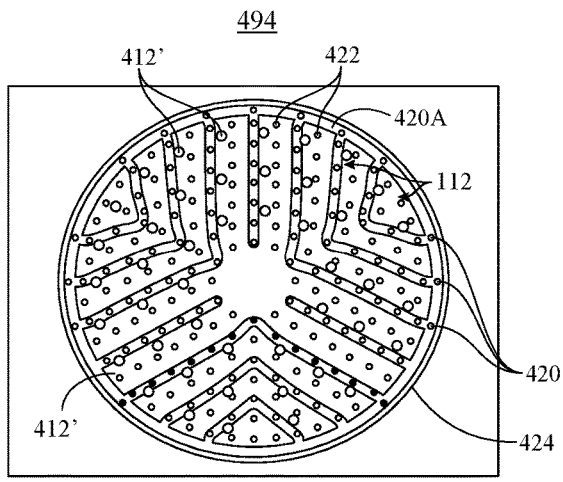
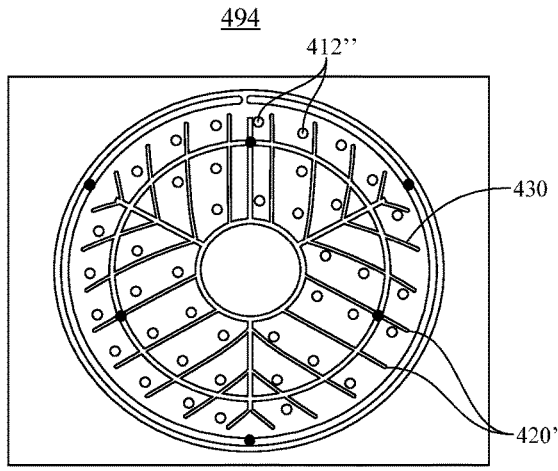
FIG. 18  FIG. 19
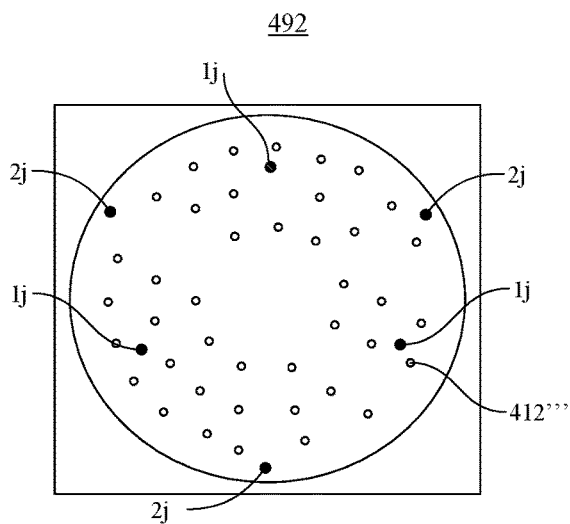
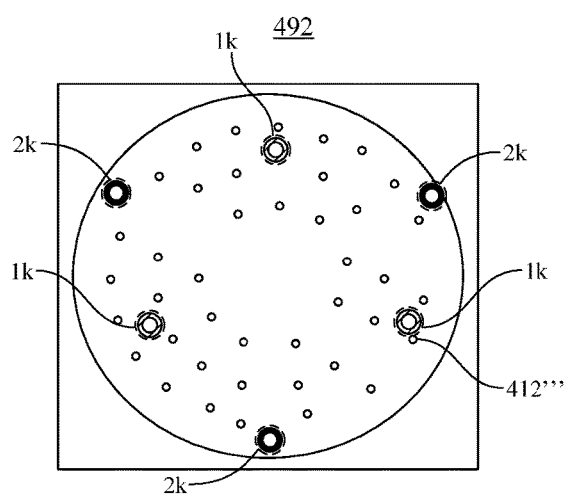
FIG. 20  FIG. 21
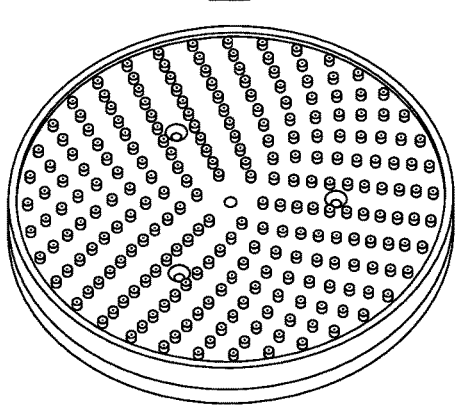
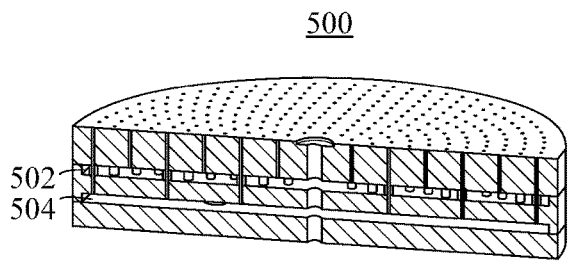
FIG. 22a  FIG. 22b

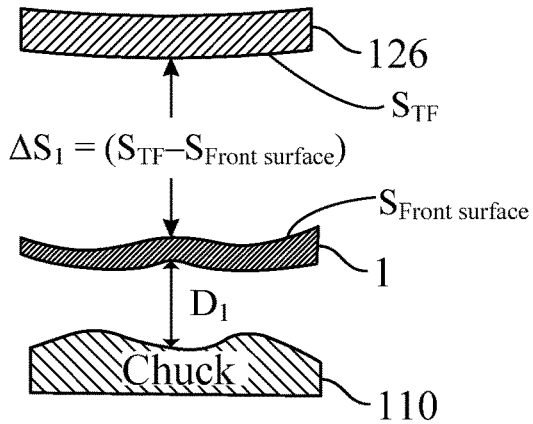

FIG. 24b

| Measuring, by utilizing an interferometer, a second distance variation $\Delta S_2$ between a surface $S_{TF}$ of a transmission flat and a surface $S_{ref}$, close to the transmission flat, of a reference object | S111 |
|---|---|
| Determining, based on $\Delta S_2$ and the location information of $S_{ref}$, the location information of the surface $S_{TF}$, close to the air-bearing chuck, of the transmission flat | S112 |
| Holding, by utilizing support force provided by the air-bearing chuck, a wafer at a first predetermined distance $D_1$ from a top surface of the air-bearing chuck, so that the wafer being located between the transmission flat and the air-bearing chuck, and $D_1 > 0$ | S120 |
| Measuring, by utilizing an interferometer, a first distance variation $\Delta S_1$ between a front surface $S_{Front\ surface}$ of the wafer and the surface $S_{TF}$ of the transmission flat | S130 |
| Determining the shape of the front surface $S_{Front\ surface}$ of the wafer based on $\Delta S_1$ and the location information of $S_{TF}$ | S140 |

FIG. 25

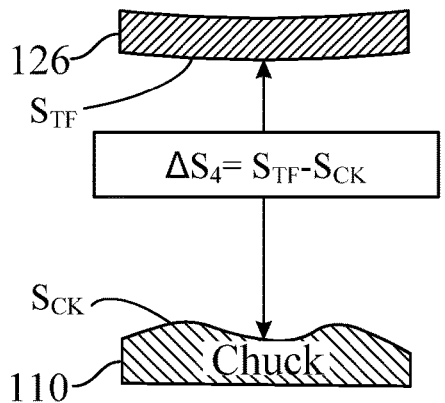
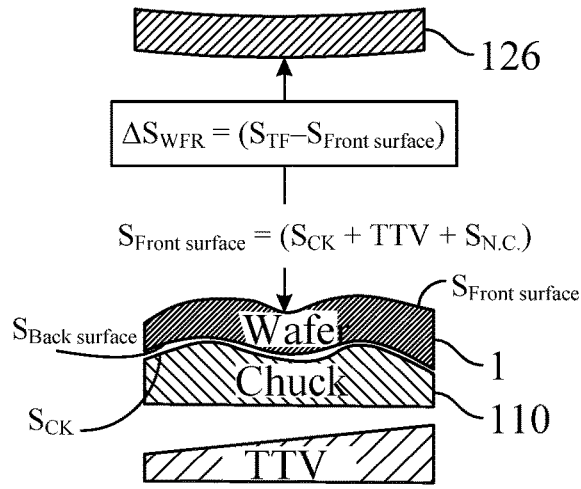

FIG. 42a   FIG. 42b

| Adjusting, by utilizing suction force provided by an air-bearing chuck, a back surface of a wafer to keep the back surface of the wafer flat or make the back surface of the wafer match a top surface of the air-bearing chuck | S710 |

↓

| Holding, by utilizing support force provided by the air-bearing chuck, the wafer at a second predetermined distance $D_2$ from the top surface of the air-bearing chuck | S720 |

↓

| Measuring, by utilizing an interferometer, a third distance variation $\Delta S_3$ between opposing surfaces of the wafer and a transmission flat | S730 |

↓

| Obtaining a nonconforming item $S_{N.C.}$ between the back surface $S_{Back\ surface}$ of the wafer and the top surface $S_{CK}$ of the air-bearing chuck | S735 |

↓

| Obtaining a flatness $TTV_1$ of the wafer by subtracting $\Delta S_3$ and $S_{N.C.}$ from $\Delta S_4$ | S7401 |

FIG. 43

MEASURING APPARATUS AND METHOD OF WAFER GEOMETRY

CROSS-REFERENCE TO RELATED APPLICATIONS

This application is a continuation-in-part application of International Application No. PCT/US2020/049009 filed on Sep. 2, 2020, which claims priority to U.S. 62/953,696 filed on Dec. 26, 2019. This application also claims priority to Chinese patent applications No. 202011567672.2 filed on Dec. 25, 2020, No. 202023202278.7 filed on Dec. 25, 2020, No. 202011567675.6 filed on Dec. 25, 2020, No. 202011569046.7 filed on Dec. 25, 2020, No. 202011569092.7 filed on Dec. 25, 2020, and No. 202110396624.X filed on Apr. 13, 2021. These applications are incorporated herein by reference in their entireties.

TECHNICAL FIELD

The present application relates to the field of wafer geometry measuring technologies, and in particular to a measuring apparatus and method of a wafer geometry.

BACKGROUND

Geometries of a wafer such as a shape and a thickness play a crucial role in the quality of the wafer. Therefore, measuring the geometries of the wafer is important for evaluating the quality of the wafer. Typically, a wafer geometry measuring device with an optical path may be configured to measure the geometries of the wafer, and the wafer is vertically fixed in the optical path in a clamping manner.

However, when clamping force is relatively large, an original shape of the wafer is easily changed. In addition, since it is difficult to guarantee cleanliness of a clamping tool, and debris particles or other contaminants are easily produced on the wafer, there are larger errors during measurement.

SUMMARY

In view of this, embodiments of the present application provide a measuring apparatus and method of a wafer geometry, to avoid damage of an original shape of a wafer or contamination of the wafer by a clamping tool, and reduce errors during measurement.

A first aspect of the present application provides a measuring apparatus of a wafer geometry. The measuring apparatus of the wafer geometry includes an air-bearing chuck and an interferometer. The air-bearing chuck is configured to generate an air cushion to keep a wafer to be measured floating up on a top surface of the air-bearing chuck. The interferometer is disposed on one side, away from the air-bearing chuck, of the wafer, and configured to obtain an interference fringe image of a front surface of the wafer to measure a geometry of the wafer based on the interference fringe image. The front surface of the wafer is a surface is away from the air-bearing chuck, of the wafer. The geometry of the wafer includes one or more of a shape and a flatness of the wafer.

A second aspect of the present application provides a measuring method of a wafer shape. The measuring method of the wafer shape includes: obtaining location information of a surface $S_{TF}$, close to an air-bearing chuck, of a transmission flat; holding, by utilizing support force provided by the air-bearing chuck, a wafer at a first predetermined distance $D_1$ from a top surface of the air-bearing chuck, so that the wafer is located between the transmission flat and the air-bearing chuck, and $D_1 > 0$; measuring, by utilizing an interferometer, a first distance variation $\Delta S_1$ between a front surface $S_{Front\ surface}$ of the wafer and the surface $S_{TF}$ of the transmission flat; and determining a shape of the front surface $S_{Front\ surface}$ of the wafer based on $\Delta S_1$ and the location information of $S_{TF}$. The front surface of the wafer is configured to reflect light, the front surface of the wafer is a surface, away from the air-bearing chuck, of the wafer, and the interferometer includes the transmission flat.

A third aspect of the present application provides a measuring method of a wafer flatness. The measuring method of the wafer flatness includes: adjusting a back surface of a wafer by utilizing suction force provided by an air-bearing chuck to keep the back surface of the wafer flat or make the back surface of the wafer match a top surface of the air-bearing chuck, and the back surface of the wafer being a surface, close to the air-bearing chuck, of the wafer; holding, by utilizing support force provided by the air-bearing chuck, the wafer at a second predetermined distance $D_2$ from the top surface of the air-bearing chuck; measuring, by utilizing an interferometer, a third distance variation $\Delta S_3$ between opposing surfaces of the wafer and the transmission flat, and obtaining a flatness $TTV_1$ of the wafer based on $\Delta S_3$ and a fourth distance variation $\Delta S_4$. The interferometer is located on one side, away from the air-bearing chuck, of the transmission flat, the top surface of the air-bearing chuck and a front surface of the wafer are configured to reflect light. The front surface of the wafer is a surface, away from the air-bearing chuck, of the wafer. $\Delta S_4$ denotes a distance variation, measured by utilizing the interferometer when the wafer is not loaded, between the opposing surfaces of the wafer and the transmission flat.

According to the technical solution provided by the embodiments of the present application, an air cushion is generated by utilizing an air-bearing chuck, to keep a wafer to be measured floating up on a top surface of the air-bearing chuck, thereby avoiding damage of the original shape of the wafer or contamination of the wafer by a clamping tool, and further reducing errors during measurement.

BRIEF DESCRIPTION OF DRAWINGS

FIG. 18 is a top view of an exemplary manifold plate of a stacked structure.

FIG. 19 is a bottom view of an exemplary manifold plate of a stacked structure.

FIG. 20 is a top view of the back cover plate of a stacked structure.

FIG. 21 is a bottom view of the back cover plate of a stacked structure.

FIG. 22a and FIG. 22b are schematic structural diagrams of an exemplary manifold chamber according to an embodiment of the present application.

FIG. 24b is a schematic structural diagram corresponding to a measuring method of a wafer shape according to an embodiment of the present application.

FIG. 25 is a schematic flow diagram of a measuring method of a wafer shape according to another embodiment of the present application.

FIG. 42a and FIG. 42b are schematic structural diagrams corresponding to a measuring method of a wafer flatness according to an embodiment of the present application.

FIG. 43 is a schematic flow diagram of a measuring method of a wafer flatness according to another embodiment of the present application.

DESCRIPTION OF EMBODIMENTS

The following clearly and completely describes technical solutions in embodiments of the present application with reference to accompanying drawings required to be configured in the embodiments of the present application. Apparently, the following descriptions of drawings are merely some but not all of the embodiments of the present application.

It should be noted that all related embodiments obtained by a person of ordinary skill in the art based on the embodiments of the present application without creative efforts shall fall within the protection scope of the present application.

In the present application, "wafer geometry" may refer to wafer shape parameters, as well as local flatness parameters (also referred to as local plainness parameters, such as Site Flatness (SFQR), Site flatness Back Ideal Range (SBIR), and Global Flatness (GBIR)). Wafer flatness, also referred to as Total Thickness Variation (TTV), may refer to high density raw data (e.g., ≥4 Mpixels/wafer) that may be configured for deriving SFQR, GBIR, and many other related parameters. Flatness data is normally associated with both front surface and back surface information of a wafer. For example, the wafer shape parameters may be derived from a height map of a single surface, and the single surface may be a front surface or a back surface of a wafer, or may be medium of the two surfaces (e.g., wafer shape defined by Semiconductor Equipment and Materials International (SEMI)). For advanced 300 mm wafer, there is a very small difference between a shape obtained by medium value of the front surface and the back surface of the wafer, a shape only obtained by the front surface of the wafer and a shape only obtained by the back surface of the wafer. This is because the wafer shape is in the order of a few micron to a few hundred micron, while TTV or GBIR is in the order of tens or hundreds of nanometers. In a patterned wafer geometry tool, wafer shape may be calculated from either the front surface or the back surface, depending on suppliers of the tools.

Figure 1:
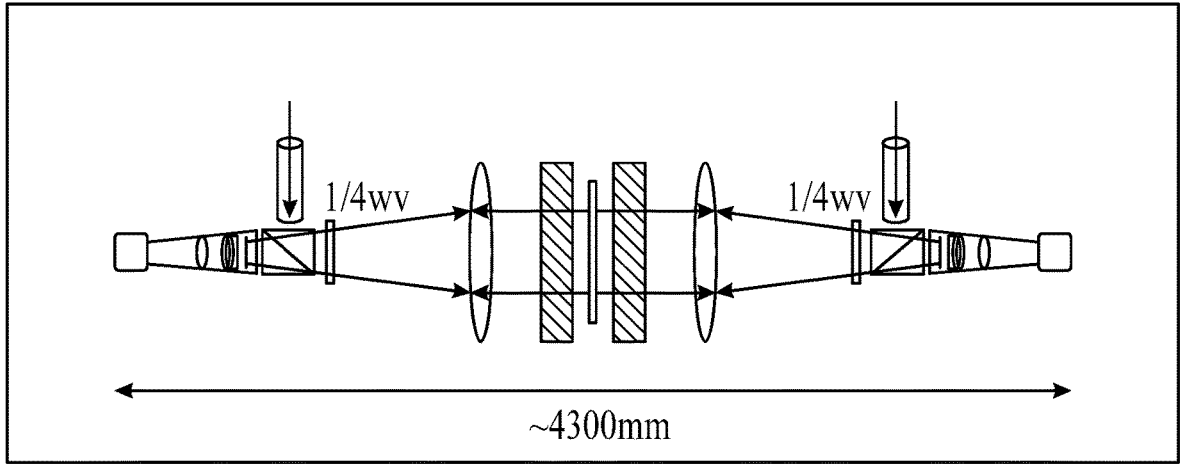
FIG. 1 is a schematic structural diagram of a dual Fizeau interferometer-based tool.

Wafer geometry tool (Wafer Geometry Tool, "WGT" for short, also referred to as a measuring apparatus of wafer geometry) is a metrology tool that may be configured in Si wafer manufacturing fabs for characterizing wafer flatness, nano-topography and shape (e.g., bow and warp), and may also be configured in a glass wafer fab. Typically, each wafer has to be certified by WGT type of tools before shipping to a customer. There are several existing tools serving this purpose. For example, capacitive sensor-based wafer geometry tools are widely used in 200 mm wafer fabs. FIG. 1 is a schematic structural diagram of a dual Fizeau interferometer-based tool. The tool may be configured to measure the wafer geometry of 300 mm wafers. Interferometer-based wafer geometry tool has the advantage in both precision and throughput. Its precision is about one to two magnitude better than that of capacitive sensor-based tool, despite of the fact that 300 mm wafer is more prone to vibration than that of 200 mm wafer. However, there have been no interferometer-based 200 mm wafer geometry tool on the market. Capacitive sensor-based wafer geometry tools were designed for 250 nm, 180 nm, 130 nm, and 90 nm node processes. Capacitive sensor tool cannot keep up with the precision and throughput requirement for design nodes smaller than 90 nm.

Dual Fizeau interferometer architecture of 300 mm tool has been used in 300 mm fabs. However, it cannot be used for smaller fabs such as 200 mm wafer since 200 mm wafer is single side polished. The backside of the wafer does not reflect light. There has been no wafer geometry tool with a single Fizeau interferometer ("WGT-SFI") even though there are market needs for such a tool, namely, an accurate and cost-effective tool for 200 mm wafer house or a cost effective and high throughput pattern wafer geometry tool for memory and logic fabrication planets ("fabs"). There are at least a few reasons that no WGT-SFI has existed. First, it is difficult to measure flatness or Total Thickness Variation (TTV) of a wafer from one side of the wafer without information of the other side. One method to measure TTV is to use a vacuum chuck, where the backside of a wafer is vacuumed down and flattened on the chuck. As a result, the TTV of the wafer can show up on the front side, which could cause defocus errors in lithography process and cause yield loss.

Figure 2:
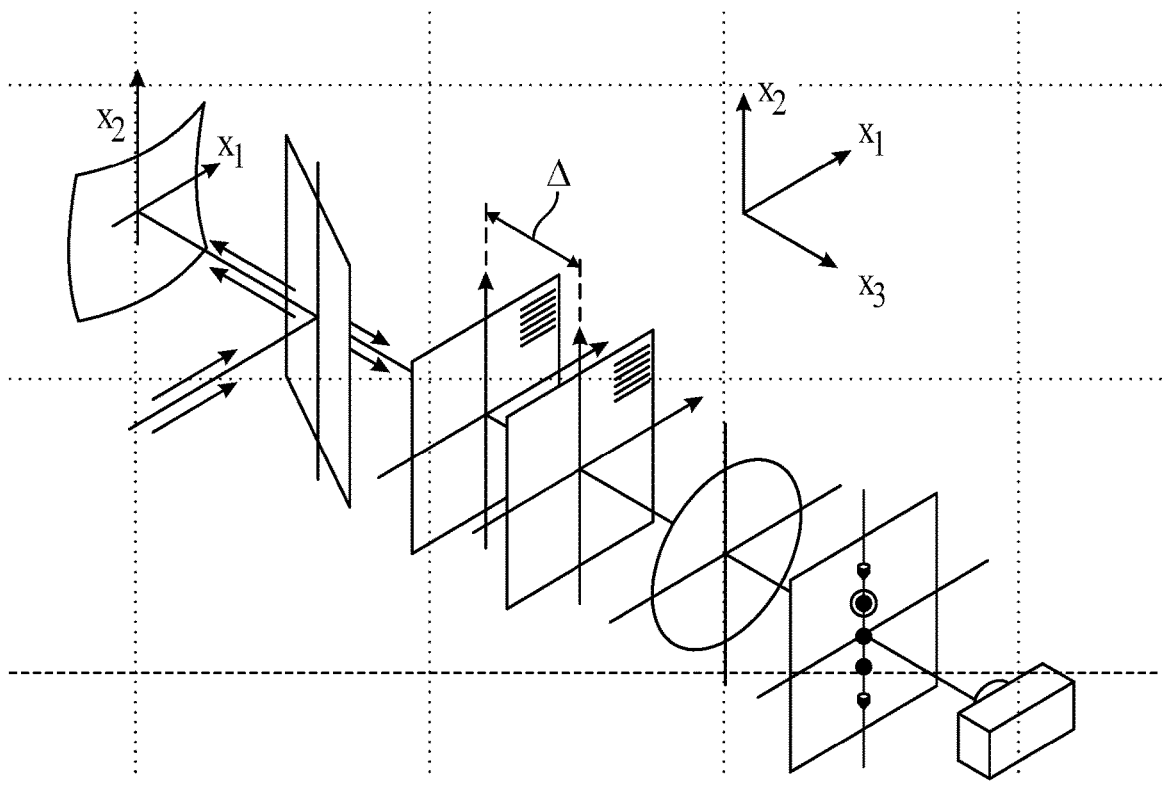
FIG. 2 is a schematic structural diagram of a shearing interferometer-based tool.

FIG. 2 is a schematic structural diagram of a shearing interferometer-based tool.

The shearing interferometer-based tool includes a transmission grating-based shearing interferometer. The shearing interferometer-based tool measures the shape of a wafer while the wafer is supported 3 pins. The measured shape includes wafer deformation under gravity and has to be calibrated out through algorithm.

WGT Architecture

Figure 3:
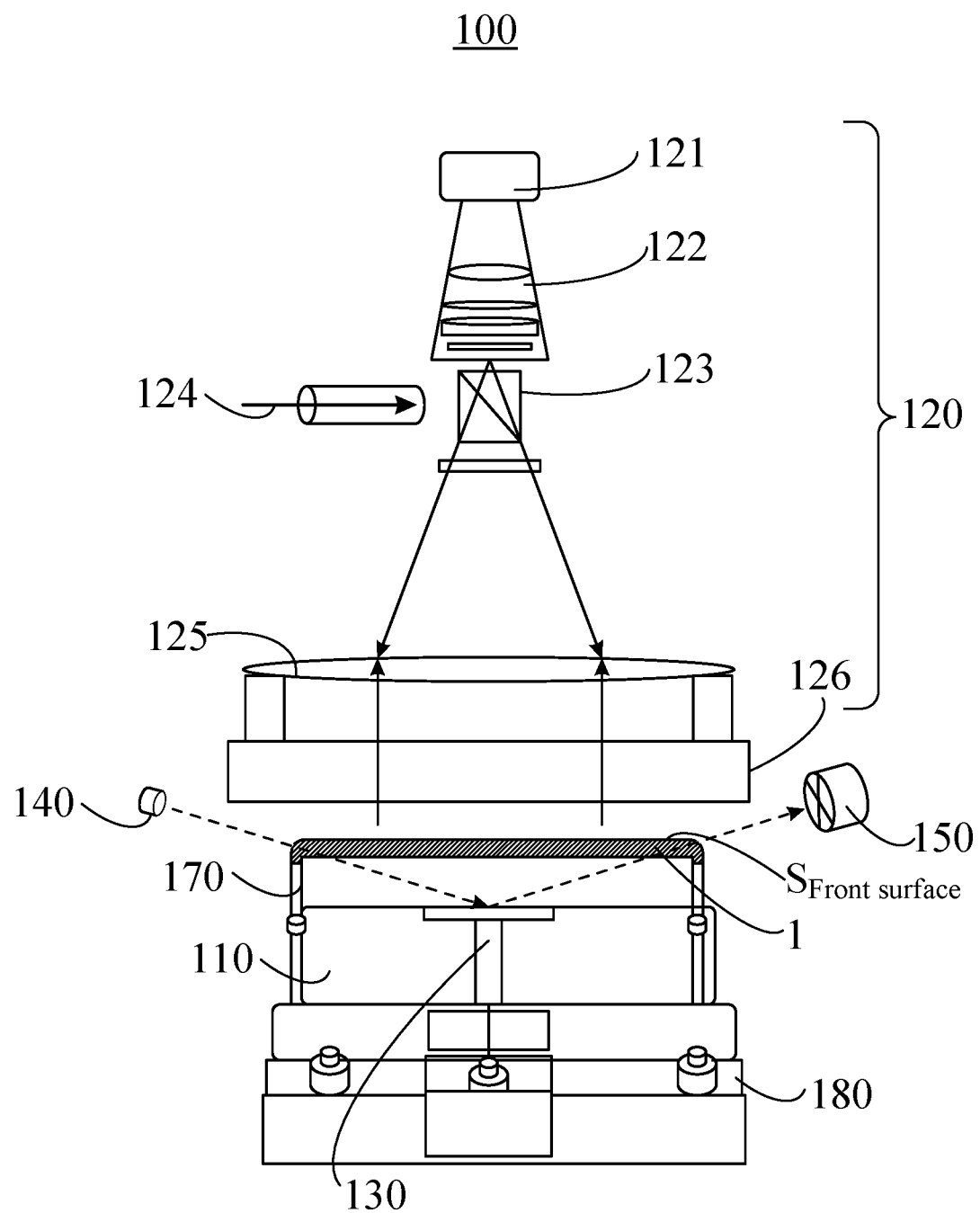
FIG. 3 is a schematic structural diagram of a measuring apparatus of a wafer geometry.
Figure 4:
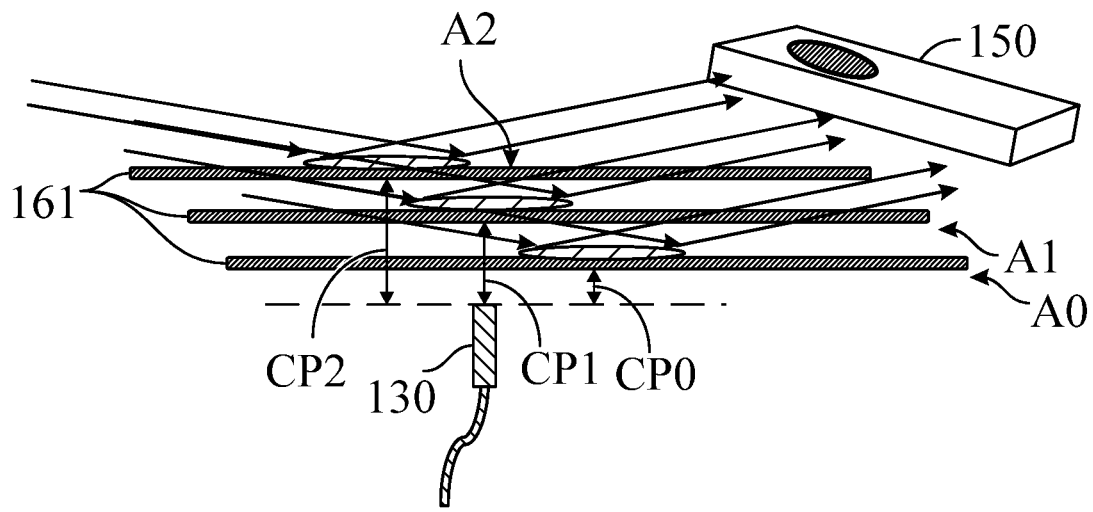
FIG. 4 is a schematic diagram of calibration of a position sensor.
Figure 5:
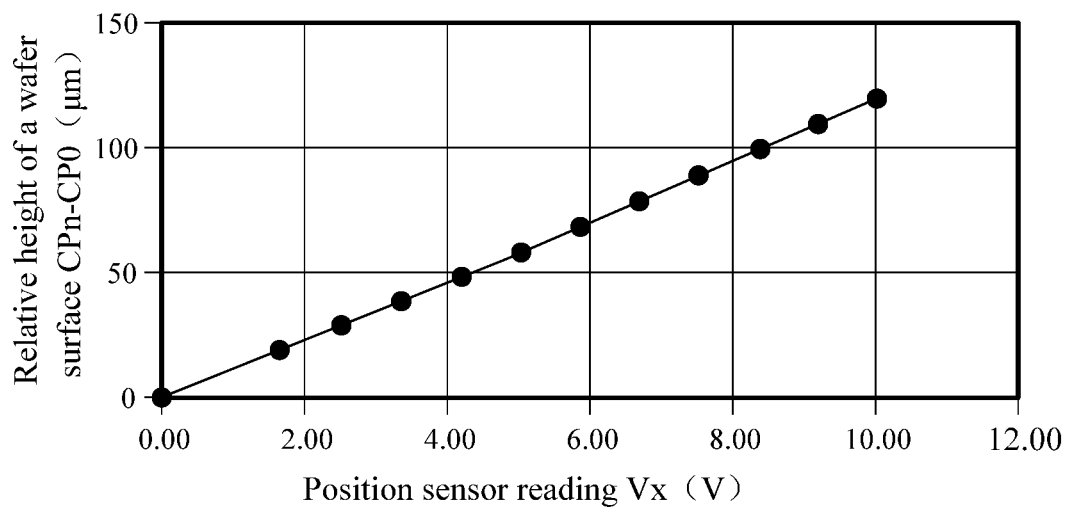
FIG. 5 is a schematic diagram of a relationship between a position sensor reading Vx and a capacitive sensor reading CPn during calibration of a position sensor.

FIG. 3 is a schematic structural diagram of a measuring apparatus of a wafer geometry. FIG. 4 is a schematic diagram of calibration of a position sensor. FIG. 5 is a schematic diagram of a relationship between a position sensor reading Vx and a capacitive sensor reading CPn during calibration of a position sensor.

The measuring apparatus of the wafer geometry may also be referred to as a measuring architecture of a wafer geometry. For example, a Fizeau interferometer is configured for the measuring apparatus 100 in FIG. 3. It should be understood that, the measuring apparatus is not limited to the use of the Fizeau interferometer, and another type of vertically incident interferometer may alternatively be configured, such as a transmission grating-based shearing interferometer.

As shown in FIG. 3, the measuring apparatus 100 includes an air-bearing chuck 110 and an interferometer 120. The air-bearing chuck 110, configured to generate an air cushion to keep a wafer 1 to be measured floating up on a top surface of the air-bearing chuck 110. The interferometer 120, disposed on one side, away from the air-bearing chuck 110, of the wafer 1, and configured to obtain an interference fringe image of a front surface $S_{Front\ surface}$ of the wafer 1 to measure a geometry of the wafer 1 based on the interference fringe image. The front surface of the wafer 1 is a surface, away from the air-bearing chuck 110, of the wafer.

It should be understood that, when the interferometer 120 is a single Fizeau interferometer, the single Fizeau interferometer may include a camera 121, a relay lens 122, a Polarization Beam Splitter or Combiner (PBSC) 123, a light source (e.g., an illumination light) 124, a collimator 125, and a transmission flat (Transmission Flat, TF) 126, all as shown in FIG. 3. The operation of a Fizeau interferometer is well known and thus is not described in detail herein. In this architecture, the single Fizeau interferometer is configured to measure the geometry of the wafer 1. The transmission flat 126 may also be referred to as a test flat or the like. The measuring apparatus 100 is not limited to the use of Fizeau interferometer, and another interferometer such as a shearing interferometer may also be configured in the measuring apparatus of the present application provided with a reflective air-bearing chuck. The air-bearing chuck 110 may be any structure capable of generating an air cushion to keep the wafer 1 to be measured floating up on the top surface of the air-bearing chuck 110, and a specific structure of the air-bearing chuck 110 is not limited in the embodiments of the present application. The measuring apparatus 100 may also be configured for measuring a substrate, a thin film, and the like, which is not specifically limited in the present application.

The present application relates to a measuring apparatus, also referred to as a semiconductor device architecture or a WGT architecture, of a wafer geometry for various types of wafers such as 200 mm wafers. The measuring apparatus may have better precision and throughput than capacitive sensor or optical sensor-based scanning tools. Embodiments of the measuring apparatus of the wafer geometry in the present application may also be configured for 300 mm or 450 mm wafer geometry tools. In addition to wafer geometry tools, the measuring apparatus of the wafer geometry in the present application may also be configured in Patterned Wafer Geometry (PWG) tools. An air cushion is configured in the air-bearing chuck to support the wafer during measurement of the wafer geometry such as the wafer shape. The air cushion (also referred to as an air-bearing film) of the air-bearing chuck has very small stiffness, and exerts little force to support the wafer, but does not deform the wafer. This is ideal for measuring of the wafer geometry. In the measuring apparatus 100, the wafer 1 under test may be loaded to measurement chamber directly from handler end effector.

According to the technical solutions provided in the embodiments of the present application, the measuring apparatus of the wafer geometry generates an air cushion by utilizing an air-bearing chuck to keep a wafer to be measured floating up on a top surface of the air-bearing chuck, thereby avoiding damage of the original shape of the wafer or contamination of the wafer by a clamping tool, and reducing errors during measurement. In addition, the measuring apparatus 100 may perform the same measurement as a dual Fizeau tool, but at a fraction of the cost. The measuring apparatus 100 has many advantages over existing dual Fizeau tools in measuring a wafer geometry, such as a wafer shape, a wafer flatness, or the like. For example, the air-bearing chuck may provide effective air damping capability to a wafer disposed above the air-bearing chuck. The air damping capability allows not only a more accurate interferometer measurement, but also lower cost since it does not require an expensive active isolation system and a heavy-duty acoustic isolator. The air damping capability also saves cost in wafer transfer inside the measuring apparatus 100 due to simplified wafer loading process, for example, horizontally loading the wafer under a single interferometer. Compared to a dual Fizeau interferometer architecture, the single interferometer architecture (or the measuring apparatus) saves cost by eliminating one interferometer and related optics, a mechanism for rotating a wafer 90 degrees from horizontal to vertical required in the dual Fizeau interferometer architecture (also referred to as a wafer vertical loading system), an acoustic isolation box in the dual Fizeau interferometer architecture, and a channel of data acquisition system. The measuring apparatus may significantly reduce the cost for Original Equipment Manufacturers (OEMs) as well as to their customers. In addition, the whole measuring apparatus 100 has very few moving parts, making it more reliable than the duel Fizeau interferometer architecture. The wafer may be loaded directly to the air-bearing chuck to reduce wafer transport time as required when a dual Fizeau interferometer-based tool is configured. The advantage of the measuring apparatus 100 is even greater for 300 mm or 450 mm wafers. Vibration of 300 mm and 450 mm wafers may be a major source of noise, making it difficult to achieve a high precision in the flatness measurement. For devices configured for 300 mm or 450 mm wafers, optics components collimators, transmission flats, and folding mirrors are all large and expensive. In addition, the measuring apparatus 100 of the present application has better precision, matching, and lower cost than the dual Fizeau interferometer architecture. A transmission grating-based shearing interferometer may be configured to replace the Fizeau interferometer, and the air-bearing chuck may be configured to replace three lift pins of the transmission grating-based shearing interferometer for support, thereby improving measurement accuracy of the shearing interferometer and increasing the measured warp dynamic range by tilting the wafer.

In an embodiment of the present application, the measuring apparatus 100 further includes a capacitive sensor 130, disposed at a middle of the air-bearing chuck 110 and configured to: measure location information corresponding to at least one location point on a back surface $S_{Back\ surface}$ of the wafer 1 to obtain a capacitive sensor reading CPn, or measure the location information to obtain the capacitive sensor reading CPn and monitor whether the wafer 1 is on the air-bearing chuck 110 based on the capacitive sensor reading CPn, or measure the location information to obtain the capacitive sensor reading CPn and monitor a first predetermined distance based on the capacitive sensor reading CPn. The back surface of the wafer 1 is a surface, close to the air-bearing chuck 110, of the wafer 1.

In the embodiment of the present application, the capacitive sensor is disposed at the middle of the air-bearing chuck to measure the location information corresponding to at least one location point on the back surface $S_{Back\ surface}$ of the wafer, and a capacitive sensor reading CPn is specifically displayed on the capacitive sensor. Therefore, based on variation of the capacitance sensor reading CPn, whether the wafer is on the air-bearing chuck 110 may be learned, or a specific value of the first predetermined distance may be learned, or a thickness of the wafer may be obtained in combination with the capacitance sensor reading CPn and a position sensor reading Vx.

In an embodiment of the present application, the measuring apparatus 100 further includes a laser 140, a position sensor 150, a first calibration wafer 161 and a processor. The laser 140 is located at one side above the top surface of the air-bearing chuck 110 and configured to emit first laser light towards $S_{Front\ surface}$. The position sensor 150 is located at one side above the top surface of the air-bearing chuck 110 and opposite to the laser 140, and configured to receive second laser light obtained after reflection of the first laser light from $S_{Front\ surface}$ of the wafer and measure, based on the second laser light, location information corresponding to a first location point on $S_{Front\ surface}$ of the wafer, so as to obtain a position sensor reading Vx. The capacitive sensor 130 is further configured to measure location information corresponding to a second location point on $S_{Back\ surface}$ of the wafer, so as to obtain the capacitive sensor reading CPn. The first location point and the second location point are two opposite location points representing a thickness of the wafer. The processor is connected to the position sensor 150 and the capacitive sensor 130 to obtain the position sensor reading Vx and the capacitive sensor reading CPn and substitute the position sensor reading Vx and the capacitive sensor reading CPn into a formula: $T_{Wafer}=T0+(CP0-CPn)+S\times(Vx-V0)$, so as to obtain a thickness $T_{Wafer}$ of the wafer. In the formula, T0 denotes a thickness of the first calibration wafer 161, CP0 denotes a reference capacitive sensor reading obtained when the first calibration wafer 161 is located at a reference predetermined distance, V0 denotes a reference position sensor reading obtained when the first calibration wafer 161 is located at the reference predetermined distance, and S denotes a slope of a straight line in a relation graph composed of a horizontal coordinate representing the position sensor reading Vx obtained when the first calibration wafer 161 is located at different predetermined distances and a vertical coordinate representing a difference hx between the reference capacitive sensor reading CP0 and the capacitive sensor reading CPn obtained when the first calibration wafer 161 is located at different predetermined distances.

It should be understood that, the processor may be disposed at any position in the measuring apparatus 100 as long as being connected to the position sensor 150 and the capacitive sensor 130, which is not specifically limited in the present application. Values of T0, V0, and S may be known values calibrated and stored in the measuring apparatus 100 before delivery, or may be values obtained after calibration is performed by utilizing the first calibration wafer 161 during measurement of the measuring apparatus 100, which is not specifically limited in the present application. The reference predetermined distance may be greater than or equal to 0. For example, the reference predetermined distance may be a distance between the first calibration wafer 161 and the air-bearing chuck 110 obtained when the first calibration wafer 161 is adsorbed on the top surface of the air-bearing chuck 110 by utilizing suction force provided by the air-bearing chuck 110, or a distance between the first calibration wafer 161 and the air-bearing chuck 110 obtained when the first calibration wafer 161 is held at any distance from the top surface of the air-bearing chuck 110 by utilizing the air-bearing chuck 110. A value of the reference predetermined distance is not specifically limited in the present application.

In the embodiment of the present application, a combination of a capacitive sensor at the bottom of wafer (e.g., embedded in the air-bearing chuck) and one or more optical position sensors (bi-cell or Position Sensing Diode (PSD)) along with a laser on the top of the wafer may be incorporated into the measuring apparatus 100 to measure the thickness of the wafer. The interferometer may be configured to calibrate the capacitive sensor and the optical (bi-cell or PSD) position sensors. Both the capacitive sensor and the optical (bi-cell) position sensors may sense air-bearing stability, but only the optical (bi-cell) position sensors can sense the vibration of chuck assembly. The optical position sensors may be useful when there is need to isolate the source of vibration. In addition, there is an added advantage of the bi-cell or PSD position sensor disposed at the top of wafer. The position sensor reading may be correlated directly to wafer thickness. The position sensor reading may also tell the relative motion or vibration between the first calibration wafer and a reference transmission flat. The vibration of the first calibration wafer may be caused by one or more of the air-bearing chuck, a flange and support mechanism, which cannot be sensed by the capacitive sensor, because the capacitive sensor moves with the unit that includes the first calibration wafer and the air-bearing chuck.

As shown in FIG. 4 and FIG. 5, the air-bearing chuck 110 is further configured to hold the first calibration wafer 161 at different predetermined distances from the top surface of the air-bearing chuck 110. The position sensor 150 is further configured to measure location information of a third location point on a first surface of the first calibration wafer 161 when the first calibration wafer 161 is located at different predetermined distances, so as to obtain the position sensor reading Vx. The first surface of the first calibration wafer 161 is a surface, away from the air-bearing chuck 110, of the first calibration wafer 161. The capacitive sensor 130 is further configured to measure location information of a fourth location point on a second surface of the first calibration wafer 161 when the first calibration wafer 161 is located at different predetermined distances, so as to obtain the capacitive sensor reading CPn. The second surface of the first calibration wafer 161 is a surface, close to the air-bearing chuck 110, of the first calibration wafer 161. The fourth location point and the third location point are two opposite location points representing a thickness of the first calibration wafer 161. The different predetermined distances include the reference predetermined distance. When the first calibration wafer 161 is located at the reference predetermined distance, the reference capacitive sensor reading is denoted by CP0, and the reference position sensor reading is denoted by V0 The processor is further configured to build the relation graph composed of a horizontal coordinate representing the position sensor reading Vx and a vertical coordinate representing the difference hx between the capacitive sensor reading CPn and the reference capacitive sensor reading CP0, so as to determine the slope of the straight line in the relation graph. An elliptical structure in FIG. 4 represents a spot formed when the surface of the first calibration wafer 161 is irradiated by laser light.

It should be understood that, the position sensor reading Vx may be calibrated by utilizing a wafer with a known thickness, namely, the first calibration wafer 161. A position of the position sensor may be correlated to a height of a top surface of the wafer. The capacitive sensor 130 may be configured to measure a position of the bottom surface of the wafer. The combined information of the top and bottom surface positions can be configured for accurately determining the thickness of the wafer 1.

For example, as shown in FIG. 4, to calibrate the position sensor 150, the first calibration wafer 161 may be adjusted up and down at various positions. In this example, although each wafer is slightly different, the thickness T0 of the first calibration wafer 161 may be set at 725 μm or another value such as 775 μm, which is not specifically limited in the present application. The thickness of the first calibration wafer 161 may be measured by a Coordinate Measuring Machine (CMM) or other thickness measuring tool. The first calibration wafer 161 is located at the reference predetermined distance (also referred to as zero floating height) when being located at a position A0. The position A0 may be a position where the first calibration wafer 161 is located when the first calibration wafer 161 is vacuumed on the air-bearing chuck, or a position where the first calibration wafer 161 is located when the first calibration wafer 161 is held at the reference predetermined distance from the top surface of the air-bearing chuck. The reference predetermined distance is greater than or equal to 0, which is not specifically limited in the present application. In addition, a reference capacitive sensor reading obtained when the first calibration wafer 161 is located at position A0 is denoted by CP0. CP0 may be set as zero for CP. Then the reference position sensor reading (V0 (±10V)) may be obtained from the position sensor 150. Thereafter, the air cushion (e.g., generated by pressure, or generated by the vacuum and pressure) may be adjusted to hold the first calibration wafer 161 at a position A1. A capacitive sensor reading obtained at the position A1 is recorded as CP1, and CP1 minus CP0 equals 20 μm (or approximately equals to 20 μm). A position sensor reading obtained when CP1 minus CP0 is equal to 20 μm is recorded as V1.

Next, the air cushion (e.g., generated by pressure, or generated by the vacuum and pressure) may be adjusted again until the first calibration wafer 161 is held at a position A2. A capacitive sensor reading obtained at the position A2 is recorded as CP2, and CP2 minus CP0 approximately equals to 30 μm. A position sensor reading obtained when CP2 minus CP0 is equal to 30 μm is recorded as V2. The above steps may be repeated for capacitive sensor readings are CP3, CP4, and CP5 . . . at 40 μm, 50 μm, and 60 μm . . . , respectively.

Next, Δ(CPn−CP0) may be calculated, such as CP1−CP0, CP2−CP0. Table 1 shows exemplary results from the calculation.

TABLE 1

|  | 0 | 1 | 2 | 3 | 4 | 5 |
|---|---|---|---|---|---|---|
| Capacitive sensor reading CPn (μm) | CP0 = 500 | CP1 = 520 | CP2 = 530 | CP3 = 540 | CP4 = 550 | CP5 = 560 |
| Δ (CPn − CP0) = hx | 0 | 20 | 30 | 40 | 50 | 60 |
| PSD position voltage | V0 | V1 | V2 | V3 | V4 | V5 |

With the above data, hx vs Vx may be plotted and linear fitted to obtain the slope S (μm/V) (referring to FIG. 5). hx is a difference between a capacitive sensor reading CPn and the reference capacitive sensor reading CP0, namely, a relative height of a wafer surface. Calibration data include: (1) slope: S (μm/V); (2) wafer thickness: T0=725 μm; (3) reference position sensor reading: V0; and (4) reference capacitive sensor reading: CP0. The calibration data may be saved, and a software implementation of the calibration may be performed by using the following formula.

$$T_{Wafer} = T0 + (CP0 - CPn) + S \times (Vx - V0).$$

CPn is a capacitive sensor reading obtained when the first calibration wafer 161 is located at a predetermined distance or floating height.

CP0 may be a capacitive sensor reading obtained when the first calibration wafer 161 is vacuum sucked onto the air-bearing chuck.

Vx is a position sensor reading, in Volt.

The capacitive sensor reading in μm may be calculated from a factory calibration constant C, and $C=\Delta h/\Delta V$, (μm/volt). The capacitive sensor reading CPn in μm is obtained according to the formula: $CPn=C\times\Delta Vcp$.

According to the technical solutions provided in the embodiments of the present application, a position sensor can be calibrated at any time by utilizing a first calibration wafer with a known thickness T0 and a reference transmission flat, thereby reducing measurement errors of a measuring apparatus of a wafer geometry.

Figure 6:
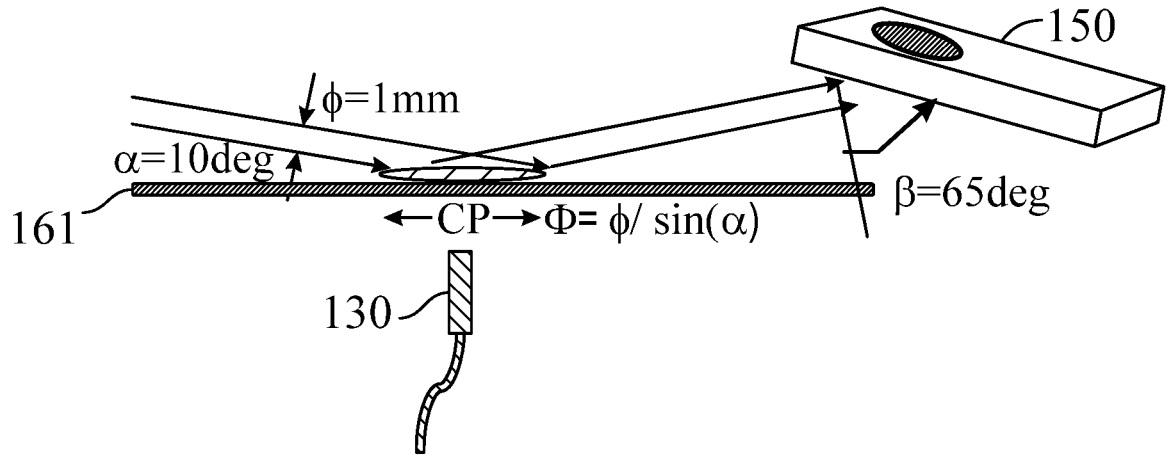
FIG. 6 is a schematic diagram showing positions of a position sensor and a capacitive sensor relative to a wafer.

A method of determining an optimal angle at which one or more of a laser and a position sensor is located is disclosed. FIG. 6 is a schematic diagram showing positions of a position sensor and a capacitive sensor relative to a wafer. The elliptical structure in FIG. 6 represents a spot formed when a surface of a first calibration wafer 161 is irradiated by laser light. Referring to FIG. 6, to obtain an optimal Z-axis resolution, a position sensor 150 may be located at a position where a size of the position sensor is allowed and a maximum angle β is formed with the first calibration wafer 161. If Δh is a Z-axis resolution (or z-sensitivity), the angle β is dominant. The formula is as follows.

$$\Delta h = \Delta L \times \cos\beta/(2\cos\alpha)$$

Where ΔL is a minimum displacement detectable by the position sensor 150. The position sensor 150 may be a commercially available sensor, for example, the minimum displacement of the sensor may be about 0.75 μm.

$$\Delta h = \Delta L/M$$

Where $M = [\cos\beta/(2\cos(\alpha))]^{\wedge} - 1$.

Due to a grazing angle α incidence, Cos(α) is approximately equal to 1, α is an angle between a light source (e.g., a laser), and the first calibration wafer 161, and values of α generally is set as 10° to 15°. As β increases, M also increases based on the formula above, which means that the sensitivity of the position sensor 150 will also increase. However, β may not be too large due to a potential enlarging effect on a size of a spot on a detector in the position sensor 150 (e.g., the size of the spot cannot have a size larger than what the detector can detect). There may also be physical limitations about how far the position sensor can be disposed in the measuring apparatus. For example, at this grazing angle, the size of the spot of the laser on a sensor surface may be increased by 1/Sin (90°−β)=1/Sin 30°=2 times. Table 2 below lists various PSD resolutions in nm obtained based on different values of α and β.

TABLE 2

|  | α (°) | 10.00 | 0.0175 | 10 | 10 |
|---|---|---|---|---|---|
|  | β (°) | 0.00 | 45.00 | 60.00 | 75.00 |
|  | Mag (M) | 1.97 | 2.79 | 3.94 | 7.61 |
| PSD Res (nm) |  | 250.000 | 126.93 | 89.75 | 63.46 | 32.85 |

In an embodiment of the present application, the measuring apparatus 100 further includes a mass sensor, configured to measure a mass of a wafer, so as to obtain an average thickness of the wafer.

It should be understood that, the position sensor and the capacitive sensor in the above embodiments may be replaced by the mass sensor, or another device for measuring wafer thickness such as a CMM, to obtain a thickness of the wafer. The thickness of the wafer may be a corresponding thickness at a position point on the wafer, or may be an average thickness of the wafer, which is not specifically limited in the present application.

According to the embodiment of the present application, a mass sensor is disposed in a measuring apparatus of a wafer geometry, so that a mass of a wafer is measured by utilizing the mass sensor, and thus an average thickness of the wafer is obtained based on the mass of the wafer, which helps obtain a flatness of the wafer in combination with a measurement result of a wafer shape.

In an embodiment of the present application, the measuring apparatus 100 further includes a plurality of lift pins 170. The plurality of lift pins 170 are located on a periphery of an air-bearing chuck 110 and configured to lift a wafer up from the top surface of the air-bearing chuck 110.

It should be understood that, a quantity of the plurality of lift pins 170 may be two, three, or even more, which is not specifically limited in the present application.

According to the embodiment of the present application, lift pins are disposed in a measuring apparatus of a wafer geometry, and the lift pins are located on a periphery of an air-bearing chuck, so that when a wafer is put onto an air-bearing chuck or taken out from an air-bearing chuck, the wafer is lifted by the lift pins, and then may be picked or placed by a robot hand from the bottom of the wafer.

In an embodiment of the present application, when the interferometer is a Fizeau interferometer, the interferometer includes a transmission flat close to an air-bearing chuck. The measuring apparatus 100 further includes a second calibration wafer with a known flatness of $TTV_0$, configured to calibrate a top surface of the air-bearing chuck and a surface, opposite to the air-bearing chuck, of the transmission flat. For a specific calibration method, reference may be made to the measuring methods of the wafer flatness in the following embodiments.

It should be understood that, the second calibration wafer may be an accessory independent of the measuring apparatus 100, or may be an accessory removably disposed in the measuring apparatus 100, which is not specifically limited in the present application.

In an embodiment of the present application, the measuring apparatus 100 further includes at least one tilt stage 180, located below the air-bearing chuck 110 and configured to: tip and/or tilt the air-bearing chuck 110 to align the air-bearing chuck 110 with the interferometer; or tip and/or tilt the air-bearing chuck 110 to adjust a distance between the air-bearing chuck 110 and the interferometer, so as to implement mechanical phase shifting; or tip and/or tilt the air-bearing chuck 110 to drive the wafer 1 to be tipped and/or tilted, so as to measure a warp of the front surface of the wafer 1.

It should be understood that, the at least one tilt stage 180 may be a Z-tip-and-tilt stage or another tilt stage, as long as the air-bearing chuck can be tipped and/or tilted, which is not specifically limited in the present application.

According to the embodiment of the present application, at least one tilt stage is disposed in a measuring apparatus of a wafer geometry, to tip and/or tilt an air-bearing chuck by adjusting a tilt angle of the at least one tilt stage, so as to align the air-bearing chuck with an interferometer; or to tip and/or tilt an air-bearing chuck to adjust a distance between the air-bearing chuck and an interferometer, so as to implement mechanical phase shifting; or to tip and/or tilt an air-bearing chuck to drive a wafer to be tipped and/or tilted, so as to measure a warp of a front surface of the wafer.

In an embodiment of the present application, the at least one tilt stage 180 is a 2-D tilt stage, and the 2-D tilt stage includes two goniometry cradles stacked at an angle of intersection of 90 degrees.

Figure 7:
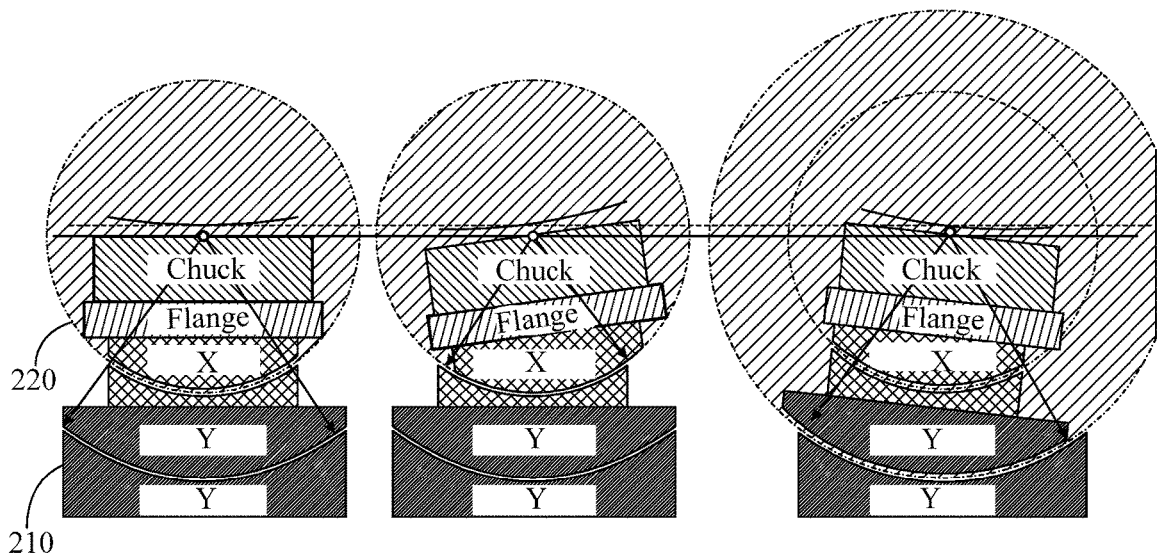
FIG. 7 is a schematic structural diagram of an exemplary goniometry cradle for measuring a wafer tilt stage to be patterned according to an embodiment of the present application.

For example, FIG. 7 is a schematic structural diagram of an exemplary goniometry cradle for measuring a wafer tilt stage to be patterned according to an embodiment of the present application. The wafer tilt stage 200 in the present application includes two stacked goniometry cradles that are utilized to increase a warp dynamic range of a wafer and throughput. When the wafer is tilted, the wafer may be maintained to be focused. It should be noted that, an X platform 210 and a Y platform 220 intersect at an angle of 90 degrees. In FIG. 7, the X platform 210 and the Y platform 220 are drawn on a same plane to facilitate illustration of a common rotation center.

In the embodiment of the present application, for a wafer with a relatively large warp, the 2-D tilt stage may be configured to overcome limitations to a dynamic range of the interferometer in the measuring apparatus shown in FIG. 3.

Figure 8:
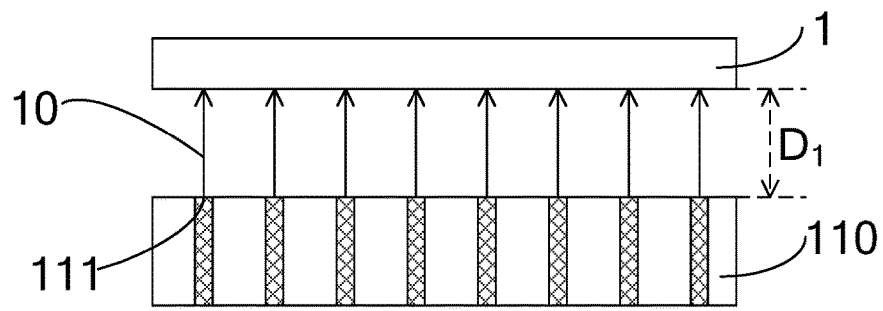
FIG. 8 is a schematic cross-sectional view of an air-bearing chuck according to an embodiment of the present application.

FIG. 8 is a schematic cross-sectional view of an air-bearing chuck according to an embodiment of the present application. As shown in FIG. 8, an air-bearing chuck 110 includes a plurality of support force nozzles 111, and a wafer 1 is held at a first predetermined distance $D_1$ from a top surface of the air-bearing chuck 110 by utilizing a first gas 10 ejected from the plurality of support force nozzles 111, so as to measure a shape of the wafer 1.

It should be understood that, the plurality of support force nozzles 111 may be in a circular, rectangular, square, pentagonal, or another regular or irregular shape. The plurality of support force nozzles 111 may be arranged on the air-bearing chuck 110 in a manner of being arranged on a concentric ring surrounding the center of the air-bearing chuck 110, or in a manner of being arranged on a plurality of parallel lines, or in a manner of being arranged on a plurality of straight lines or wave lines that points to the center of the air-bearing chuck 110, as long as the wafer 1 can be held at the first predetermined distance from the top surface of the air-bearing chuck 110 by utilizing the first gas 10 ejected from the plurality of support force nozzles 111, which is not specifically limited in the embodiment of the present application. The plurality of support force nozzles 111 may be spread over the entire top surface of the air-bearing chuck 110 to equalize support force received by a supported object such as a wafer that is supported by an air cushion, thereby facilitating maintaining an original shape of the wafer.

According to the technical solution provided in the embodiment of the present application, a plurality of support force nozzles are disposed on an air-bearing chuck, and a supported object such as a wafer is kept stably floating up on a top surface of the air-bearing chuck by utilizing a first gas ejected from the plurality of support force nozzles. Since there is no need to use a clamping tool to clamp the wafer during measurement, a shape of the wafer is not affected, thus reducing errors during measurement of the wafer.

Figure 9:
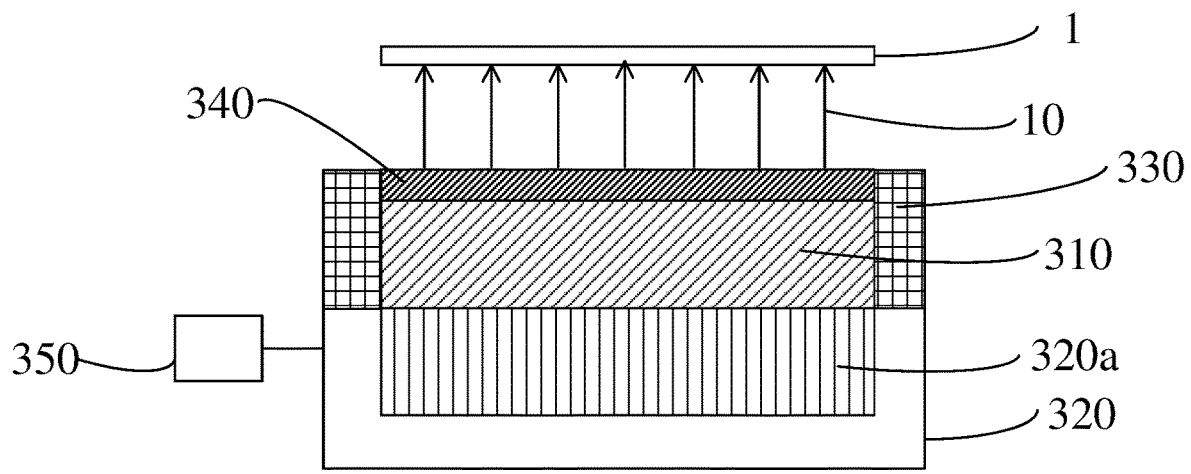
FIG. 9 is a schematic cross-sectional view of an air-bearing chuck according to another embodiment of the present application.

FIG. 9 is a schematic cross-sectional view of an air-bearing chuck according to another embodiment of the present application.

As shown in FIG. 9, the air-bearing chuck includes a first porous layer 310 composed of a porous material; and an air inlet layer 320, stacked with the first porous layer 310 and connected to a first gas supply component 350 for supplying a first gas. The air inlet layer 320 is configured to transmit the first gas to the first porous layer 310, so as to keep the wafer 1 floating by utilizing support force provided by the first gas.

The porous material includes one or more of porous carbon, porous polymer, porous carbonized fiber, porous ceramics, porous steel, air-permeable steel, porous metal, and air-permeable metal.

In an embodiment of the present application, the air inlet layer is connected to a second gas supply component for supplying a second gas. The air inlet layer is also configured to transmit the second gas through the first porous layer, so as to adjust a shape of a first surface of the wafer by utilizing suction force provided by the second gas. The first surface is a surface, close to the first porous layer, of the wafer.

In an embodiment of the present application, the first porous layer includes a plurality of first regions for allowing the first gas to pass through and communicating with the first gas supply component, and a plurality of second regions for allowing the second gas to pass through and communicating with the second gas supply component.

In an embodiment of the present application, the plurality of first regions are alternately arranged with the plurality of second regions.

In an embodiment of the present application, the air inlet layer has a hollow structure 320a at the middle part, and an opening of the hollow structure is in contact with a surface, close to the air inlet layer, of the first porous layer. The first gas supplied by the first gas supply component enters the hollow structure and is transmitted to the first porous layer.

In an embodiment of the present application, the air-bearing chuck further includes a reference component 330. The reference component 330 is configured to be sheathed on an outer side of the first porous layer, so as to calibrate a surface, away from the air inlet layer, of the first porous layer by utilizing a surface, away from the air inlet layer, of the reference component as a reference plane. An orthographic projection of the wafer on the first porous layer is covered by the first porous layer.

In an embodiment of the present application, a reflectivity of the surface, away from the air inlet layer, of the reference component is the same as or different from that of the surface, away from the air inlet layer, of the first porous layer.

In an embodiment of the present application, the air-bearing chuck further includes a second porous layer 340. The second porous layer is located above the surface, away from the air inlet layer, of the first porous layer, and a hardness of the second porous layer is greater than that of the first porous layer.

In an embodiment of the present application, the first predetermined distance ranges from 60 μm to 1500 μm when the measuring apparatus 100 is configured to measure a shape of the wafer 1.

It should be understood that, the first predetermined distance $D_1$ may be 60 μm, 300 μm, 350 μm, 1000 μm, 1500 μm, or the like, which is not specifically limited in the embodiment of the present application.

According to the embodiment of the present application, a first predetermined distance $D_1$ is set to range from 60 μm to 1500 μm, so that any change of a wafer shape due to external force is avoided when an air-bearing chuck is configured to support the wafer, and thus an original state of the wafer can be effectively maintained, facilitating obtaining of an accurate measurement result when the air-bearing chuck is applied to shape measurement.

Figure 10:
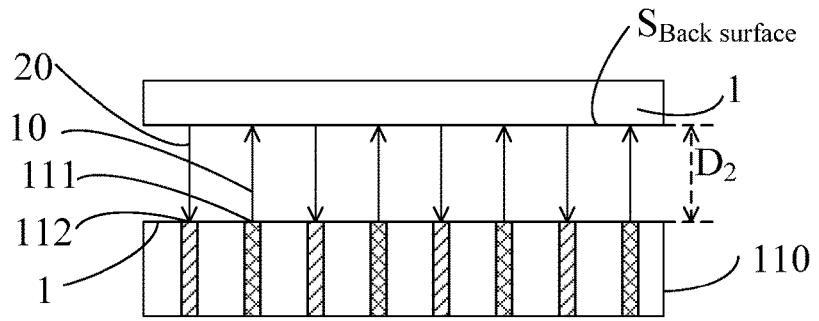
FIG. 10 is a schematic cross-sectional view of an air-bearing chuck according to still another embodiment of the present application.

FIG. 10 is a schematic cross-sectional view of an air-bearing chuck according to still another embodiment of the present application. The embodiment illustrated in FIG. 10 is a modified example of the embodiment illustrated in FIG. 8. A difference between the two embodiments lies in that, in the embodiment illustrated in FIG. 10, the air-bearing chuck 110 further includes a plurality of suction force nozzles 112 arranged alternately with the plurality of support force nozzles 111. A shape of a back surface $S_{Back\ surface}$ of the wafer 1 is forced to match with a shape of the top surface of the air-bearing chuck 110 by utilizing a second gas 20 sucked from the plurality of suction force nozzles 112; or the wafer 1 may be first placed on the top surface of the air-bearing chuck 110, a shape of a back surface $S_{Back\ surface}$ of the wafer 1 is forced to match with a shape of the top surface of the air-bearing chuck 110 by utilizing a second gas 20 sucked from the plurality of suction force nozzles 112, and then the wafer 1 is held at a second predetermined distance $D_2$ from the top surface of the air-bearing chuck 110 by utilizing the first gas 10 ejected from the plurality of support force nozzles 111, which is not specifically limited in the present application. Alternatively, the wafer 1 may be held at the first predetermined distance $D_1$ from the top surface of the air-bearing chuck 110 by utilizing a second gas 20 sucked from the plurality of suction force nozzles 112 and the first gas 10 ejected from the plurality of support force nozzles 111, which is not specifically limited in the present application. The air-bearing chuck 110 may further include a plurality of alternating pressure and vacuum channels, for generating and maintaining an air cushion on the top surface of the air-bearing chuck 110.

According to the technical solution provided in the embodiment of the present application, a plurality of support force nozzles and a plurality of suction force nozzles that are alternately arranged are disposed on an air-bearing chuck, so that a wafer is kept to be stably floating up on a top surface of the air-bearing chuck. Since there is no need to use a clamping tool to clamp the wafer during measurement, and a shape of the wafer is not affected, errors during measurement of the wafer are reduced.

In an embodiment of the present application, the second predetermined distance ranges from 0 μm to 50 μm when the measuring apparatus 100 is configured to measure a flatness of the wafer 1.

It should be understood that, the second predetermined distance may be 0 μm, 5 μm, 10 μm, 20 μm, 30 μm, 50 μm, or the like, which is not specifically limited in the embodiment of the present application.

According to the embodiment of the present application, the second predetermined distance $D_2$ is set to range from 0 μm to 50 μm, which helps maintain a flatness of a back surface of a wafer to be almost as flat as a surface of an air-bearing chuck under an action of suction force when the air-bearing chuck is configured to support the wafer, and further helps apply the air-bearing chuck to wafer flatness measurement after a shape of the surface of the air-bearing chuck is calibrated.

Air-Bearing Chuck

Figure 11:
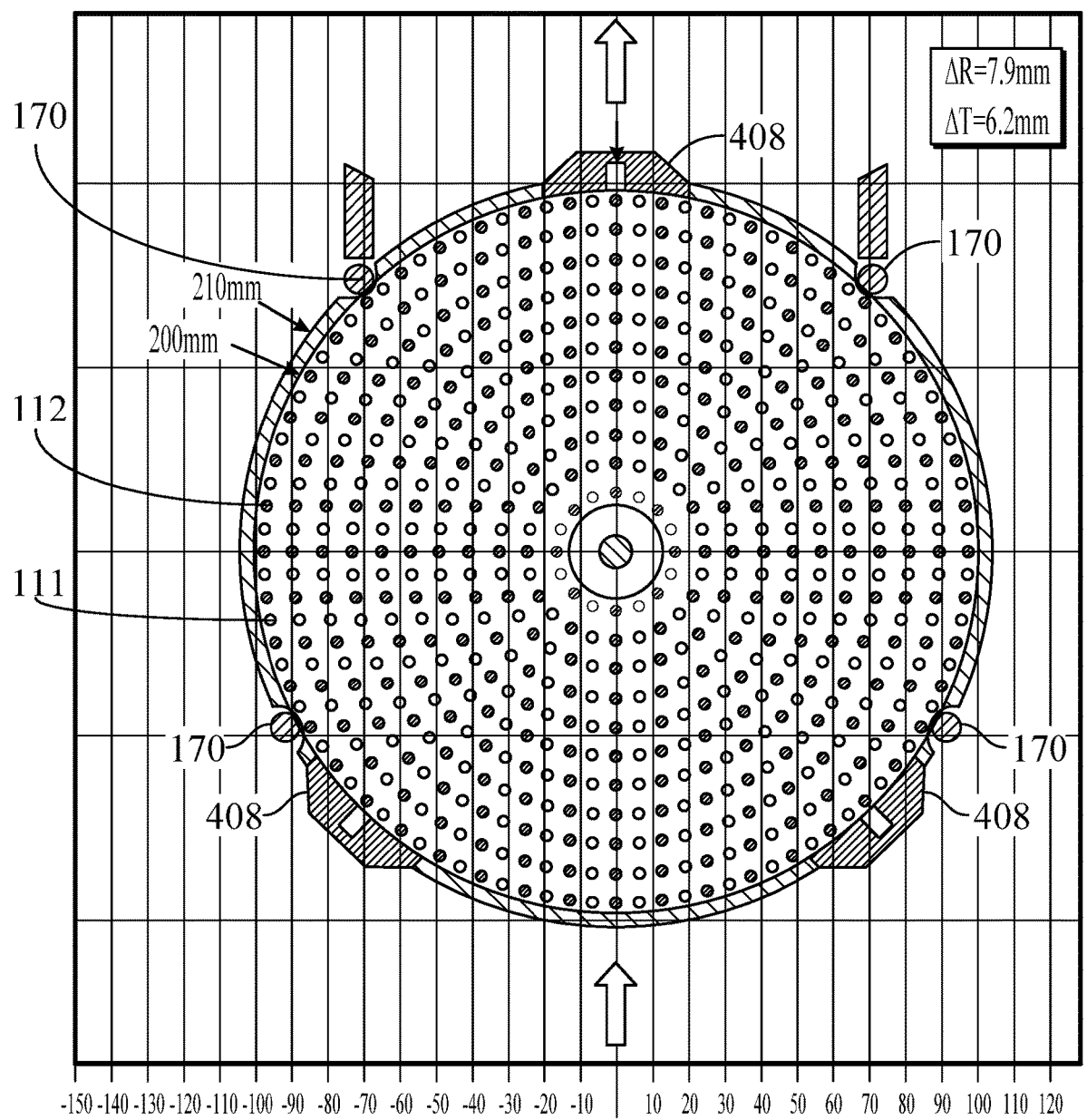
FIG. 11 is a schematic top view of an air-bearing chuck according to an embodiment of the present application.

In another aspect of the present application, FIG. 11 is a schematic top view of an air-bearing chuck according to an embodiment of the present application. As show in FIG. 11, there is an array of vacuum nozzles and pressure nozzles on a surface of an air-bearing chuck 110, and the pressure nozzles 111 and vacuum nozzles 112 are arranged alternately to form equally spaced concentric nozzle rings.

Vacuum suction force and pressure support force may keep a wafer floating up on an air cushion of a few micron to hundreds of microns on the air-bearing chuck 110. The thinner the air cushion, the greater the air flow, and the stiffer the air bearing. With a proper flow rate of vacuum and pressure, the air bearing may be very stiff (e.g., larger than 1 N/um, for an air gap of about 20 μm), which will also have a significant wafer flattening power. However, the stiffness of a 100 μm thick air bearing may be as low as one $10^{th}$ of 1 N/μm, where there is a little force to distort a shape of the wafer.

To measure wafer flatness or TTV from a front surface of the wafer, a back surface of the wafer may be flattened by the air-bearing chuck 110 and become conforming a surface of the air-bearing chuck 110. When the air gap is set at a proper height (e.g., 15 μm to 20 μm), artifacts are not detected on the air-bearing chuck 110. To measure a shape of the wafer, the wafer is floated up on the surface of the air-bearing chuck 110, with the air gap set at about 60 μm to 300 μm. The wafer is supported by the air cushion generated by the air-bearing chuck 110 and maintains its original shape due to the suction force being very small at large air gap.

For example, to meet WGT requirement for wafer flatness and shape measurement, the air-bearing chuck 110 may have the following features, as shown in FIG. 11. It should be understood that, the following features may be adaptively adjusted according to actual requirements, which is not specifically limited in the present application.

(1) The pressure nozzles 111 and vacuum nozzles 112 are arranged alternately to form concentric and axisymmetric nozzle rings.

(2) A radius of the nozzle ring farthest from the center of the nozzle rings is smaller than the radius of the wafer. The nozzles, such as the vacuum nozzles or the pressure nozzles, extend from the center of the nozzle rings all the way out to a position about 0 mm to 20 mm, such as 2 mm to 4 mm, away from the circumference of the air-bearing chuck 110, so as to support the wafer. For example, for a 200 mm chuck, the nozzles, such as the pressure nozzles 111 or vacuum nozzles 112, extend radially such that the centers of the last set of nozzles are located on a circumference of a circle with a diameter of 199 mm, 198 mm, 196 mm, 190 mm, 180 mm, or the like on the air-bearing chuck. In this embodiment, the surface of the air-bearing chuck 110 may be larger than that of the wafer, so that there is no wafer overhang beyond the edge of the air-bearing chuck 110.

(3) As the radius increases, for example, there is an increase of 6 nozzles per nozzle ring while the tangential separation between nozzles is maintained at a constant. To achieve this, the following formula is configured: N=6×n, and n is the $n^{th}$ nozzle ring of the concentric nozzle rings, and N is a quantity of nozzles per nozzle ring, with n=0 being the first "nozzle ring" at the center of the wafer. The number "6" is configured in order to achieve about the same displacement between nozzles in both the radial and tangential directions as well.

The selection of the number of "6" is based on the following method. The separation ΔT between the vacuum nozzles 112 and the pressure nozzles 111 in tangential direction may be the same across the whole air-bearing chuck 110. The adjacent nozzle rings are separated by a constant distance ΔR. For a given ΔR, ΔT may be calculated based on the following method.

It is assumed that, as radius increases, a quantity of nozzles for each adjacent nozzle ring increases by an even integer m. Even integer is configured because vacuum nozzle and pressure nozzle are paired.

$$N = m \times n$$

Where "N" is the quantity of nozzles per nozzle ring. "n" is the $n^{th}$ nozzle ring. Every two adjacent nozzle rings are separated by ΔR, and the radius of $n^{th}$ nozzle ring is Rn=n×ΔR. "m" is an even-integer (e.g., m=2, 4, 6, 8, 10 . . . ) because the quantity of nozzles increases in pairs.

$$\Delta T = 2p \times n \times \Delta R/N = 2p \times \Delta R/m = (2p/6) \times \Delta R$$

Where p is pi π. When m=6, ΔR and ΔT have almost the same value based on the above formula.

(4) A chuck flatness of a WGT 200 may be less than or equal to 1.5 μm. A chuck flatness of a WGT 300 may be less than or equal to 2 μm. The WGT 200 is a wafer geometry tool for measuring the wafer geometry of 200 mm wafers. The WGT 300 is a wafer geometry tool for measuring the wafer geometry of 300 mm wafers.

(5) The chuck surface may meet a standard that a mirror polished chuck surface is higher than or equal to level N4 per ISO standard.

(6) A diameter of the air-bearing chuck may be larger than that of the wafer.

It should be understood that, the diameter of the air-bearing chuck may be larger than the diameter of the wafer by 1 mm, 2 mm, 5 mm, 10 mm, or even 50 mm, which is not specifically limited by the present application.

When a diameter of an air-bearing chuck is set to be larger than that of a wafer, the wafer may be kept stably floating up on a top surface of the air-bearing chuck, and an area of the air-bearing chuck that is larger than the wafer may be configured for calibration during wafer measurement since this part is not blocked by the wafer.

For example, when the diameter of the wafer is 200 mm, the diameter of the air-bearing chuck may be in range from 210 mm to 220 mm. When the diameter of the wafer is 300 mm, the diameter of the air-bearing chuck may be in range from 310 mm to 330 mm.

(7) There may be three wafer grippers 408, two fixed (90 degree apart, configured to fix any two wafer grippers 408), and one actuating griper for center wafer. Force on the wafer may be adjustable (e.g., 0.05 lb to 1 lb).

(8) There may be four lift pins 170 that may lift the wafer up from the top surface of the air-bearing chuck 110 by a certain distance in a smooth manner, to facilitate removal of the wafer from the chuck.

Figure 12:
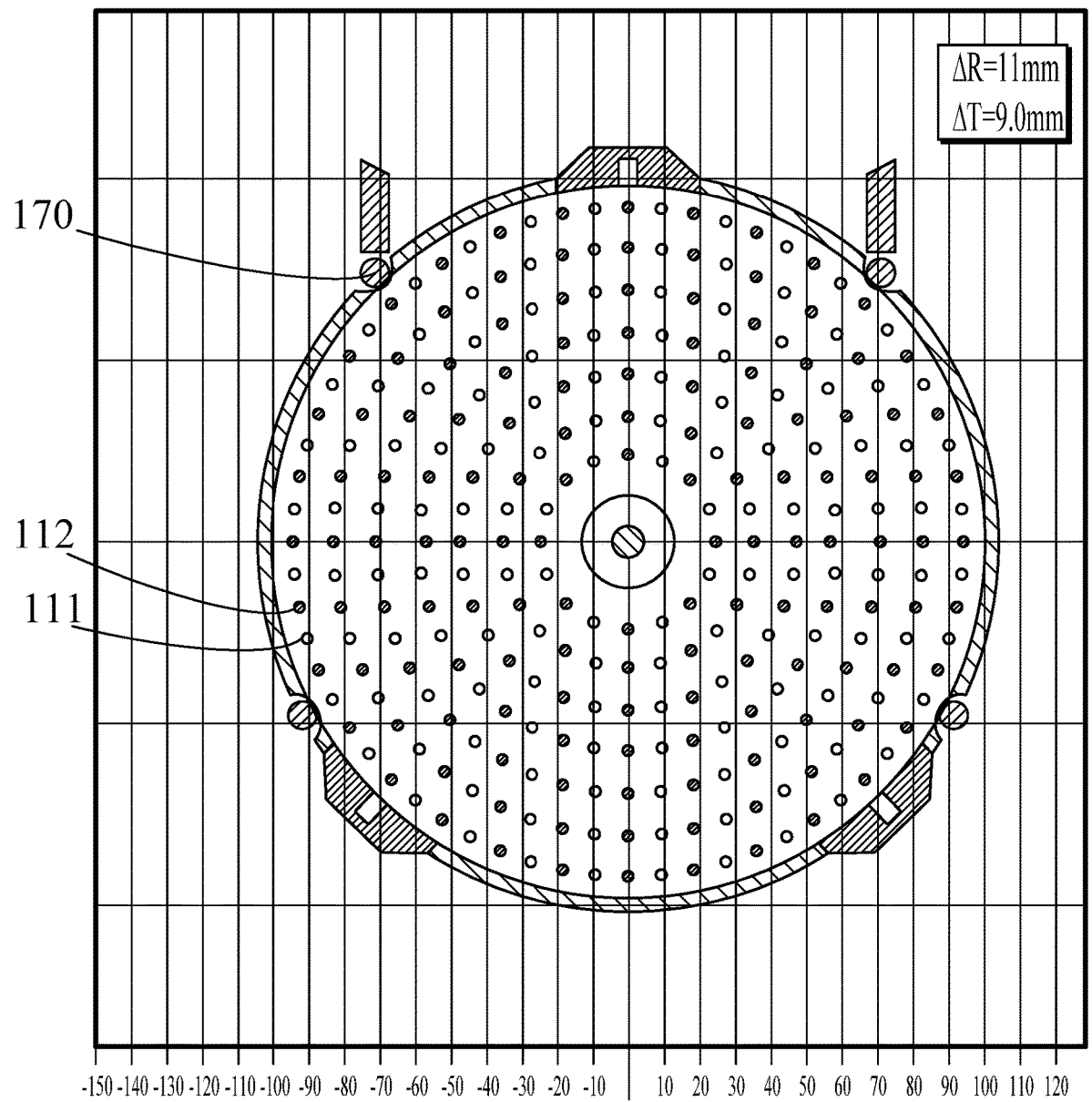
FIG. 12 is a schematic top view of an air-bearing chuck according to another embodiment of the present application.

FIG. 12 is a schematic top view of an air-bearing chuck according to another embodiment of the present application. As shown in FIG. 12, the air-bearing chuck 110 includes vacuum nozzles 112 and pressure nozzles 111 that are arranged according to ΔR and ΔT. ΔR=11.0 mm, and ΔT=9.0 mm. Since the difference between ΔR and ΔT is 2 mm, it may be considered that ΔR and ΔT are approximately the same.

Figure 13:
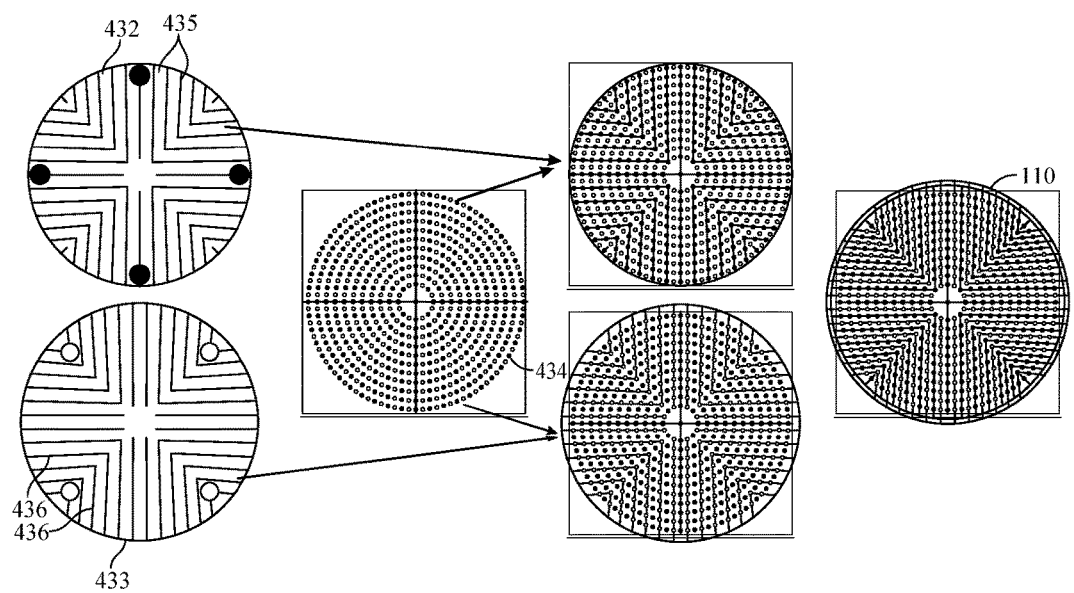
FIG. 13 is a schematic diagram of connection layers of pressure nozzles and vacuum nozzles of an air-bearing chuck.

FIG. 13 is a schematic diagram of connection layers of pressure nozzles and vacuum nozzles of an air-bearing chuck. FIG. 13 provides a top view of stacked layers of the air-bearing chuck 110. The stacked layers include a vacuum manifold layer 432, a pressure manifold layer 433, and a top chuck layer 434. The vacuum manifold layer 432 includes a vacuum channel 435, and the vacuum manifold layer 432 connects all the vacuum channels 435 and vacuum supply. The pressure manifold layer 433 includes a pressure channel 436, and the pressure manifold layer 433 connects all the pressure channel 436 and pressure supply. The top chuck layer 434 includes multiple through holes connecting the vacuum channel 435 in the vacuum manifold layer 432 to the vacuum nozzles on the top surface of the air-bearing chuck 434. The top chuck layer 434 further includes additional through holes connecting the pressure channel 436 in the pressure manifold layer 433 to the pressure nozzles on the top surface of the top chuck layer 434. Through holes for vacuum and pressure are arranged in an alternating fashion corresponding to the vacuum and pressure nozzle arrangements shown in FIG. 11 and FIG. 12.

Figure 14:
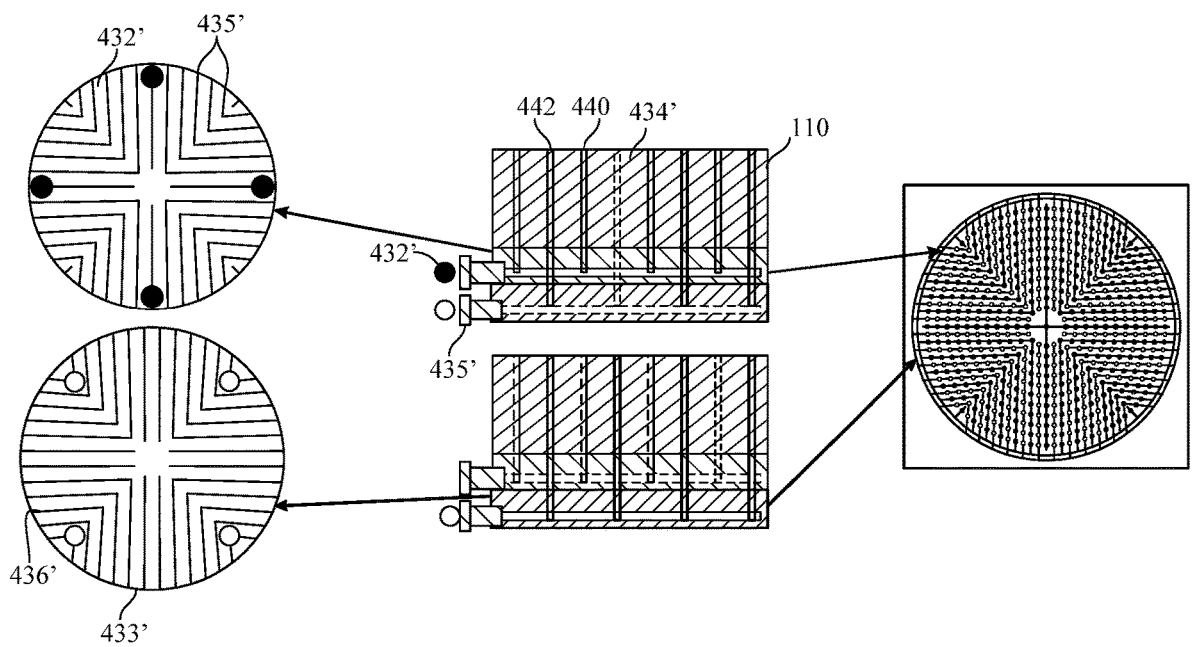
FIG. 14 is a schematic side view of a stacked structure of an air-bearing chuck according to an embodiment of the present application.

FIG. 14 is a schematic side view of a stacked structure of an air-bearing chuck 110 according to an embodiment of the present application. The air-bearing chuck 110 includes a top chuck layer 434', a vacuum manifold layer 432', and a pressure manifold layer 433'. There are alternating through holes 440 and 442 connecting the vacuum channels 435' and pressure channels 436', respectively, to the vacuum nozzles 112 and pressure nozzles 111 on the top surface of the air-bearing chuck 110. As shown in the side view of the air-bearing chuck of FIG. 14, the separation ΔT between the alternating vacuum nozzles and pressure nozzles may be substantially the same.

Figure 15:
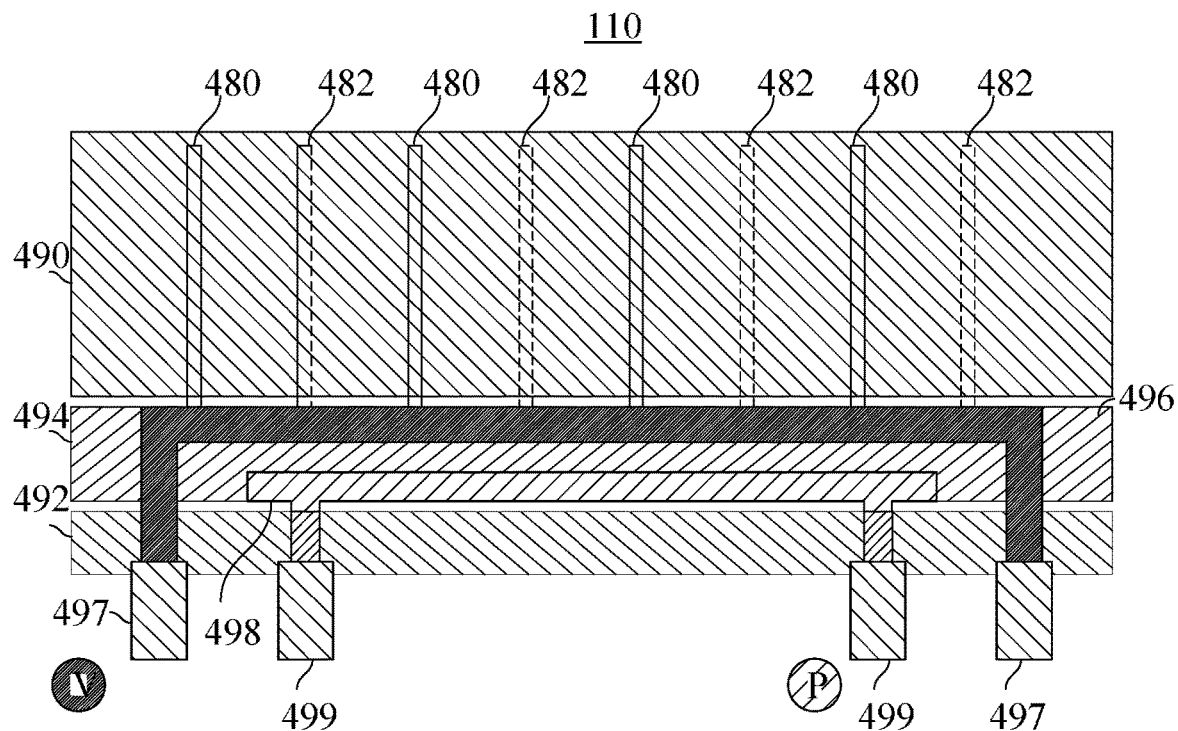
FIG. 15 is a schematic side view of a stacked structure of an air-bearing chuck according to another embodiment of the present application.

FIG. 15 is a schematic side view of a stacked structure of an air-bearing chuck according to another embodiment of the present application. In the embodiment, the stacked structure may include a top plate 490, a back cover plate 492, and a manifold plate 494 sandwiched between the top plate 490 and the back cover plate 492. The top plate 490 may be composed of aluminum, ceramic, glass, microcrystalline silicon, or the like, and a thickness of the top plate 490 may range from 10 mm to 60 mm. Similar to the embodiment illustrated in FIG. 14, through holes 480 and 482 alternately disposed in the top plate 490 provide pressure support force and vacuum suction force, respectively, to keep the wafer floating on an air cushion. The diameter of the through holes 480 and 482 may range from 1.25 mm to 1.5 mm.

A top surface and a bottom surface of the manifold plate 494 may each have one or more grooves in which a vacuum channel 496 and a pressure channel 498 may be located, respectively. In an example illustrated in FIG. 15, the vacuum channel 496 may be embedded in a groove on the top surface of the manifold plate 494, and connects vacuum nozzles on the top plate 490 of the stacked structure to vacuum outlets 497 on a bottom plate of the stacked structure through the through holes 480. Similarly, the pressure channel 498 may be embedded in a groove on the bottom surface of the manifold plate 494, and connects pressure nozzles on the top plate 490 of the stacked structure to pressure outlets 499 on the bottom plate of the stacked structure through the through holes 482. The grooves on the top surface and the bottom surface of the manifold plate may be arranged according to the structure of the vacuum channel and the pressure channel, respectively, and may be a few millimeter wide and a few millimeter deep, for example, 2 mm wide and 2 mm deep.

Figure 16:
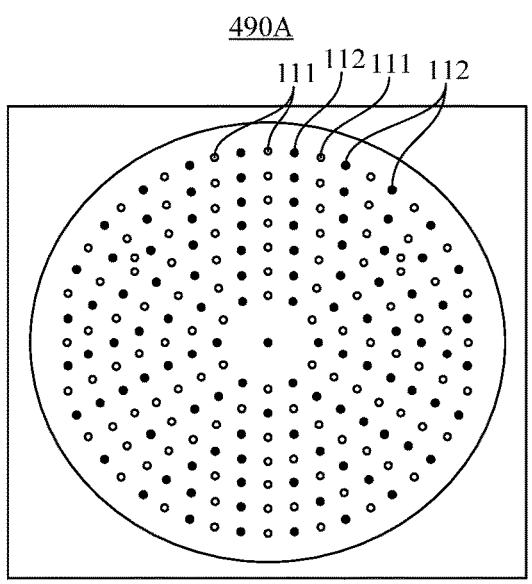
FIG. 16 is a schematic diagram of a top surface of a top plate of a stacked structure.

FIG. 16 is a schematic diagram of a top surface of the top plate of a stacked structure. The stacked structure may be shown in FIG. 15. The top surface 490A of the top plate 490 of the stacked structure includes equally or nonequally spaced alternating pressure nozzles 111 and vacuum nozzles 112 (or holes) with, for example, 5 mm to 25 mm radial and tangential spacing, for another example, 8 mm to 12 mm radial and tangential spacing. The vacuum nozzles 112 may have a few millimeters, such as 1.5 mm in diameters. The pressure nozzles 111 may have a few millimeters, such as 1.25 mm in diameters. Both the vacuum nozzles 112 and the pressure nozzles 111 may have chamfers.

Figure 17:
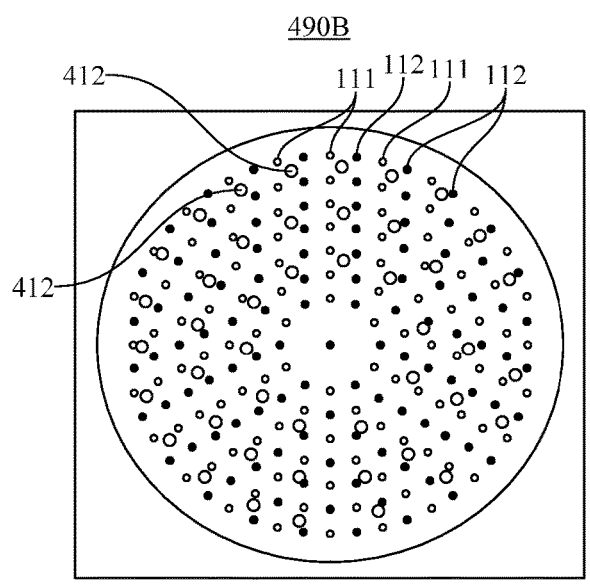
FIG. 17 is a schematic diagram of a bottom surface of a top plate of a stacked structure.

FIG. 17 is a schematic diagram of a bottom surface of a top plate of a stacked structure. The stacked structure may be shown in FIG. 15. The same pattern of the pressure nozzles 111 and the vacuum nozzles 112 is shown in FIG. 17. The bottom surface 490B may also include M3.5 or M4 threaded holes 412 for fastening the plates of the stacked structure together and sealing the vacuum and pressure channels. Alternatively, glue may also be configured to hold the plates together, and this method may improve a flatness of the top surface. If glue is configured, no M3.5 or M4 or any other threaded holes are required on the plate.

FIG. 18 is a top view of an exemplary manifold plate of a stacked structure. FIG. 19 is a bottom view of an exemplary manifold plate of a stacked structure. The stacked structure may be shown in FIG. 15. All vacuum nozzles from the top plate are connected to corresponding vacuum holes 420 in the grooves on the top surface 494A of the manifold plate 494. In comparison, all pressure nozzles from the top plate are connected to corresponding pressure holes 422 in the manifold plate 494 to form straight holes from the top plate down through the manifold plate 494 (as shown in FIG. 15), thereby connecting the pressure nozzles on the top plate to the pressure channels (shown in FIG. 19) embedded in the grooves at the bottom of the manifold plate 494. Vacuum channels 420A on the top surface of the manifold plate 494 may be patterned as shown in FIG. 18. The channels are aligned with the vacuum nozzles on the top plate and connected by an outer circular channel 424 along the edge of the manifold plate 494. FIG. 18 also shows M3.5 or M4 threaded holes 412' for fastening the plates of the stacked structure together.

The pressure channels or grooves 430 may be in an inner ring-like pattern ("pressure supply rings"), and connects pressure holes that are through the manifold plate 494. Since a cross section of the pressure supply ring increases, the pressure supply ring may be less resistance. The bottom view of FIG. 19 also shows the M3.5 or M4 threaded holes 412" shown in FIG. 18. Although the bottom view also shows the superimposed vacuum channels 420', it should be understood that this is only for illustrative purposes. As shown in FIG. 18, the actual vacuum channels 420' are situated in grooves on the top surface of the manifold plate 494.

FIG. 20 is a top view of a back cover plate of a stacked structure. FIG. 21 is a bottom view of the back cover plate of a stacked structure. The stacked structure may be shown in FIG. 15. As shown in FIG. 20, the top surface of the back cover plate 492 may be polished to seal the manifold bottom surface of the manifold plate embedded with the pressure grooves. There are three openings 1j for connecting the pressure channels from the bottom surface of the manifold plate 492 to a pressure fittings. In addition, there are three other openings 2j for connecting the vacuum channels from the top surface of the manifold plate to a vacuum fittings. The same pressure openings 1k and vacuum openings 2k are also shown in the bottom view of the back cover plate 492 in FIG. 21. The top view of the back cover plate 492 shown in FIG. 20 and the bottom view of the back cover plate 492 shown in FIG. 21 also show M3.5 or M4 threaded holes 412''' for fastening the back cover plate to other plates in the stacked structure.

Although FIG. 15 to FIG. 21 show a stacked structure of an air-bearing chuck, and the stacked structure has pressure channels and vacuum channels respectively located in grooves on the bottom surface and top surface of a manifold layer, it should be understood that, these channels may alternatively be embedded in grooves of another layer. For example, the vacuum channels may be located in grooves on the bottom layer of the top plate, and the pressure channels may be located in grooves on the top layer of the back cover plate. Furthermore, it should be understood that, in other embodiments, the arrangement of the vacuum channels and the pressure channels may be interchangeable. In various embodiments, there may be different quantities of one or more of vacuum nozzles and pressure nozzles. Paths of the vacuum channels and pressure channels may be adjusted according to the quantity and position of the nozzles. Quantities of vacuum fittings and pressure fittings at the bottom of the stacked structure are not limited, for example, may be three or more.

FIG. 22a and FIG. 22b are schematic structural diagrams of an exemplary manifold chamber according to an embodiment of the present application. The manifold chamber 500 is configured to separate pressure nozzles from vacuum nozzles. As shown in FIG. 22a and FIG. 22b, the manifold chamber 500 includes a pressure manifold chamber 504 and a vacuum manifold chamber 502. All vacuum nozzles are connected to the vacuum manifold chamber 502. All pressure nozzles pass through the vacuum manifold chamber 502 and directly reach the pressure manifold chamber 504 located below the vacuum manifold chamber 502. A computer fluid dynamics (Computational fluid dynamics, CFD) simulation shows that such kind of manifold chamber greatly improves uniformity of the vacuum nozzles and the pressure nozzles. The manifold chamber may provide a uniform amount of gas and optimize an increased channel size to the greatest extent. In addition, a height of the chamber may be adjusted to minimize a change in orifice flow.

An air cushion configured to support a wafer also has a gas damping capability, which effectively isolates ground vibration and sound vibration, thus removing or reducing a need for sound isolation boxes and active vibration isolation systems.

Figure 23:
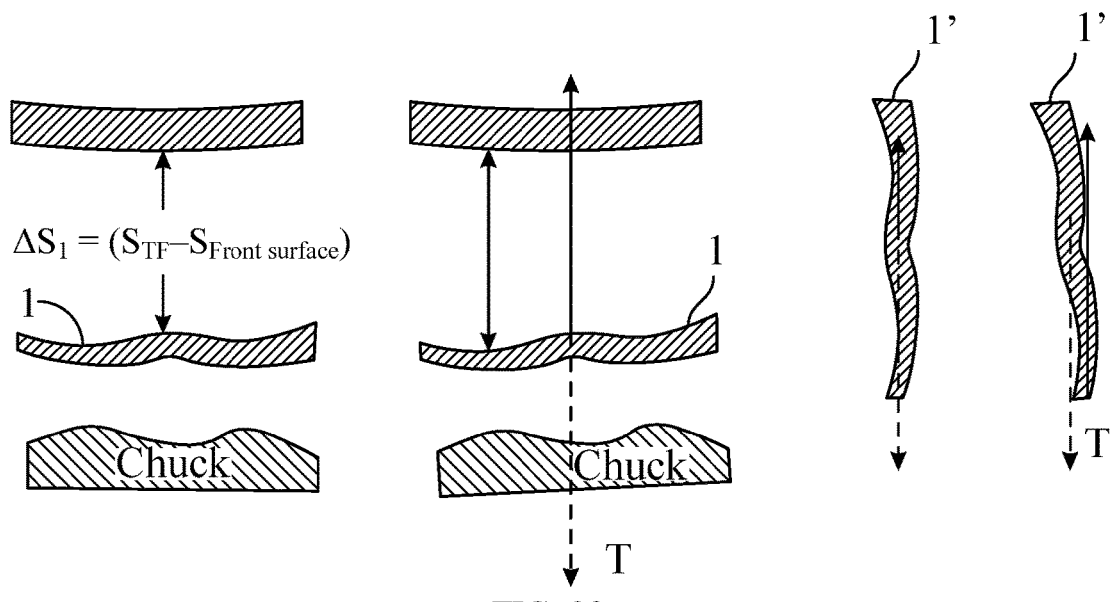
FIG. 23 is a schematic comparison diagram between a wafer in a vertical position and a wafer in a horizontal position.

FIG. 23 is a schematic comparison diagram between a wafer in a vertical position and a wafer in a horizontal position. FIG. 23 illustrates the wafer in the vertical position is prone to shape change when tilted.

When the wafer is tilted, a shape of the wafer 1 in a horizontal position may be better maintained than a same wafer 1' in the vertical position. As shown in FIG. 23, when the same wafer 1' is in the vertical position, if the wafer 1' is not completely vertical, the shape of the wafer 1' may be changed by gravity. This is because when the vertically clamped wafer 1' is tilted, a torque T is applied to the wafer 1'. The torque will cause the shape of the wafer to change. This limits measurement accuracy for a traditional dual Fizeau interferometer tools. In comparison, the measuring apparatus disclosed in the present application supports the wafer 1 on a thin air cushion that helps maintain a natural shape of the wafer 1 even when the wafer 1 is at a relatively small tilt angle (usually less than a fraction of one degree), as shown in the horizontal setting of FIG. 23.

The measuring apparatus disclosed in the present application may be configured to measure a warp of a thin wafer. When the wafer is tilted in the vertical position, the wafer is too thin to be put in the vertical position or too thin to keep its shape unchanged. For some thin wafers, it may be too thin to form a support at two points on the edge of the wafer. In the measuring apparatus, the wafer is in the horizontal position and supported by the air cushion, that is, the wafer may be placed horizontally on the air cushion that is generated on a top surface of an air-bearing chuck. When the wafer is tilted, a very small radial force is applied to the wafer to maintain the position of the wafer. At proper floating height, vacuum setting, and pressure setting, the warp of a thin wafer may be measured.

Accordingly, a wafer geometry tool and a patterned wafer geometry tool that use the above method may have high precision and high throughput, but at about half price as compared with the dual Fizeau interferometer architecture. This method provides a cost-effective and high precision solution for wafer flatness, nano-topography, and shape measurement tools for wafers of any size such as 200 mm, 300 mm, 450 mm, and the like.

Figure 24A:
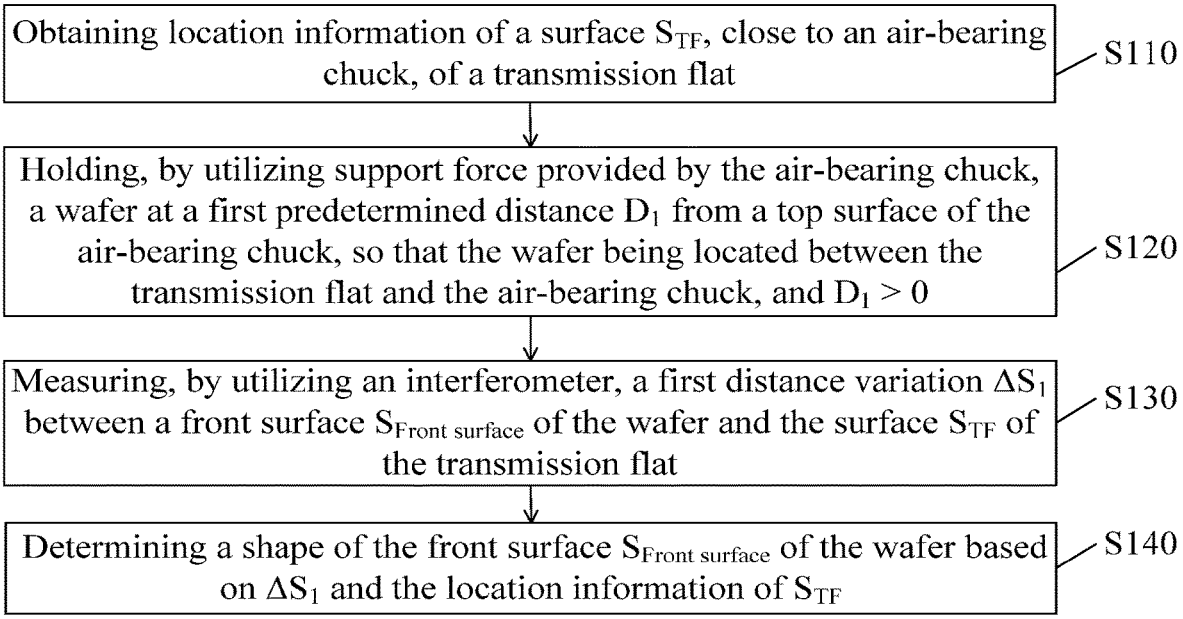
FIG. 24a is a schematic flow diagram of a measuring method of a wafer shape according to an embodiment of the present application.

FIG. 24a is a schematic flow diagram of a measuring method of a wafer shape according to an embodiment of the present application. FIG. 24b is a schematic structural diagram corresponding to a measuring method of a wafer shape according to an embodiment of the present application. The measuring method may be performed by a measuring apparatus of a wafer geometry, and the measuring apparatus includes an air-bearing chuck and an interferometer. As shown in FIG. 24a, the measuring method of the wafer shape includes the following steps.

S110: Obtaining location information of a surface $S_{TF}$, close to an air-bearing chuck, of a transmission flat.

In an embodiment, Step S110 may be obtaining, by utilizing a bottom surface of the air-bearing chuck as a reference surface, a distance variation between the reference surface and the surface $S_{TF}$, close to the air-bearing chuck, of the transmission flat (Transmission Flat, TF). The distance variation is corresponding to the location information of the surface $S_{TF}$, close to the air-bearing chuck, of the transmission flat. When the surface $S_{TF}$ of the transmission flat is thick and there is minimum TF sag, the distance variation may be represented by a distance between the reference surface and the surface $S_{TF}$, close to the air-bearing chuck, of the transmission flat. In another embodiment, in Step S110, the surface $S_{TF}$ of the transmission flat may serve as the reference surface, and the location information of the surface $S_{TF}$ may be indicated by zero, as long as a height variation or a shape of $S_{TF}$ can be indicated, which is not specifically limited in the present application. The location information of $S_{TF}$ may be a constant, or may be a plurality of data reflecting the shape of the surface $S_{TF}$ of the transmission flat, which is not specifically limited in the present application.

It should be understood that, the location information of the surface $S_{TF}$ of the transmission flat may be known or obtained through measurement, which is not specifically limited in the present application.

S120: Holding, by utilizing support force provided by the air-bearing chuck, a wafer at a first predetermined distance $D_1$ from a top surface of the air-bearing chuck, so that the wafer is located between the transmission flat and the air-bearing chuck, and $D_1>0$ (as shown in FIG. 24).

For example, referring to FIG. 24, a measuring apparatus of a wafer geometry includes an air-bearing chuck 110 and an interferometer that includes a transmission flat 126. The air-bearing chuck 110 and the transmission flat 126 of the measuring apparatus are schematically shown in FIG. 24. When a wafer 1 is loaded, as shown in FIG. 24, the wafer 1 is placed on a top surface of the air-bearing chuck 110.

It should be understood that, the support force may be provided by a gas, inside the air-bearing chuck, ejected from the top surface of the air-bearing chuck, may be provided by gases, inside the air-bearing chuck, ejected from and sucked from the top surface of the air-bearing chuck, or may be provided in another manner, which is not specifically limited in the present application. A range of $D_1$ may be determined based on a distance between the air-bearing chuck 110 and the transmission flat 126 as long as the wafer 110 is not in contact with the air-bearing chuck and measurement of the wafer shape is not affected. The range of $D_1$ is not specifically limited in the present application. The first predetermined distance $D_1$ may be any distance between opposing surfaces of the air-bearing chuck 110 and the wafer 1, for example, may be a distance between the center location point of the top surface of the air-bearing chuck 110 and a location point, corresponding to the center location point, on the wafer 1. A location, relative to the first predetermined distance $D_1$, on the top surface of the air-bearing chuck 110 is not specifically limited in the present application. The first predetermined distance $D_1$ may be monitored by utilizing a capacitive sensor embedded at the center or another position of the air-bearing chuck, or may be monitored by utilizing another instrument capable of measuring the distance between the wafer and the air-bearing chuck. A manner of monitoring the first predetermined distance $D_1$ is not specifically limited in the present application.

S130: Measuring, by utilizing an interferometer, a first distance variation $\Delta S_1$ between a front surface $S_{Front\ surface}$ of the wafer and the surface $S_{TF}$ of the transmission flat. The front surface of the wafer is configured to reflect light, and is a surface, away from the air-bearing chuck, of the wafer (as shown in FIG. 24).

It should be understood that, the interferometer may be a Fizeau interferometer with different functions, such as wavelength phase shifting, distance phase shifting, or polarization phase shifting; or may be another vertically incident interferometer, such as a Michelson interferometer, or a shearing interferometer, which is not specifically limited in the present application. Referring to FIG. 24, the first distance variation $\Delta S_1$ is equal to a difference between location information of a surface $S_{TF}$, close to the wafer, of the transmission flat and location information of the front surface $S_{Front\ surface}$ of the wafer, which may be expressed as $\Delta S_1 = (S_{TF} - S_{Front\ surface})$.

S140: Determining a shape of the front surface $S_{Front\ surface}$ of the wafer based on $\Delta S_1$ and the location information of $S_{TF}$.

It should be understood that, the shape of $S_{Front\ surface}$ may be equivalent to the location information of $S_{Front\ surface}$, and the shape of $S_{Front\ surface}$ may be expressed as $S_{Front\ surface} = S_{TF} - \Delta S_1$.

According to the technical solution provided in the embodiment of the present application, location information of a surface $S_{TF}$, close to an air-bearing chuck, of a transmission flat is obtained; a wafer is held at a first predetermined distance $D_1$ from a top surface of the air-bearing chuck by utilizing support force provided by the air-bearing chuck; a first distance variation $\Delta S_1$ between a front surface $S_{Front\ surface}$ of the wafer and the surface $S_{TF}$ of the transmission flat is measured by utilizing an interferometer; and a shape of the front surface $S_{Front\ surface}$ of the wafer based on $\Delta S_1$ and the location information of SW. Since the wafer is not in contact with the air-bearing chuck during measurement, large errors caused by a clamping tool, a mark (or artifact) on the surface of the chuck, or the like during measurement of the wafer shape can be effectively avoided, thereby reducing measurement errors of the wafer shape. In addition, shape measurement performed according to the above steps is accurate, and does not need correction as long as the air gap is set properly.

In an embodiment of the present application, $D_1$ ranges from 60 µm to 1500 µm.

It should be understood that, the first predetermined distance $D_1$ may be 60 µm, 300 µm, 350 µm, 1000 µm, 1500 µm, or the like, which is not specifically limited in the embodiment of the present application. To measure the wafer shape, the wafer 1 is held at a relatively large air gap whose height is corresponding to the first predetermined distance $D_1$.

The wafer 1 is placed on the top surface of the air-bearing chuck 110. To measure the wafer shape, the wafer 1 is held at a relatively large air gap (e.g., 60 µm to 1500 µm). The air-bearing chuck is designed and operated in such a way that a pressure can balance the gravity, so that there is no additional force that deforms the wafer. Therefore, at these relatively large air gaps, the wafer 1 maintains its natural shape while being supported by an air cushion.

According to the embodiment of the present application, a first predetermined distance $D_1$ is set to range from 60 µm to 1500 µm, that is, a wafer is held at a relatively large air gap from a top surface of an air-bearing chuck, so that any change of a wafer shape due to external force is avoided when the air-bearing chuck is configured to support the wafer, and thus an original state of the wafer can be effectively maintained, facilitating obtaining of an accurate measurement result when the air-bearing chuck is applied to shape measurement.

In an embodiment of the present application, $D_1$ ranges from 60 µm to 300 µm.

It should be understood that, the first predetermined distance $D_1$ ranges from 60 µm to 300 µm. The range of the first predetermined distance $D_1$ may be designed based on a distance between the air-bearing chuck and an interferometer and a shape or flatness of a wafer, which is not specifically limited in the present application.

In the embodiment of the present application, a first predetermined distance is set to range from 60 µm to 300 µm. An air-bearing chuck is designed and operated in such a way that support force of a pressure can balance the gravity, and a pressure of a high-pressure gas acting on a wafer is vertically upward, and is an axisymmetric uniform support force with the wafer center as an axis. At relatively large air gaps, an air cushion of the wafer provides axisymmetric support force without being affected by a chuck flatness, so that the wafer maintains its natural shape while being supported by the air cushion.

FIG. 25 is a schematic flow diagram of a measuring method of a wafer shape according to another embodiment of the present application. The embodiment illustrated in FIG. 25 is a modified example of the embodiment illustrated in FIG. 23. A difference between the two embodiments lies in that, Step S111 and Step S112 illustrated in FIG. 25 are corresponding to Step S110 of the embodiment illustrated in FIG. 23.

S111: Measuring, by utilizing an interferometer, a second distance variation $\Delta S_2$ between a surface $S_{TF}$ of a transmission flat and a surface $S_{ref}$, close to the transmission flat, of a reference object.

It should be understood that, $\Delta S_2$ is equal to a difference between location information of $S_{TF}$ and location information of $S_{ref}$, which may be expressed as $\Delta S_2 = S_{TF} - S_{ref}$.

In an embodiment of the present application, a flatness of the reference object is 2 to 4 orders of magnitude less than a flatness of a wafer.

The flatness of the reference object may be less than the flatness of the wafer, for example, the flatness of the reference object may be one or more orders of magnitude less than the flatness of the wafer. For another example, a flatness (in nm) of the reference object (e.g., a reference transmission flat) may be much higher than the flatness (in µm) of the wafer, which is not specifically limited in the present application.

According to the embodiment of the present application, a flatness of a reference object is set to be 2 to 4 orders of magnitude less than a flatness of a wafer, so that the flatness of the reference object is sufficiently small, and an impact of the flatness of the reference object on a measurement result of a wafer shape may be ignored during measurement of the wafer shape.

S112: Determining, based on $\Delta S_2$ and the location information of $S_{ref}$, the location information of the surface $S_{TF}$, close to the air-bearing chuck, of the transmission flat.

It should be understood that, the location information of $S_{TF}$ may be expressed as $S_{TF} = S_{ref} + \Delta S_2$.

According to the technical solution provided in the embodiment of the present application, a second distance variation $\Delta S_2$ between a surface $S_{TF}$ of a transmission flat and a surface $S_{ref}$, close to the transmission flat, of a reference object is measured by utilizing an interferometer, and location information of the surface $S_{TF}$, close to the air-bearing chuck, of the transmission flat is determined based on $\Delta S_2$ and location information of $S_{ref}$, so that the location information of $S_{TF}$ is calibrated by utilizing the reference object. Since the surface $S_{ref}$ of the reference object may be approximated as a reference surface, the location information of the surface $S_{ref}$ of the reference object may be expressed by a constant. Thus, the location information of the surface $S_{TF}$, close to the air-bearing chuck, of the transmission flat may be determined based on $\Delta S_2$ and the location information of $S_{ref}$, so that the location information of $S_{TF}$ accurately reflects a height variation or shape of $S_{TF}$, thereby improving precision and accuracy during wafer shape measurement.

Figure 26:
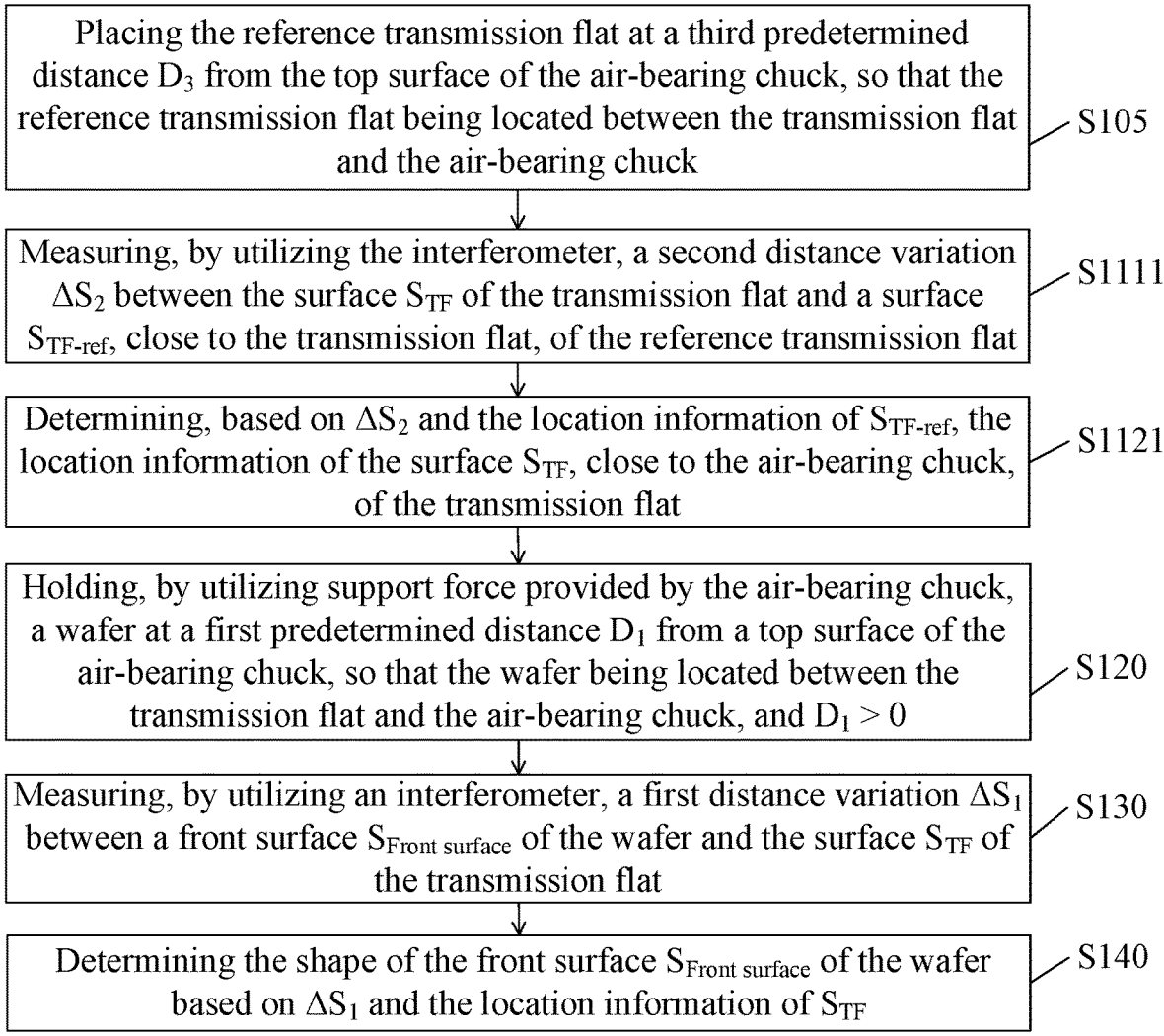
FIG. 26 is a schematic flow diagram of a measuring method of a wafer shape according to still another embodiment of the present application.
Figure 27:
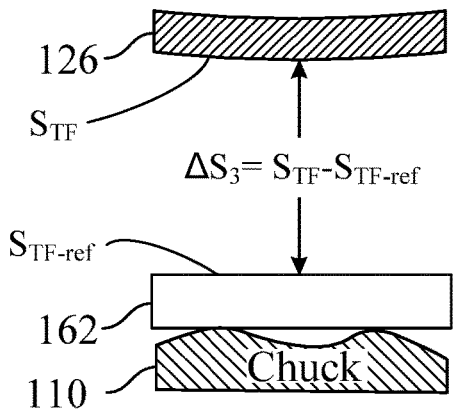
FIG. 27 is a schematic structural diagram corresponding to a measuring method of a wafer shape according to still another embodiment of the present application.
Figure 28:
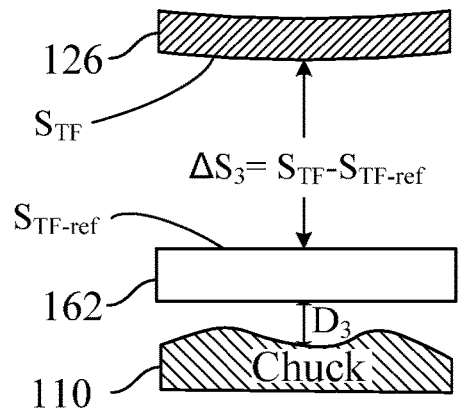
FIG. 28 is a schematic structural diagram corresponding to the measuring method of a wafer shape according to still another embodiment of the present application.

FIG. 26 is a schematic flow diagram of a measuring method of a wafer shape according to still another embodiment of the present application. FIG. 27 is a schematic structural diagram corresponding to the measuring method of a wafer shape according to still another embodiment of the present application. FIG. 28 is another schematic structural diagram corresponding to the measuring method of a wafer shape according to still another embodiment of the present application. The embodiment illustrated in FIG. 26 is a modified example of the embodiment illustrated in FIG. 25. A difference between the two embodiments lies in that, in the embodiment illustrated in FIG. 26, the reference object is a reference transmission flat, and Step S1111 and Step S1121 are respectively corresponding to Step S111 and Step S112 of the embodiment illustrated in FIG. 25. In addition, before Step S1111, Step S105 is further performed.

S105: Placing the reference transmission flat at a third predetermined distance $D_3$ from the top surface of the air-bearing chuck, so that the reference transmission flat being located between the transmission flat and the air-bearing chuck. A flatness of the reference transmission flat is less than that of the wafer (referring to FIG. 27 and FIG. 28).

It should be understood that, the value of $D_3$ may be 0 (as shown in FIG. 27) or another value (as shown in FIG. 28), which is not specifically limited in the present application.

Referring to FIG. 27 and FIG. 28, to measure the wafer shape, a reference TF 162 (TF-ref) is placed on a top surface of the air-bearing chuck 110 to calibrate a TF 126 in the apparatus. The reference TF 162 may be placed directly on the top surface of the air-bearing chuck (as shown in FIG. 27), or may be kept floating up on the top surface of the air-bearing chuck by utilizing the air-bearing chuck so that the reference TF 162 is not in contact with the top surface of the air-bearing chuck (as shown in FIG. 28), which is not specifically limited in the present application.

S1111: Measuring, by utilizing the interferometer, a second distance variation $\Delta S_2$ between the surface $S_{TF}$ of the transmission flat and a surface $S_{TF-ref}$, close to the transmission flat, of the reference transmission flat.

Specifically, $\Delta S_2$ is equal to a difference between location information of $S_{TF}$ and location information of $S_{TF-ref}$, which may be expressed as $\Delta S_2 = S_{TF-ref}$ It should be understood that, $S_{TF-ref}$ is a translation term that can be removed. If TF 126 is thick and there is minimum TF sag, the cavity calibration step can be skipped as well. In this step, there is no wafer on the chuck. This calibration may be completed before delivery. Assuming that the TF shape does not change, only tilt correction may be done at measurement time.

In Step S105 and Step S1111, there is no wafer on the air-bearing chuck, and the calibration process corresponding to Step S105 and Step S1111 may be completed before delivery or during measurement, which is not specifically limited in the present application.

S1121: Determining, based on $\Delta S_2$ and the location information of $S_{TF-ref}$, the location information of the surface $S_{TF}$, close to the air-bearing chuck, of the transmission flat.

It should be understood that, the location information of $S_{TF}$ may be expressed as $S_{TF} = \Delta S_2 + S_{TF-ref}$.

In Step S140 of the embodiment of the present application, a shape of the front surface $S_{Front\ surface}$ of the wafer is determined based on $\Delta S_1$ and the location information of $S_{TF}$, which may be expressed as $S_{Front\ surface} = S_{TF} - \Delta S_1 = \Delta S_2 + S_{TF-ref} - \Delta S_1$.

For example, in combination with FIG. 27 or FIG. 28, the wafer shape is calculated based on the obtained difference between $\Delta S_2$ and the measured value $\Delta S_1$ as follows:

$$\text{Wafer shape} = \Delta S_2 - \Delta S_1 = (S_{TF} - S_{TF-ref}) - (S_{TF} - S_{Front\ surface}) =$$
$$S_{Front\ surface} - S_{TF-ref} = S_{Front\ surface}.$$

Since the reference TF has a relatively high flatness, $S_{TF-ref}$ may be equivalent to a constant, and both $S_{Front\ surface} - S_{TF-ref}$ and $S_{Front\ surface}$ may be configured to reflect the wafer shape, namely, the shape of the front surface $S_{Front\ surface}$ of the wafer. Shape measurement performed according to the above steps is accurate, and does not need correction so long as the air gap is set properly. This could be an ideal tool architecture for a patterned wafer geometry (Patterned Wafer Geometry, PWG) tool. It should be understood that, when the flatness of $S_{TF-ref}$ is relatively high, the location information of $S_{TF-ref}$ may be expressed with a constant. In this case, both $S_{Front\ surface} - S_{TF-ref}$ and $S_{Front\ surface}$ may be configured to indicate the shape of the front surface of the wafer as long as the location information or height variation of the front surface of the wafer can be reflected. A manner of indicating the shape of the front surface of the wafer is not specifically limited in the present application.

According to the technical solution provided in the embodiment of the present application, a reference transmission flat is configured as a reference object, so that location information of a surface of a transmission flat TF is calibrated by utilizing the reference transmission flat, to avoid large errors in the location information of the surface of the transmission flat due to a large part of sag in the surface of the transmission flat, and thus a measurement result of the wafer shape is not affected by TF in a measuring apparatus of a wafer geometry. The reference transmission flat is placed at a third predetermined distance $D_3$ from the top surface of an air-bearing chuck, so that the reference transmission flat is located between the transmission flat and the air-bearing chuck, and a second distance variation $\Delta S_2$ between opposing surfaces of the reference transmission flat and the transmission flat is measured by utilizing an interferometer. Since the reference transmission flat has a relatively high flatness, a shape of a front surface $S_{Front\ surface}$ of the wafer may be directly obtained from location information of the front surface $S_{Front\ surface}$ of the wafer, which avoids relatively large errors caused when a measurement result of the wafer shape is affected by irregularities of the top surface of the air-bearing chuck, the surface of the TF, and the like, facilitating improvement of precision and accuracy of the measurement result of the wafer shape.

Figure 29:
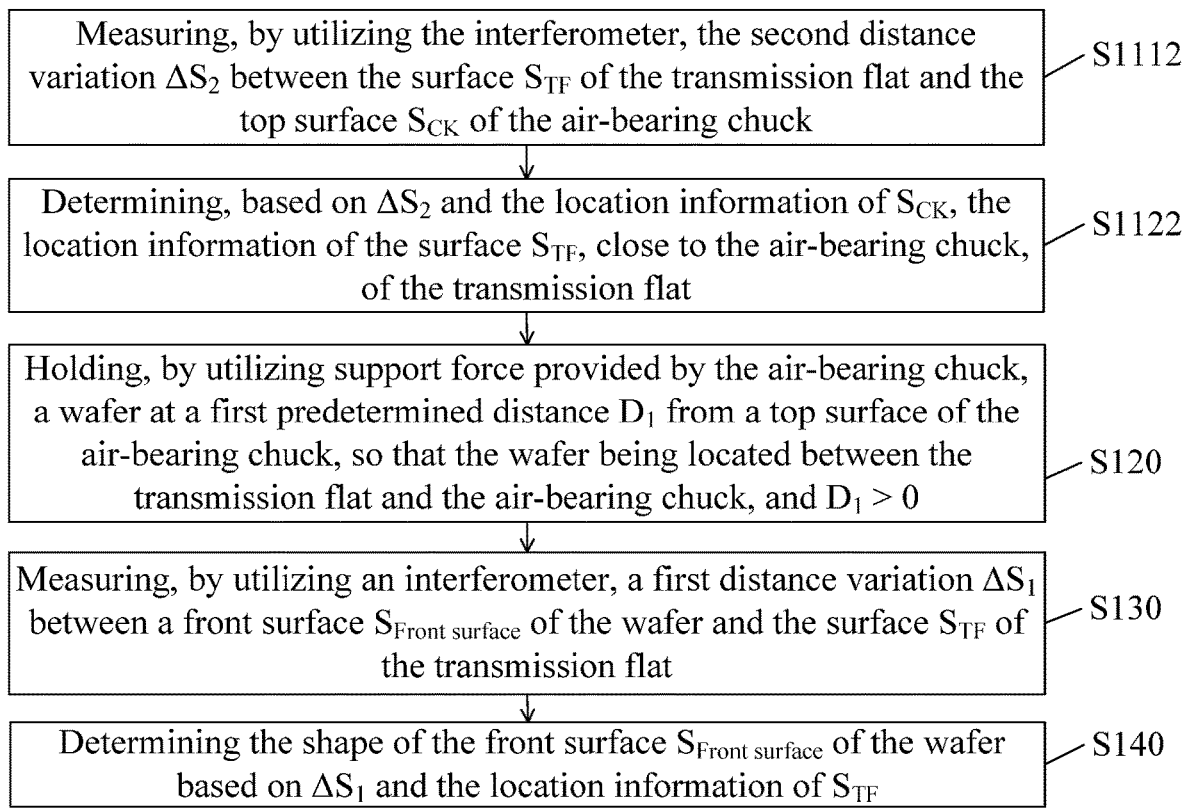
FIG. 29 is a schematic flow diagram corresponding to a measuring method of a wafer shape according to yet another embodiment of the present application.
Figure 30:
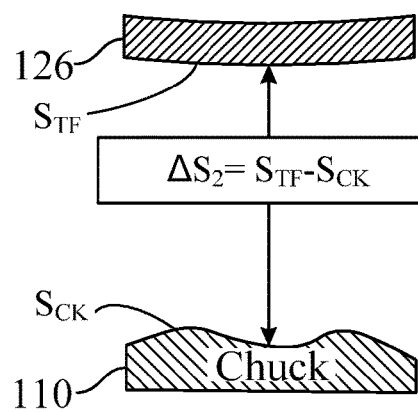
FIG. 30 is a schematic structural diagram corresponding to a measuring method of a wafer shape according to yet another embodiment of the present application.

FIG. 29 is a schematic flow diagram corresponding to a measuring method of a wafer shape according to yet another embodiment of the present application. FIG. 30 is a schematic structural diagram corresponding to a measuring method of a wafer shape according to yet another embodiment of the present application. The embodiment illustrated in FIG. 29 is a modified example of the embodiment illustrated in FIG. 25. A difference between the two embodiments lies in that, in the embodiment illustrated in FIG. 26, the reference object is the air-bearing chuck, and Step S1112 and Step S1122 are respectively corresponding to Step S111 and Step S112 of the embodiment illustrated in FIG. 25.

S1112: Measuring, by utilizing the interferometer, the second distance variation $\Delta S_2$ between the surface $S_{TF}$ of the transmission flat and the top surface $S_{CK}$ of the air-bearing chuck. The top surface of the air-bearing chuck is a surface, close to the transmission flat, of the air-bearing chuck, and the top surface of the air-bearing chuck is configured to reflect light.

It should be understood that, $\Delta S_2$ is equal to a difference between the location information of the surface $S_{TF}$ of the transmission flat and location information of the top surface $S_{CK}$ of the air-bearing chuck, which may be expressed as $\Delta S_2 = S_{TF} - S_{CK}$. In Step S1112, assuming that the top surface $S_{CK}$ of the air-bearing chuck is sufficiently flat, the top surface $S_{CK}$ of the air-bearing chuck may be configured as a reference plane, that is, the location information of $S_{CK}$ may be set to zero or a constant.

S1122: Determining, based on $\Delta S_2$ and the location information of $S_{CK}$, the location information of the surface $S_{TF}$, close to the air-bearing chuck, of the transmission flat.

It should be understood that, the location information of $S_{TF}$ may be expressed as $S_{TF} = \Delta S_2 + S_{CK}$.

Referring to FIG. 30, $\Delta S_2$ is equal to a difference between the location information of a surface $S_{TF}$, close to the air-bearing chuck, of the transmission flat and the location information of the top surface $S_{CK}$ of the air-bearing chuck, that is, $\Delta S_2 = S_{TF} - S_{CK}$. The value of $\Delta S_2$ may be retrieved from a measuring apparatus of a wafer geometry during measurement of a wafer shape, that is, the value of $\Delta S_2$ is stored in the measuring apparatus of the wafer geometry in advance, or may be obtained, during each measurement of the wafer shape, by measuring the second distance variation between opposing surfaces of the air-bearing chuck and the transmission flat by utilizing the interferometer when the wafer is not loaded, which is not specifically limited in the present application. During each measurement of the wafer shape, the step of measuring $\Delta S_2$ may be performed before the step of measuring $\Delta S_1$, or performed after the step of measuring $\Delta S_1$, which is not specifically limited in the present application.

It should be understood that, the front surface of the wafer does not refer to a specific surface of the wafer as long as the front surface is a surface, away from the air-bearing chuck, of the wafer. The front surface of the wafer may also be referred to as a top surface of the wafer, which is not specifically limited in the present application.

According to the technical solution provided in the embodiment of the present application, a shape of a wafer is measured by keeping the wafer floating up on a top surface of an air-bearing chuck by utilizing support force provided by the air-bearing chuck. Since the wafer is not in contact with the air-bearing chuck during measurement, large errors caused by a clamping tool, a mark or artifact on the surface of the chuck, or the like during measurement of the wafer shape can be effectively avoided, thereby reducing measurement errors of the wafer shape. In addition, shape measurement performed according to the above steps is accurate, and does not need correction as long as the air gap is set properly.

Figure 31:
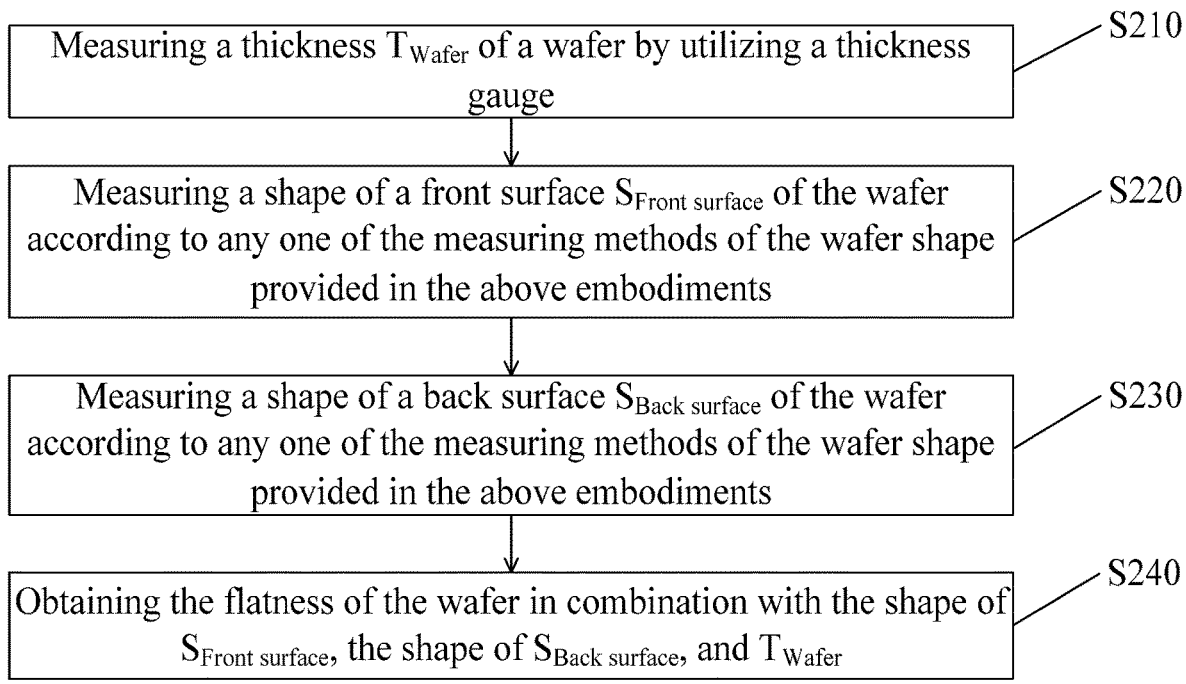
FIG. 31 is a schematic flow diagram of a measuring method of a flatness of a double-side polished wafer according to an embodiment of the present application.

FIG. 31 is a schematic flow diagram of a measuring method of a flatness of a double-side polished wafer according to an embodiment of the present application. The measuring method of the flatness of the double-side polished wafer includes the following steps.

S210: Measuring a thickness $T_{Wafer}$ of a wafer by utilizing a thickness gauge.

It should be understood that the thickness gauge may be any instrument capable of measuring a thickness of a wafer, such as a mass sensor, or may be another device, such as a CMM, which is not specifically limited in the present application. The thickness $T_{Wafer}$ of the wafer may be an average thickness of the wafer, or may be a corresponding thickness at a location point on the wafer, which is not specifically limited in the present application.

S220: Measuring a shape of a front surface $S_{Front\ surface}$ of the wafer according to any one of the measuring methods of the wafer shape provided in the above embodiments.

S230: Measuring a shape of a back surface $S_{Back\ surface}$ of the wafer according to any one of the measuring methods of the wafer shape provided in the above embodiments.

It should be understood that, the wafer may be inverted, so that the back surface of the wafer is close to a transmission flat, and the shape of the back surface $S_{Back\ surface}$ of the wafer is then measured.

It should be understood that, the front surface and the back surface of the wafer are disposed opposite to each other and both are configured to reflect light; in other words; both the front surface and the back surface of the wafer are polished. The wafer may be a 200 mm wafer, a 300 mm wafer, or a wafer in another type, which is not specifically limited in the present application.

S240: Obtaining the flatness of the wafer in combination with the shape of $S_{Front\ surface}$, the shape of $S_{Back\ surface}$, and $T_{Wafer}$.

According to the technical solution provided in the embodiment of the present application, for a double-side polished wafer, a shape of a front surface of the wafer is measured according to the measuring methods of the wafer shape in the embodiments of the present application, and the wafer is inverted and a back surface of the wafer is measured upward to obtain a shape of the back surface of the wafer. A flatness TTV of the wafer is then obtained in combination with the shape of the front surface of the wafer, the shape of the back surface of the wafer, and a corresponding thickness result, measured by a thickness gauge, at any location point on the wafer.

Figure 32:
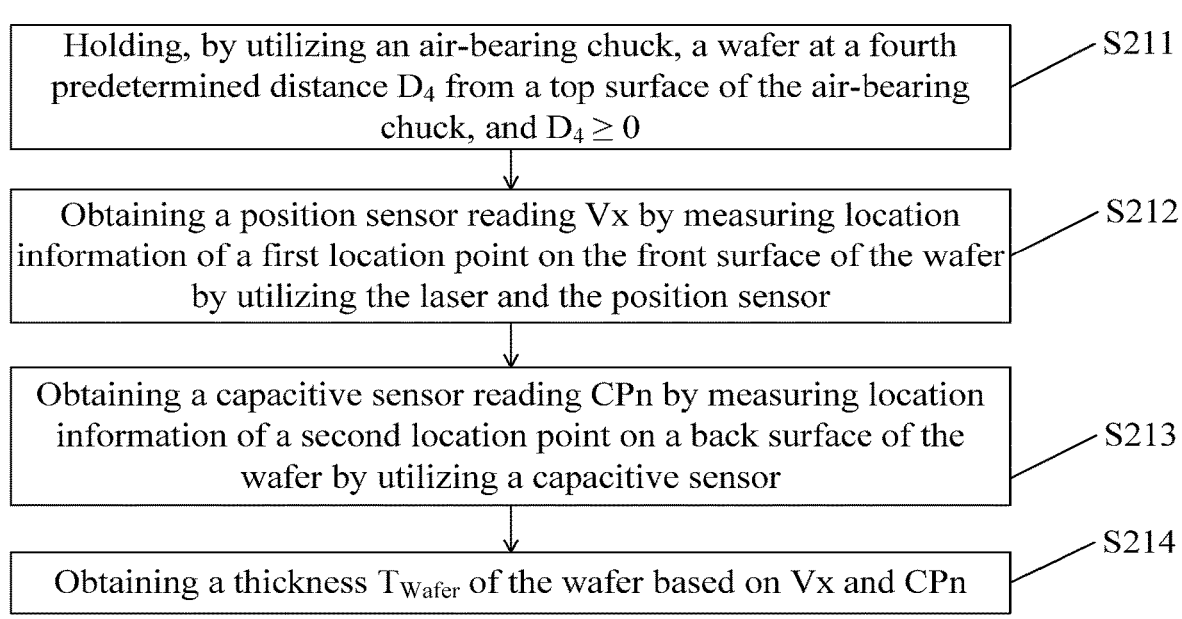
FIG. 32 is a schematic flow diagram of a measuring method of a wafer thickness according to an embodiment of the present application.

FIG. 32 is a schematic flow diagram of a measuring method of a wafer thickness according to an embodiment of the present application. The embodiment illustrated in FIG. 32 is an example of Step S210 in the embodiment illustrated in FIG. 31. A thickness gauge includes a laser, a position sensor, and a capacitive sensor. As shown in FIG. 32, Step S211 to Step S213 are corresponding to Step S210 in the embodiment illustrated in FIG. 31.

S211: Holding, by utilizing an air-bearing chuck, a wafer at a fourth predetermined distance $D_4$ from a top surface of the air-bearing chuck, and $D_4 \geq 0$.

It should be understood that, the value of the fourth predetermined distance $D_4$ may be 0 or another value, as long as laser light of the laser can be received by the position sensor after being reflected on a front surface of the wafer, which is not specifically limited in the present application.

S212: Obtaining a position sensor reading Vx by measuring location information of a first location point on the front surface of the wafer by utilizing the laser and the position sensor. The front surface of the wafer is a surface, away from the air-bearing chuck, of the wafer.

S213: Obtaining a capacitive sensor reading CPn by measuring location information of a second location point on a back surface of the wafer by utilizing a capacitive sensor. The first location point and the second location point are two opposite location points representing a thickness of the wafer.

It should be understood that, the position sensor reading Vx may be calibrated by utilizing a wafer with a known thickness, namely, a first calibration wafer. A position of the position sensor may be correlated to a height of a top surface of the wafer. The capacitive sensor may be configured to measure a position of a bottom surface of the wafer. The combined information of the top and bottom surface positions can be configured for accurately determining the thickness of the wafer.

S214: Obtaining a thickness $T_{Wafer}$ of the wafer based on Vx and CPn. $T_{Wafer}$ is a distance between the first location point and the second location point on the wafer.

According to the technical solution provided in the embodiment of the present application, a wafer is held, by utilizing an air-bearing chuck, at a predetermined distance D from a top surface of the air-bearing chuck, so that a front surface and a back surface of the wafer are not be contaminated by a conventional clamping tool. A corresponding thickness at any location point on the wafer is measured by utilizing a thickness gauge composed of a laser, a position sensor, and a capacitive sensor. A position of the position sensor may be correlated with a height of the front surface of the wafer, the capacitive sensor may be configured to measure a location of the back surface of the wafer, and the wafer does not need to be in contact with a surface of the air-bearing chuck, so that a measurement result of a wafer thickness is not impacted by a mark (or artifact) on the top surface of the air-bearing chuck during wafer thickness measurement, further improving precision and accuracy of wafer thickness measurement.

Figure 33:
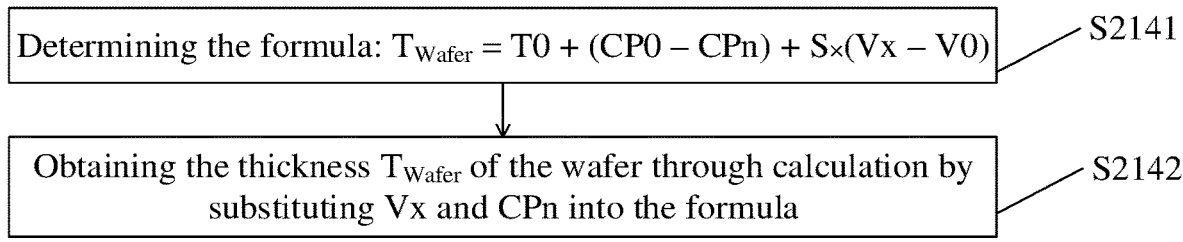
FIG. 33 is a schematic flow diagram of a measuring method of a wafer thickness according to another embodiment of the present application.

FIG. 33 is a schematic flow diagram of a measuring method of a wafer thickness according to another embodiment of the present application. Step S2141 and Step S2142 in the embodiment illustrated in FIG. 33 are an implementation of Step S214 in the embodiment illustrated in FIG. 32.

S2141: Determining the formula: $T_{Wafer}=T0+(CP0-CPn)+S\times(Vx-V0)$. T0 denotes a thickness of a first calibration wafer, CP0 denotes a reference capacitive sensor reading obtained when the first calibration wafer is located at a reference predetermined distance, V0 denotes a reference position sensor reading obtained when the first calibration wafer is located at the reference predetermined distance, and S denotes a slope of a straight line in a relation graph composed of a horizontal coordinate Vx and a vertical coordinate representing a difference hx between CP0 and CPn.

It should be understand that, values of T0, V0, and S may be known values calibrated and stored in a measuring apparatus of a wafer geometry before delivery, or may be values obtained after calibration is performed by utilizing the first calibration wafer during measurement of the measuring apparatus of a wafer geometry, which is not specifically limited in the present application. The reference predetermined distance may be greater than or equal to 0. For example, the reference predetermined distance may be a distance between the first calibration wafer and an air-bearing chuck obtained when the first calibration wafer is adsorbed on a top surface of the air-bearing chuck by utilizing suction force provided by the air-bearing chuck; or may be a distance between the first calibration wafer and an air-bearing chuck obtained when the first calibration wafer is placed directly on a top surface of the air-bearing chuck; or may be a distance between the first calibration wafer and an air-bearing chuck obtained when the first calibration wafer is held at any distance from a top surface of the air-bearing chuck by utilizing the air-bearing chuck. A value of the reference predetermined distance is not specifically limited in the present application.

S2142: Obtaining the thickness $T_{Wafer}$ of the wafer through calculation by substituting Vx and CPn into the formula.

According to the technical solution provided in the embodiment of the present application, a formula $T_{Wafer}=T0+(CP0-CPn)+S\times(Vx-V0)$ is determined, and a thickness of the wafer $T_{Wafer}$ is obtained through calculation by substituting Vx and CPn into the formula. Therefore, the thickness of the wafer is calculated accurately by utilizing the formula, which helps further clarify factors affecting the thickness of the wafer and improving precision of wafer thickness measurement.

Figure 34:
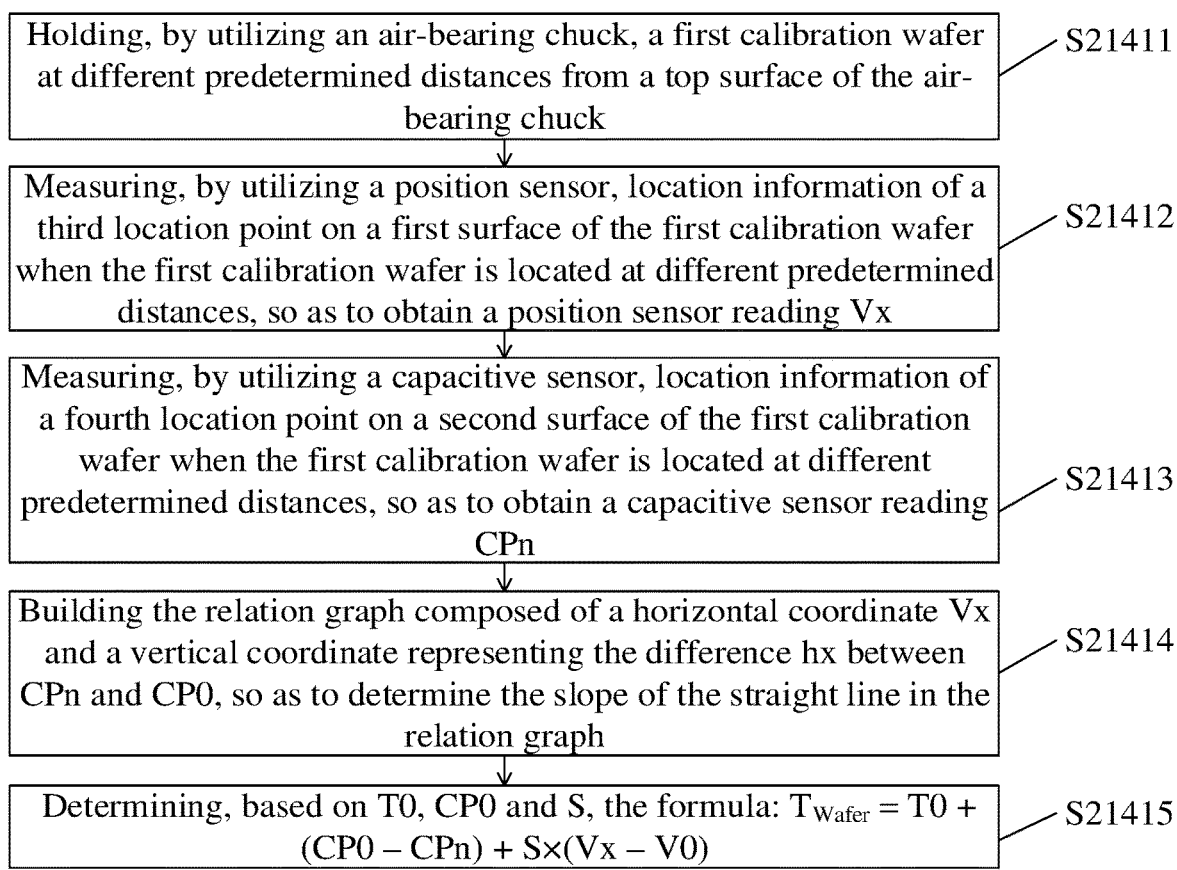
FIG. 34 is a schematic flow diagram of a method for determining a formula for wafer thickness.

FIG. 34 is a schematic flow diagram of a method for determining a formula for wafer thickness. Step S21411 to Step S21415 in the embodiment illustrated in FIG. 34 are an implementation of Step S2141 in the embodiment illustrated in FIG. 33. The method for determining the formula for wafer thickness includes the following steps.

S21411: Holding, by utilizing an air-bearing chuck, a first calibration wafer at different predetermined distances from a top surface of the air-bearing chuck.

S21412: Measuring, by utilizing a position sensor, location information of a third location point on a first surface of the first calibration wafer when the first calibration wafer is located at different predetermined distances, so as to obtain a position sensor reading Vx. The first surface of the first calibration wafer is a surface, away from the air-bearing chuck, of the first calibration wafer.

S21413: Measuring, by utilizing a capacitive sensor, location information of a fourth location point on a second surface of the first calibration wafer when the first calibration wafer is located at different predetermined distances, so as to obtain a capacitive sensor reading CPn. The second surface of the first calibration wafer is a surface, close to the air-bearing chuck, of the first calibration wafer. The fourth location point and the third location point are two opposite location points representing a thickness of the first calibration wafer. The different predetermined distances includes the reference predetermined distance. When the first calibration wafer is located at the reference predetermined distance, the reference capacitive sensor reading and the reference position sensor reading are denoted by CP0 and V0, respectively.

In an embodiment of the present application, the reference predetermined distance may be a distance between the second surface of the first calibration wafer and the top surface of the air-bearing chuck when the first calibration wafer is adsorbed on the air-bearing chuck by utilizing the air-bearing chuck. Alternatively, the reference predetermined distance may be a distance between the second surface of the first calibration wafer and the top surface of the air-bearing chuck when the first calibration wafer is held at any position above the top surface of the air-bearing chuck by utilizing the air-bearing chuck.

S21414: Building the relation graph composed of a horizontal coordinate Vx and a vertical coordinate representing the difference hx between CP0 and CPn, so as to determine the slope of the straight line in the relation graph.

S21415: Determining, based on T0, CP0 and S, the formula: $T_{Wafer}=T0+(CP0-CPn)+S\times(Vx-V0)$.

For details, reference may be made to the descriptions in the embodiments illustrated in FIG. 4 to FIG. 6. Details are not described herein again.

According to the technical solution provided in the embodiment of the present application, a first calibration wafer with a known thickness T0 is utilized, so that a position sensor can be calibrated at any time, avoiding relatively large errors of values of CP0 and V0 due to deviation of a position of a measuring apparatus of a wafer geometry or presence of dust or other contaminants on the measuring apparatus of the wafer geometry, further improving precision and accuracy of wafer thickness measurement.

Figure 35:
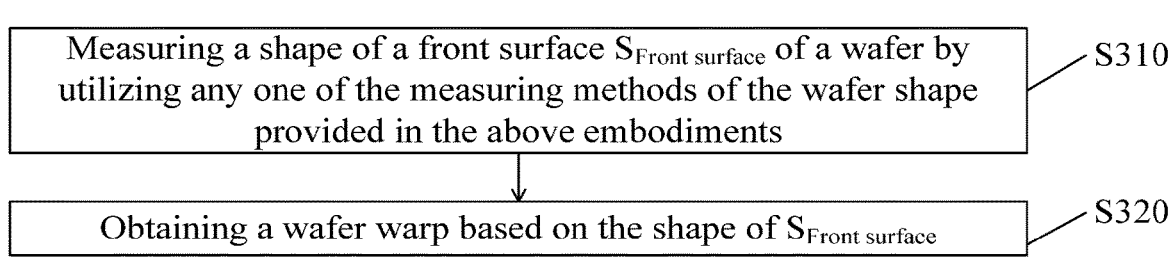
FIG. 35 is a schematic flow diagram of a measuring method of a wafer warp according to an embodiment of the present application.

FIG. 35 is a schematic flow diagram of a measuring method of a wafer warp according to an embodiment of the present application. The measuring method of the wafer warp includes the following steps.

S310: Measuring a shape of a front surface $S_{Front\ surface}$ of a wafer by utilizing any one of the measuring methods of the wafer shape provided in the above embodiments.

It should be understood that, a method for measuring the shape of the front surface $S_{Front\ surface}$ of the wafer may be any one of the measuring methods of the wafer shape provided in the embodiments illustrated in FIG. 23 to FIG. 30, or may be a measuring method of a wafer shape obtained after equivalent replacement or apparent variation based on any one of the measuring methods of the wafer shape described in the above embodiments of the present application, which is not specifically limited in the present application.

S320: Obtaining a wafer warp based on the shape of $S_{Front\ surface}$.

It should be understood that, in Step S320, a processor may generate a 3-D surface chart based on the shape of $S_{Front\ surface}$, and a warp at any position on the front surface of the wafer may be obtained from the 3-D surface chart; alternatively, in Step S320, the processor may determine, based on the shape of $S_{Front\ surface}$, a height variation at positions corresponding to a diameter on the wafer, and the wafer warp may be represented by a height variation at positions corresponding to a diameter on the wafer, or may be represented by one or more of a maximum value, an average value and a variance value of the height variation, which is not specifically limited in the present application. The front surface of the wafer represents one surface of the wafer, which is not specifically limited in the present application.

According to the technical solution provided in the embodiment of the present application, a shape of a front surface $S_{Front\ surface}$ of a wafer is measured by utilizing any one of the measuring methods of the wafer shape provided in the above embodiments, thereby improving precision and accuracy of a measurement result of the wafer shape. In addition, the wafer warp is obtained based on the shape of the front surface $S_{Front\ surface}$ of the wafer, so that accuracy of the wafer warp obtained based on the measurement result of the wafer shape is improved accordingly, provided that the measurement result of the wafer shape is accurate.

Figure 36:
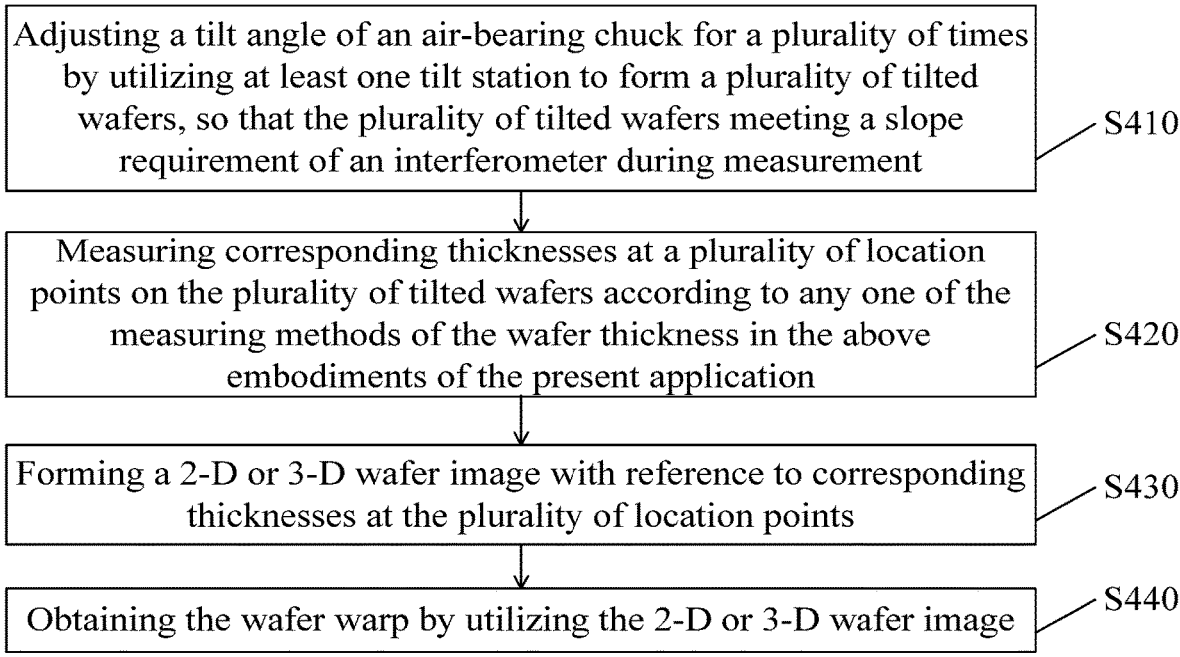
FIG. 36 is a schematic flow diagram of a measuring method of a wafer warp according to another embodiment of the present application.

FIG. 36 is a schematic flow diagram of a measuring method of a wafer warp according to another embodiment of the present application. The measuring method of the wafer warp includes the following steps.

S410: Adjusting a tilt angle of an air-bearing chuck for a plurality of times by utilizing at least one tilt station to form a plurality of tilted wafers, so that the plurality of tilted wafers meeting a slope requirement of an interferometer during measurement. At least one tilt station is located below the air-bearing chuck.

It should be understood that, the tilt station may be a tilt stage, a swing slide table, or the like as long as tilting can be implemented, which is not specifically limited in the present application. A quantity of tilt stations may be one, or two, or even more, which is not specifically limited in the present application. The tilt angle may be 1 degree, 5 degrees, 10 degrees, even 80 degrees, or other degrees, and a value of the tilt angle is not specifically limited in the present application.

S420: Measuring corresponding thicknesses at a plurality of location points on the plurality of tilted wafers according to any one of the measuring methods of the wafer thickness in the above embodiments of the present application.

It should be understood that, a quantity of location points may be 10, or 20, or even more as long as the wafer warp can be reflected with reference to the corresponding thicknesses at the plurality of location points. The quantity of location points is not specifically limited in the present application. The plurality of location points may be located on a same diameter of the wafer, or may be located on different diameters of the wafer, which is not specifically limited in the present application.

S430: Forming a 2-D or 3-D wafer image with reference to corresponding thicknesses at the plurality of location points.

It should be understood that, when the plurality of location points are located on a same diameter of the wafer, a 2-D wafer image corresponding to the diameter may be formed with reference to the corresponding thicknesses at the plurality of location points. When the plurality of location points are located on different diameters of the wafer, a 3-D wafer image corresponding to the different diameters may be formed with reference to the corresponding thicknesses at the plurality of location points as long as the wafer warp can be reflected, which is not specifically limited in the present application.

S440: Obtaining the wafer warp by utilizing the 2-D or 3-D wafer image.

According to the technical solution provided in the embodiment of the present application, a tilt angle of an air-bearing chuck is adjusted for a plurality of times by utilizing at least one tilt station, to form a plurality of tilted wafers, and the plurality of tilted wafers meet a slope requirement of an interferometer during measurement, so that a thickness at any location point on the wafer can be measured, thereby avoiding a case in which a thickness at a location with a relatively large warp on the wafer is not measured because the location is blocked, increasing a measurement range of the wafer warp, and effectively improving precision and accuracy of wafer warp measurement. For a wafer with a relatively large warp, a 2-D tilt stage, for example, a Z-tip-and-tilt stage in the method of the present application, may be configured to overcome limitations to a dynamic range of the interferometer. In addition, the corresponding thicknesses at the plurality of location points on the plurality of tilted wafers are measured according to any one of the measuring methods of the wafer thickness in the above embodiments of the present application; a 2-D or 3-D wafer image is formed with reference to the corresponding thicknesses at the plurality of location points; and the wafer warp is obtained by utilizing the 2-D or 3-D wafer image, so that a measurement result of the wafer thickness is not impacted by contamination of a clamping tool or a mark (or artifact) on a top surface of the air-bearing chuck, thereby improving precision and accuracy of wafer thickness measurement.

Figure 37:
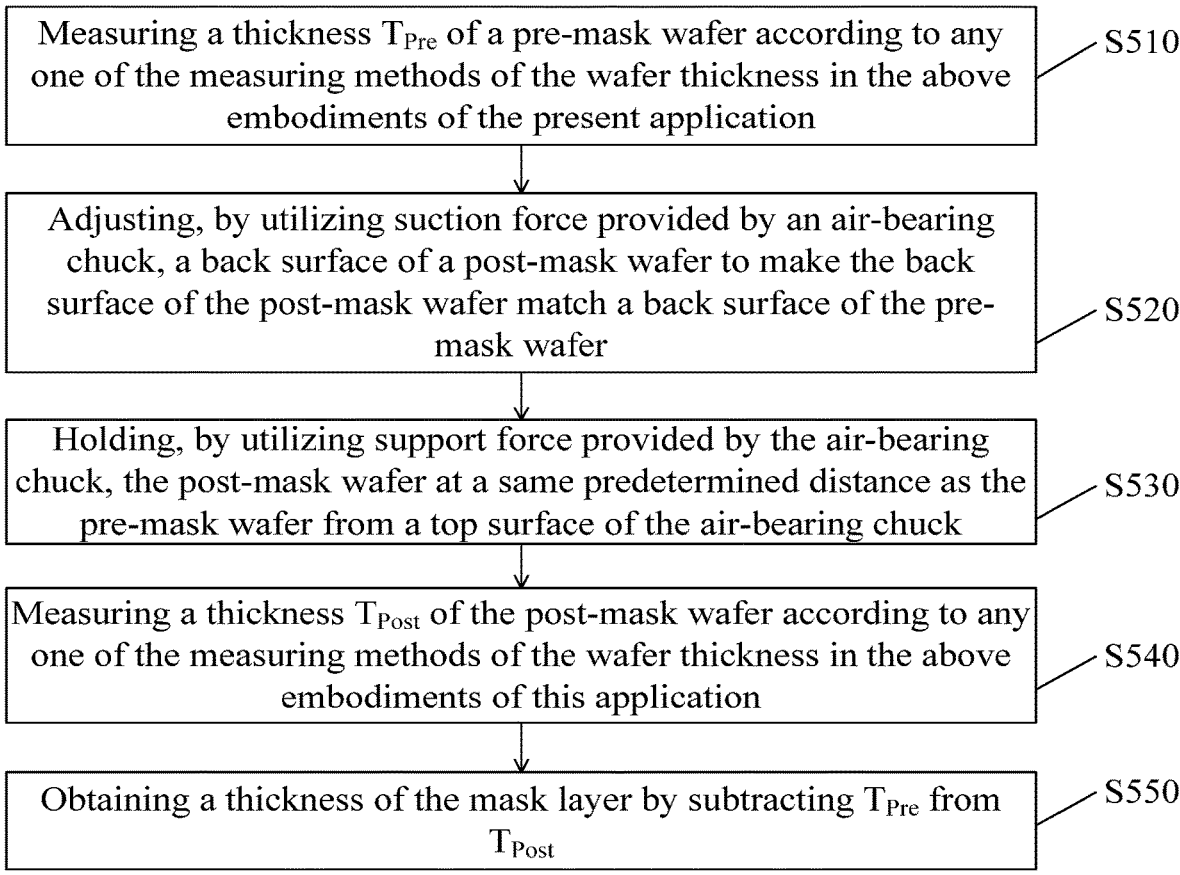
FIG. 37 is a schematic flow diagram of a measuring method of a thickness of a mask layer on a wafer according to an embodiment of the present application.

FIG. 37 is a schematic flow diagram of a measuring method of a thickness of a mask layer on a wafer according to an embodiment of the present application. The measuring method of the thickness of the mask layer on the wafer includes the following steps.

S510: Measuring a thickness $T_{Pre}$ of a pre-mask wafer according to any one of the measuring methods of the wafer thickness in the above embodiments of the present application.

S520: Adjusting, by utilizing suction force provided by an air-bearing chuck, a back surface of a post-mask wafer to make the back surface of the post-mask wafer match a back surface of the pre-mask wafer. The post-mask wafer is a wafer obtained after a mask layer is added to a surface of the pre-mask wafer.

The pre-mask wafer is a wafer before mask deposition. The post-mask wafer is a wafer after the mask deposition.

S530: Holding, by utilizing support force provided by the air-bearing chuck, the post-mask wafer at a same predetermined distance as the pre-mask wafer from a top surface of the air-bearing chuck.

It should be understood that, in the embodiment of the present application, Step S520 may be performed before Step S530, or Step S530 may be performed before Step S520, which is not specifically limited in the present application. Alternatively, in Step S530, the pre-mask wafer may be held at the predetermined distance from the top surface of the air-bearing chuck by utilizing both suction force and support force provided by the air-bearing chuck, which is not specifically limited in the present application.

S540: Measuring a thickness $T_{Post}$ of the post-mask wafer according to any one of the measuring methods of the wafer thickness in the above embodiments of the present application.

S550: Obtaining a thickness of the mask layer by subtracting $T_{Pre}$ from $T_{Post}$.

There are other advantages of using the measuring apparatus of a wafer geometry in the above embodiments. For example, accuracy of thickness measurement of the mask layer applied on the wafer can be improved. In a 3-D flash memory (3D NAND) process, thickness measurement of a highly non-transparent hard mask (or film) does not meet requirements because a conventional optical method cannot be well applied to the non-transparent film. Characteristics of thickness measurement of a wafer may be configured for thickness measurement of a hard mask. For example, two types of thickness measurement are performed: One is thickness measurement on the pre-mask wafer (pre-mask, $T_{pre}$), and the other is thickness measurement on the post-mask wafer ($T_{Post}$).

$$T_{Pre} = T_0 + E\_RTE\_pre$$

$$T_{Post} = T_1 + E\_RTE\_post$$

$T_0$ and $T_1$ denote measured values of thicknesses of the pre-mask wafer and the post-mask wafer, respectively. E_RTE_pre and E_RTE_post denote ray tracing errors (Ray Tracing Erors, RTE) of the pre-mask wafer and the post-mask wafer, respectively.

Therefore, the thickness ΔT of the mask layer can be obtained by utilizing the following formula:

$$\Delta T = T_{Post} - T_{Pre} = (T_1 - T_0) + (E\_RTE\_post - E\_RTE\_pre)$$

The wafer may be sharply warped after a mask is applied. As a result, RTE (namely, E_RTE_post-E_RTE_pre) may apparently affect measurement results of $T_{Pre}$ and $T_{Post}$, causing significant errors during ΔT calculation.

After the mask layer is applied on the surface of the wafer, the wafer may be kept basically flat by utilizing suction force generated by the air-bearing chuck, so that shapes of the pre-mask wafer and the post-mask wafer are basically the same. Therefore, RTE is minimized (that is, E_RTE_post-E_RTE_pre≈0), and accuracy of thickness measurement is improved.

According to the technical solution provided in the embodiment of the present application, a back surface of a pre-mask wafer and a back surface of a post-mask wafer are both forced, by utilizing an air-bearing chuck, to match a top surface of the air-bearing chuck, or warps of the back surfaces of the pre-mask wafer and the post-mask wafer are reduced by utilizing the air-bearing chuck, so that a shape of the back surface of the pre-mask wafer is consistent with a shape of the back surface of the post-mask wafer. Therefore, ray tracing errors are eliminated or minimized when a thickness of a film is obtained by subtracting a thickness of a wafer obtained before the film is deposited from a thickness of the wafer obtained after the film is deposited. When the method is applied to thickness measurement of a non-transparent hard mask layer, ray tracing errors of an interferometer caused by a large warp of the wafer can be eliminated or greatly reduced, thereby improving accuracy of thickness measurement of the mask layer applied on the wafer.

Figure 38:
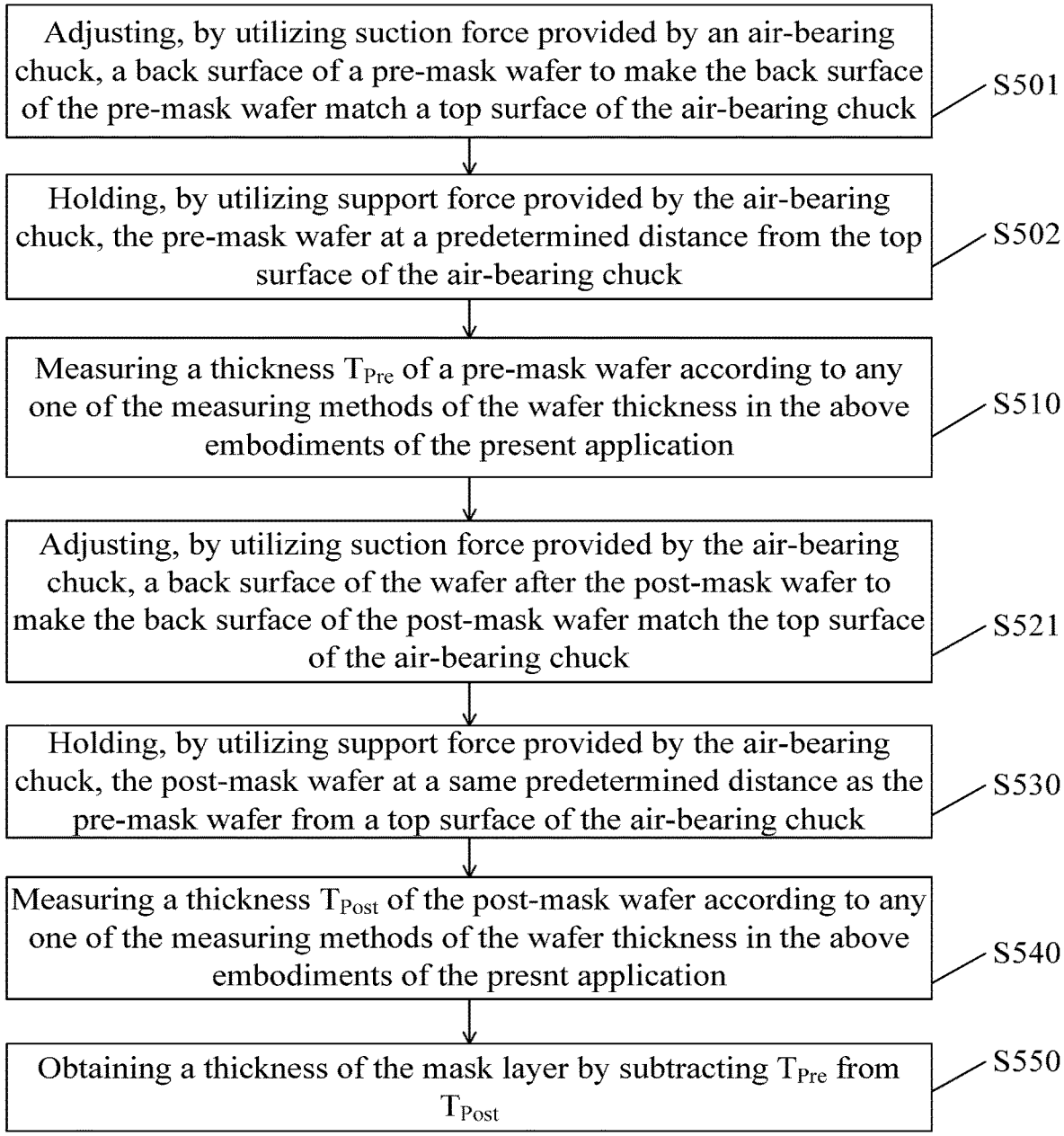
FIG. 38 is a schematic flow diagram of a measuring method of a thickness of a mask layer on a wafer according to another embodiment of the present application.

FIG. 38 is a schematic flow diagram of a measuring method of a thickness of a mask layer on a wafer according to another embodiment of the present application. The embodiment illustrated in FIG. 38 is a modified example of the embodiment illustrated in FIG. 37. A difference between the two embodiments lies in that, in the embodiment illustrated in FIG. 38, Step S501 and Step S502 are further performed before Step S510 in the measuring method of the thickness of the mask layer on the wafer, where Step S521 is corresponding to Step S520 in the embodiment illustrated in FIG. 37.

S501: Adjusting, by utilizing suction force provided by an air-bearing chuck, a back surface of a pre-mask wafer to make the back surface of the pre-mask wafer match a top surface of the air-bearing chuck. The back surface of the pre-mask wafer is a surface, close to the air-bearing chuck, of the pre-mask wafer.

S502: Holding, by utilizing support force provided by the air-bearing chuck, the pre-mask wafer at a predetermined distance from the top surface of the air-bearing chuck.

It should be understood that, in the embodiment of the present application, Step S501 may be performed before Step S502, or Step S501 may be performed before Step S502, which is not specifically limited in the present application. Alternatively, in Step S502, the pre-mask wafer may be held at the predetermined distance from the top surface of the air-bearing chuck by utilizing both suction force and support force provided by the air-bearing chuck, which is not specifically limited in the present application.

S521: Adjusting, by utilizing suction force provided by the air-bearing chuck, a back surface of the post-mask wafer to make the back surface of the post-mask wafer match the top surface of the air-bearing chuck. The post-mask wafer is a wafer obtained after a mask layer is added to a surface of the pre-mask wafer.

According to the technical solution provided in the embodiment of the present application, a back surface of a pre-mask wafer and a back surface of a post-mask wafer are forced, by utilizing an air-bearing chuck, to match a top surface of the air-bearing chuck, and the top surface of the air-bearing chuck is configured as a reference to adjust the pre-mask wafer and the post-mask wafer, so that shapes of the back surfaces of the pre-mask wafer and the post-mask wafer are controlled to be identical, which can greatly reduce ray tracing errors caused by a large warp of the wafer, thereby improving accuracy of thickness measurement of the mask layer applied on the wafer.

Figure 39:
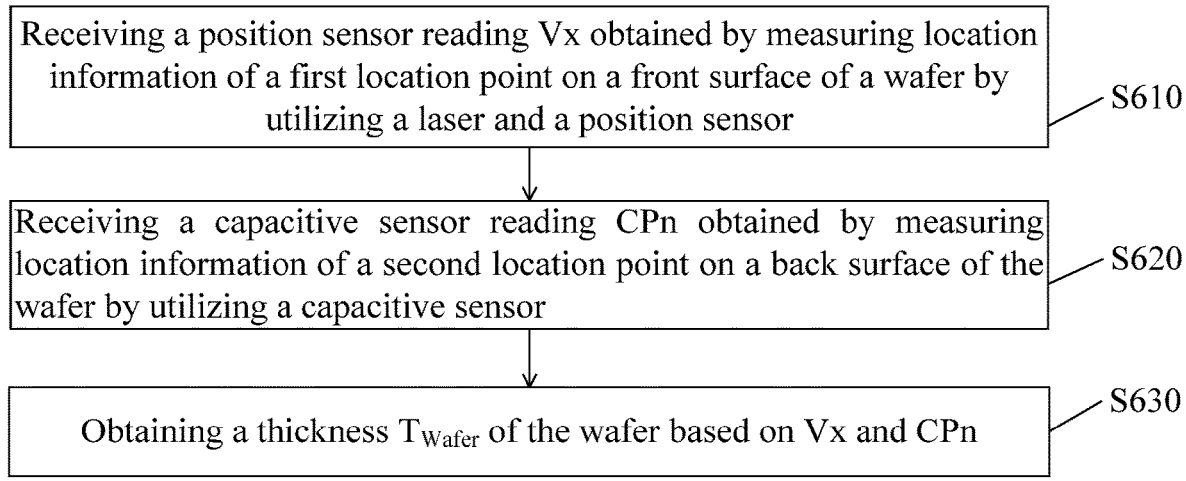
FIG. 39 is a schematic flow diagram of a measuring method of a wafer thickness according to still another embodiment of the present application.

FIG. 39 is a schematic flow diagram of a measuring method of a wafer thickness according to still another embodiment of the present application. An example in which the measuring method of the wafer thickness is performed by a processor is configured for description. As shown in FIG. 39, the measuring method of the wafer thickness includes the following steps.

S610: Receiving a position sensor reading Vx obtained by measuring location information of a first location point on a front surface of a wafer by utilizing a laser and a position sensor. The wafer is placed on a top surface of an air-bearing chuck, and the front surface of the wafer is a surface, away from the air-bearing chuck, of the wafer.

S620: Receiving a capacitive sensor reading CPn obtained by measuring location information of a second location point on a back surface of the wafer by utilizing a capacitive sensor. The first location point and the second location point are two opposite location points representing a thickness of the wafer, and the back surface of the wafer is a surface, close to the air-bearing chuck, of the wafer.

S630: Obtaining a thickness $T_{Wafer}$ of the wafer based on Vx and CPn.

It should be understood that, for a specific method of obtaining the thickness $T_{Wafer}$ of the wafer, refer to description in the above embodiments of the measuring methods of the wafer thickness, and details are not described herein again. A calculation formula of the thickness $T_{Wafer}$ of the wafer may be prestored in a memory, and the processor calls the calculation formula from the memory, so as to obtain the thickness $T_{Wafer}$ of the wafer through calculation.

According to the technical solution provided in the embodiment of the present application, a position sensor reading Vx obtained by measuring location information of a first location point on a front surface of a wafer by utilizing a laser and a position sensor is received; a capacitive sensor reading CPn obtained by measuring location information of a second location point on a back surface of the wafer by utilizing a capacitive sensor is received; and a thickness $T_{Wafer}$ of the wafer is obtained based on Vx and CPn, so as to obtain the thickness of the wafer. In a measurement process, the wafer is held at a predetermined distance from a top surface of an air-bearing chuck, so that a measurement result of a wafer thickness is not impacted by a conventional clamping tool and a mark (or artifact) on the top surface of the air-bearing chuck, which can further improve precision and accuracy of wafer thickness measurement.

Figure 40:
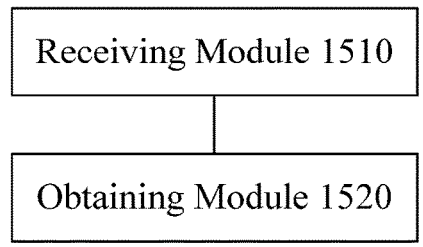
FIG. 40 is a schematic structural diagram of a measuring apparatus of a wafer thickness according to still another embodiment of the present application.

FIG. 40 is a schematic structural diagram of a measuring apparatus of a wafer thickness according to still another embodiment of the present application. As shown in FIG. 40, the measuring apparatus 1500 of the wafer thickness includes a receiving module 1510 and an obtaining module 1520. The receiving module 1510 is configured to receive a position sensor reading Vx obtained by measuring location information of a first location point on a front surface of a wafer by utilizing a laser and a position sensor, and receive a capacitive sensor reading CPn obtained by measuring location information of a second location point on a back surface of the wafer by utilizing a capacitive sensor. The obtaining module 1520 is configured to obtain a thickness $T_{Wafer}$ of the wafer based on Vx and CPn. The wafer is held at a predetermined distance from a top surface of an air-bearing chuck, and the front surface of the wafer is a surface, away from the air-bearing chuck, of the wafer, and the first location point and the second location point are two opposite location points representing a thickness of the wafer, and the back surface of the wafer is a surface, close to the air-bearing chuck, of the wafer.

It should be understood that, the receiving module 1510 is communicatively connected to the position sensor and the capacitive sensor, so that the position sensor reading Vx and the capacitive sensor reading CPn can be received.

According to the technical solution provided in the embodiment of the present application, a position sensor reading Vx and a capacitive sensor reading CPn are received by utilizing a receiving module, and a thickness $T_{Wafer}$ of a wafer is obtained by utilizing an obtaining module based on Vx and CPn, so that the thickness of the wafer is obtained through measurement. In a measurement process, the wafer is held at a predetermined distance from a top surface of an air-bearing chuck, so that a measurement result of a wafer thickness is not impacted by a conventional clamping tool and a mark (or artifact) on the top surface of the air-bearing chuck, which can further improve precision and accuracy of wafer thickness measurement.

Figure 41:
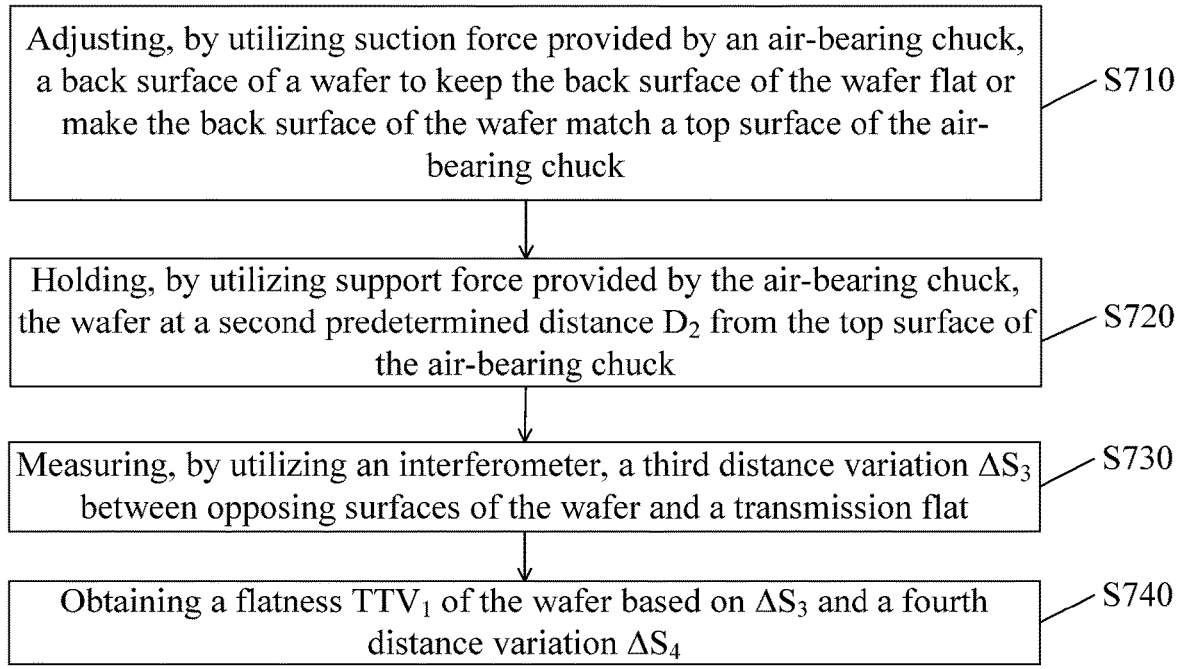
FIG. 41 is a schematic flow diagram of a measuring method of a wafer flatness according to an embodiment of the present application.

FIG. 41 is a schematic flow diagram of a measuring method of a wafer flatness according to an embodiment of the present application. Wafer flatness is also referred to as total thickness variation (Total Thickness Variation, TTV). In the measuring method of the wafer flatness, a wafer geometry tool may be configured for measurement as long as the measuring method of the wafer flatness in the present application can be implemented. A structure of the wafer geometry tool is not specifically limited in the present application. The measuring method of the wafer flatness includes the following steps.

S710: Adjusting, by utilizing suction force provided by an air-bearing chuck, a back surface of a wafer to keep the back surface of the wafer flat or make the back surface of the wafer match a top surface of the air-bearing chuck. The back surface $S_{Back\ surface}$ of the wafer is a surface, close to the air-bearing chuck, of the wafer.

It should be understood that, the back surface of the wafer does not refer to a specific surface of the wafer as long as the back surface is a surface, close to the air-bearing chuck, of the wafer. The back surface of the wafer may also be referred to as a bottom surface of the wafer, which is not specifically limited in the present application. That the back surface of the wafer match the top surface of the air-bearing chuck may refer to that the back surface of the wafer can completely fit the top surface of the air-bearing chuck, or may refer to that a shape of the back surface of the wafer is almost identical to a shape of the top surface of the air-bearing chuck.

S720: Holding, by utilizing support force provided by the air-bearing chuck, the wafer at a second predetermined distance $D_2$ from the top surface of the air-bearing chuck.

It should be understood that, in the measuring method of the wafer flatness, Step S710 may be performed before Step S720, or Step S720 may be performed before Step S710, which is not specifically limited in the present application. A value of the second predetermined distance $D_2$ may be 1 µm, 5 µm, 22 µm, 64 µm, or the like, as long as the back surface of the wafer is kept flat or the back surface of the wafer is made match the top surface of the air-bearing chuck within the second predetermined distance $D_2$, which is not specifically limited in the present application.

In an embodiment of the present application, the second predetermined distance $D_2$ ranges from 0 µm to 5 µm.

It should be understood that, the second predetermined distance $D_2$ may be 0 µm, 5 µm, 10 µm, 20 µm, 30 µm, 50 µm, or the like, which is not specifically limited in the present application. The back surface of the wafer may be or may not be in contact with the top surface of the air-bearing chuck, which is not specifically limited in the present application.

In the embodiment of the present application, the second predetermined distance is set to range from 0 µm to 50 µm, which helps keep, when the wafer is supported by the air-bearing chuck, the back surface of the wafer almost as flat as a surface of the chuck under the action of the suction force, further facilitates application of a calibrated surface shape of the air-bearing chuck to wafer flatness measurement, and helps keep the back surface of the wafer flat or make the back surface of the wafer match the top surface of the air-bearing chuck within the second predetermined distance.

In an embodiment of the present application, the second predetermined distance $D_2$ ranges from 5 µm to 30 µm.

It should be understood that the second predetermined distance $D_2$ may be 5 µm, 8 µm, 12 µm, 15 µm, 30 µm, or the like, which is not specifically limited in the present application.

In the embodiment of the present application, the second predetermined distance $D_2$ is set to range from 5 µm to 30 µm, so that the back surface of the wafer is kept flat or the back surface of the wafer is made match the top surface of the air-bearing chuck within the second predetermined distance $D_2$, and an impact of the predetermined distance $D_2$ on a measurement result of the wafer flatness can be negligible.

S730: Measuring, by utilizing an interferometer, a third distance variation $\Delta S_3$ between opposing surfaces of the wafer and a transmission flat. The interferometer is located on one side, away from the air-bearing chuck, of the transmission flat, the top surface of the air-bearing chuck and a front surface of the wafer are configured to reflect light, and the front surface of the wafer is a surface, away from the air-bearing chuck, of the wafer.

It should be understood that, the front surface of the wafer does not refer to a specific surface of the wafer as long as the front surface is a surface, away from the air-bearing chuck, of the wafer. The front surface of the wafer may also be referred to as a top surface of the wafer, which is not specifically limited in the present application.

S740: Obtaining a flatness $TTV_1$ of the wafer based on $\Delta S_3$ and a fourth distance variation $\Delta S_4$. $\Delta S_4$ denotes a second distance variation, measured by utilizing the interferometer when the wafer is not loaded, between opposing surfaces of the air-bearing chuck and the transmission flat.

It should be understood that, the step of measuring $\Delta S_4$ may be performed before the step of measuring $\Delta S_3$, or may be performed after the step of measuring $\Delta S_3$, which is not specifically limited in the present application. A value of $\Delta S_4$ may be measured in real time, or may be prestored in a wafer geometry tool. The value of $\Delta S_4$ may be configured once or more times during wafer flatness measurement, which is not specifically limited in the present application.

For example, FIG. 42a and FIG. 42b are schematic structural diagrams corresponding to a measuring method of a wafer flatness according to an embodiment of the present application. Referring to FIG. 42a, first, optical cavity formed by a transmission flat TF 126 and a reflective air-bearing chuck 110 is measured. In other words, the optical cavity may be a fourth distance variation $\Delta S_4$ between opposing surfaces of the transmission flat TF 126 and the air-bearing chuck 110. The TF 126 may sag in the middle due to gravity. A surface of the air-bearing chuck 110 may not be completely flat, as illustrated in FIG. 42a and FIG. 42b. These imperfections may be calibrated to make wafer flatness measurement accurate. Cavity calibration is to measure a cavity thickness variation. In other words, the cavity thickness variation may also be the fourth distance variation $\Delta S_4$ between the opposing surfaces of the transmission flat TF 126 and the air-bearing chuck 110. Mathematically, the fourth distance variation $\Delta S_4$ is a difference between a transmission flat surface $S_{TF}$ (x, y) and a chuck surface $S_{CK}$ (x, y): $\Delta S_4 = S_{TF} - S_{CK}$. In this step, the wafer is not on the chuck.

Referring to FIG. 42b, after calibration, a wafer 1 is placed on the surface of the air-bearing chuck 110. To measure a flatness of the wafer 1, the wafer 1 is kept floating up on the top of the air-bearing chuck 110 at a small air gap (e.g., 0 µm to 50 µm; or for another example, 5 µm to 30 µm) generated by the air-bearing chuck 110. At these small air gaps, the air-bearing chuck 110 is designed to have great suction force, to keep a back surface $S_{Back\ surface}$ of the wafer 1 flat or make the back surface of the wafer 1 match the top surface $S_{CK}$ of the air-bearing chuck 110. In this case, location information of a front surface $S_{Front\ surface}$ of the wafer 1 is a sum of location information of the top surface $S_{CK}$ of the air-bearing chuck 110 and a total thickness variation TTV of the wafer 1, that is, $S_{Front\ surface} = S_{CK} + TTV$. $S_{Front\ surface}$ is a surface, away from the air-bearing chuck 110, of the wafer 1, or may also be referred to as a top surface of the wafer 1. During measurement by utilizing an interferometer, a third distance variation between opposing surfaces of the wafer 1 and the transmission flat 126 (or a distance between the wafer 1 and the transmission flat 126) may be measured: $\Delta S_3 = (S_{TF} - S_{Front\ surface})$. Next, a flatness $TTV_1$ of the wafer 1 can be calculated by measuring a difference ($\Delta S_4 - \Delta S_3$) between the cavity and a surface of the wafer 1, that is, $TTV_1 = \Delta S_2 - \Delta S_1$.

According to the technical solution provided in the embodiment of the present application, in Step S710, a back surface of a wafer is adjusted by utilizing suction force provided by an air-bearing chuck, so as to keep the back surface of the wafer flat or make the back surface of the wafer match a top surface of the air-bearing chuck, which can effectively reduce ray tracing errors of an interferometer. In Step S720, the wafer is held at a second predetermined distance from the top surface of the air-bearing chuck by utilizing support force provided by the air-bearing chuck, which helps reduce errors caused by a mark (or artifact) on the top surface of the air-bearing chuck during wafer flatness measurement. In Step S730 to Step S740, a third distance variation $\Delta S_3$ between the opposing surfaces of the wafer and a transmission flat is measured by utilizing the interferometer, and a flatness $TTV_1$ of the wafer is obtained based on $\Delta S_3$ and a fourth distance variation $\Delta S_4$, so as to obtain the wafer flatness, and make a measurement result of the wafer flatness more accurate.

FIG. 43 is a schematic flow diagram of a measuring method of a wafer flatness according to another embodiment of the present application. The embodiment illustrated in FIG. 43 is a modified example of the embodiment illustrated in FIG. 41. A difference between the two embodiments lies in that, in the embodiment illustrated in FIG. 43, Step S735 is further included before Step S740, and Step S7401 is corresponding to Step S740 in the embodiment illustrated in FIG. 41.

S735: Obtaining a nonconforming item $S_{N.C.}$ between the back surface $S_{Back\ surface}$ of the wafer and the top surface $S_{CK}$ of the air-bearing chuck.

It should be understood that, the back surface $S_{Back\ surface}$ of the wafer usually does not completely match a top surface $S_{CK}$ of the air-bearing chuck. To accurately determine location information of the front surface of the wafer, the nonconforming item ($S_{N.C.}$) may be added, and the front surface $S_{Front\ surface}$ of the wafer is: $S_{Front\ surface} = (S_{CK} + TTV_1 + S_{N.C.})$, so that the location information of the front surface $S_{Front\ surface}$ of the wafer can be accurately determined. $S_{N.C.}$ may be obtained through calibration of a calibration wafer with a known TTV, or may be obtained through calibration based on one or more of a wafer thickness, a wafer temperature, and a floating height FH of the wafer as well as a flatness of the chuck, which is not specifically limited in the present application. Each $S_{N.C.}$ may be applied to one measurement process of the wafer flatness, or may be applied to a plurality of measurement processes of the wafer flatness, which is not specifically limited in the present application.

S7401: Obtaining a flatness $TTV_1$ of the wafer by subtracting $\Delta S_3$ and $S_{N.C.}$ from $\Delta S_4$.

For example, during measurement by utilizing an interferometer, a distance between the wafer 1 and the transmission flat 126 may be measured, or a third distance variation between opposing surfaces of the wafer 1 and the transmission flat 126 may be measured: $\Delta S_3 = (S_{TF} - S_{Front\ surface}) = (S_{TF} - S_{CK} - TTV_1 - S_{N.C.})$. Next, $TTV_1$ can be calculated by measuring a difference ($\Delta S_4 - \Delta S_3$) between the cavity and a surface of the wafer. Subsequently, the wafer flatness can be calculated by using the following formula: $TTV_1 = (\Delta S_4 - \Delta S_3 - S_{N.C.})$. $\Delta S_4$ and $\Delta S_3$ may be measured by utilizing the interferometer in the wafer geometry tool.

According to the technical solution provided in the embodiment of the present application, a nonconforming item $S_{N.C.}$ between a back surface $S_{Back\ surface}$ of a wafer and a top surface $S_{CK}$ of an air-bearing chuck is obtained, and a flatness $TTV_1$ of the wafer is obtained by subtracting $\Delta S_3$ and $S_{N.C.}$ from $\Delta S_4$, so that a case in which the back surface $S_{Back\ surface}$ of the wafer may not completely match the top surface $S_{CK}$ of the air-bearing chuck is fully taken into consideration, which further makes a measurement result of the wafer flatness more accurate.

In an embodiment of the present application, the measuring method of the wafer flatness may alternatively include correction on the nonconforming item $S_{N.C.}$ by utilizing a temperature and a floating height FH.

It should be understood that, $S_{N.C.}$ may drift over time, and may be calibrated from time to time to be further accurately determined. $S_{N.C.}$ may be a function of a temperature and a floating height FH, or may be a function of a wafer thickness and a chuck flatness. All these parameters can be measured simultaneously with interferometer data, and can be configured also for correction.

In the embodiment of the present application, the nonconforming item is corrected by utilizing a temperature and a floating height, so that an impact of different temperatures and different floating heights on the nonconforming item is fully taken into consideration, which makes the nonconforming item more accurate, and makes a measurement result of the wafer flatness more accurate.

Figure 44:
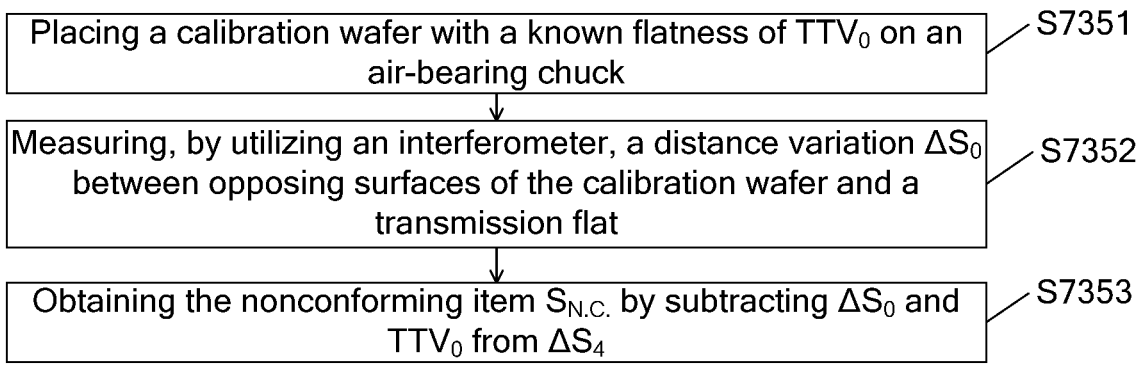
FIG. 44 is a schematic flow diagram of a method for obtaining a nonconforming item between a back surface of a wafer and a top surface of an air-bearing chuck according to an embodiment of the present application.

FIG. 44 is a schematic flow diagram of a method for obtaining a nonconforming item between a back surface of a wafer and a top surface of an air-bearing chuck according to an embodiment of the present application. Step S7351 to Step S7353 in the embodiment illustrated in FIG. 44 are corresponding to Step S735 in the embodiment illustrated in FIG. 43.

S7351: Placing a calibration wafer with a known flatness of $TTV_0$ on an air-bearing chuck.

In an embodiment of the present application, the above Step S7351 includes: laying the calibration wafer with a known flatness of $TTV_0$ on the air-bearing chuck; or keeping, by utilizing support force provided by the air-bearing chuck, the calibration wafer with a known flatness of $TTV_0$ floating up on the air-bearing chuck.

It should be understood that, in Step S7351, the calibration wafer may be directly laid on the air-bearing chuck, or may be made, by utilizing suction force provided by the air-bearing chuck, adsorbed on the air-bearing chuck when it is ensured that a wafer flatness of the calibration wafer is kept unchanged, or may be held, by utilizing support force provided by the air-bearing chuck, the calibration wafer at a small air gap above the air-bearing chuck, which is not specifically limited in the present application. The calibration wafer may be a double-side polished wafer, or may be a single-side polished wafer, which is not specifically limited in the present application. A distance at which the calibration wafer is held from the air-bearing chuck may be the same as or different from a distance at which a wafer to be measured is held from the air-bearing chuck, which is not specifically limited in the present application.

S7352: Measuring, by utilizing an interferometer, a distance variation $\Delta S_0$ between opposing surfaces of the calibration wafer and a transmission flat.

S7353: Obtaining the nonconforming item $S_{N.C.}$ by subtracting $\Delta S_0$ and $TTV_0$ from $\Delta S_4$. That is, $S_{N.C.} = (\Delta S_4 - \Delta S_0 - TTV_0)$.

According to the technical solution provided in the present application, a calibration wafer with a known flatness of $TTV_0$ is placed on an air-bearing chuck, a distance variation $\Delta S_0$ between opposing surfaces of the calibration wafer and a transmission flat is measured by utilizing an interferometer, and a nonconforming item $S_{N.C.}$ is obtained by subtracting $\Delta S_0$ and $TTV_0$ from $\Delta S_4$, so as to obtain $S_{N.C.}$ by utilizing the calibration wafer, and further make wafer flatness measurement accurate by calibrating, by utilizing $S_{N.C.}$, imperfections such as that the TF may sag in the middle due to gravity and the surface of the air-bearing chuck may not be completely flat.

Figure 45:
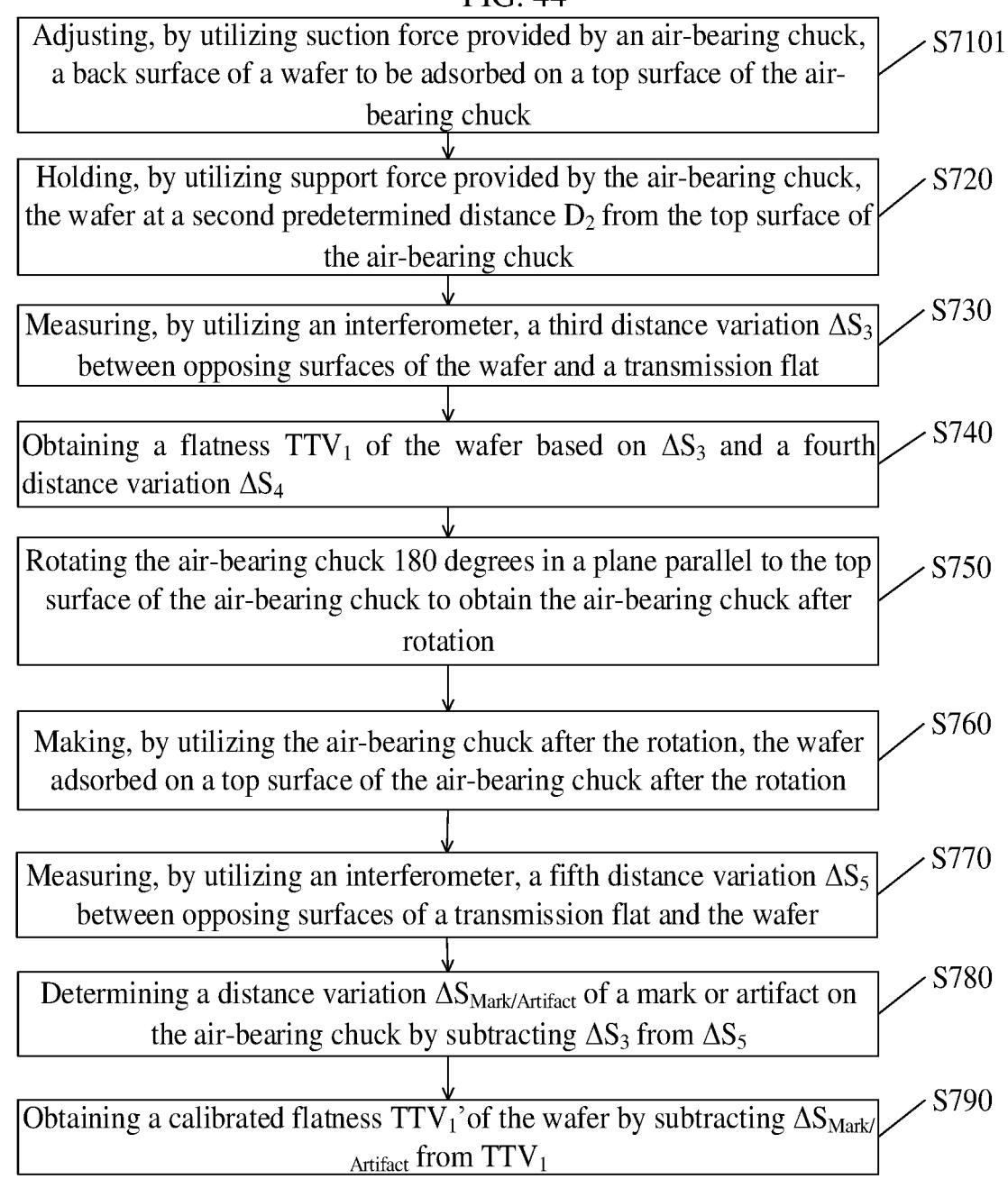
FIG. 45 is a schematic flow diagram of a measuring method of a wafer flatness according to still another embodiment of the present application.

FIG. 45 is a schematic flow diagram of a measuring method of a wafer flatness according to still another embodiment of the present application. The embodiment illustrated in FIG. 45 is a modified example of the embodiment illustrated in FIG. 41. A difference between the two embodiments lies in that, in the embodiment illustrated in FIG. 45, Step S7101 in the embodiment illustrated in FIG. 45 is corresponding to Step S710 in the embodiment illustrated in FIG. 41. In addition, the measuring method of the wafer flatness may further include Step S750 to Step S790.

S7101: Adjusting, by utilizing suction force provided by an air-bearing chuck, a back surface of a wafer to be adsorbed on a top surface of the air-bearing chuck.

S750: Rotating the air-bearing chuck 180 degrees in a plane parallel to the top surface of the air-bearing chuck to obtain the air-bearing chuck after rotation.

S760: Making, by utilizing the air-bearing chuck after the rotation, the wafer adsorbed on a top surface of the air-bearing chuck after the rotation.

S770: Measuring, by utilizing an interferometer, a fifth distance variation $\Delta S_5$ between opposing surfaces of a transmission flat and the wafer.

S780: Determining a distance variation $\Delta S_{Mark/Artifact}$ of a mark/artifact on the air-bearing chuck by subtracting $\Delta S_3$ from $\Delta S_5$.

S790: Obtaining a calibrated flatness $TV_{1'}$ of the wafer by subtracting $\Delta S_{Mark/Artifact}$ from $TTV_1$.

Figure 46:
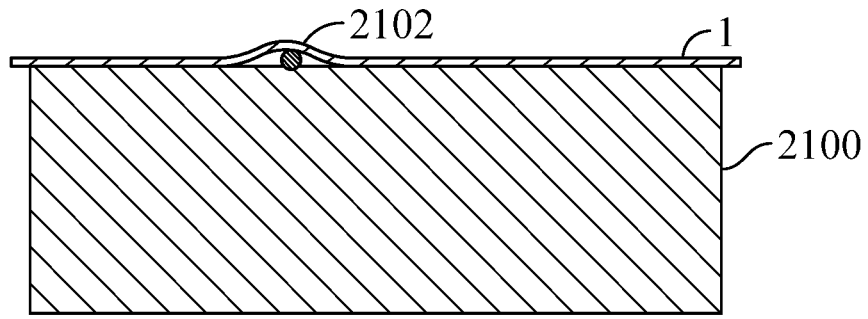
FIG. 46 is a schematic diagram of a chuck mark or artifact when a wafer is vacuum down on a vacuum chuck.
Figure 47:
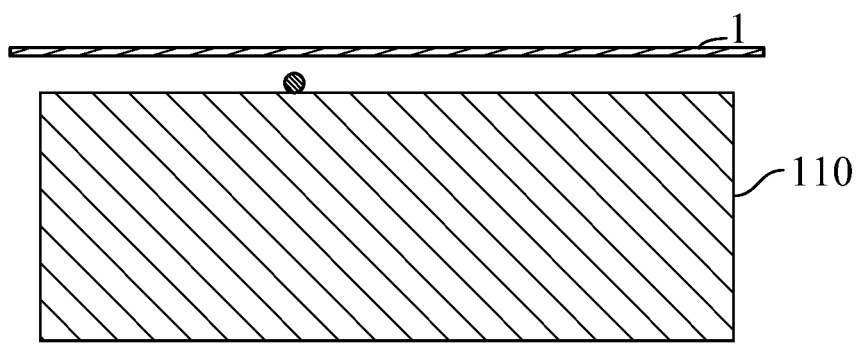
FIG. 47 is a schematic diagram of a wafer floating up on an air-bearing chuck.

For example, the measuring method of the wafer flatness and the measuring method of the wafer shape have many challenges. A chuck such as an air-bearing chuck or a vacuum chuck itself may not be flat and there may be artifacts, such as particles, on a top surface of the chuck. When a wafer is vacuumed on the chuck, the artifacts may show up on a top surface of the wafer. For example, FIG. 46 is a schematic diagram of a chuck mark/artifact when a wafer is vacuum down on a vacuum chuck. A large particle 2102 may appear as a bulge on a wafer 1 on a top side of a vacuum chuck 2100, as illustrated in FIG. 46. According to another embodiment of the present application, these types of artifacts may be calibrated by utilizing a method disclosed in the present application. FIG. 47 is a schematic diagram of a wafer 1 floating up on an air-bearing chuck 110, where no chuck marks and artifacts are found on the wafer 1.

Figure 48A:
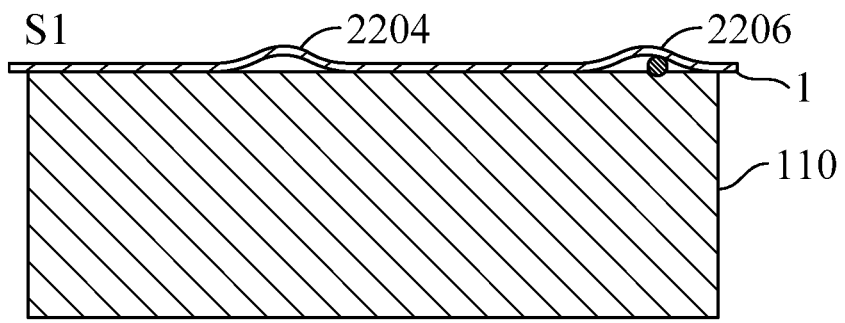
FIG. 48a to FIG. 48c are schematic diagrams of a method for differentiating between real wafer surface features and chuck marks (or artifacts) according to an embodiment of the present application.
Figure 48B:
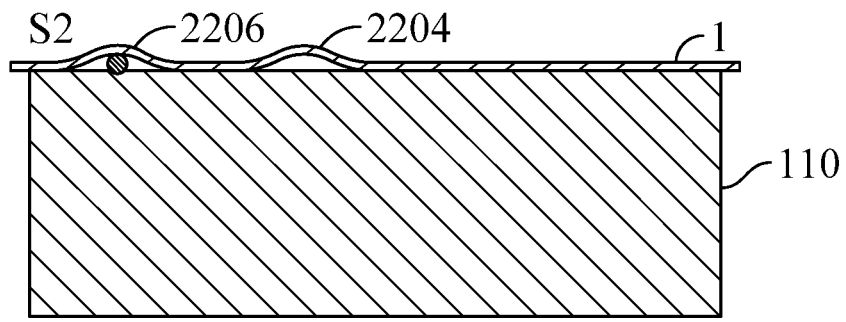
Figures 48C, 49:
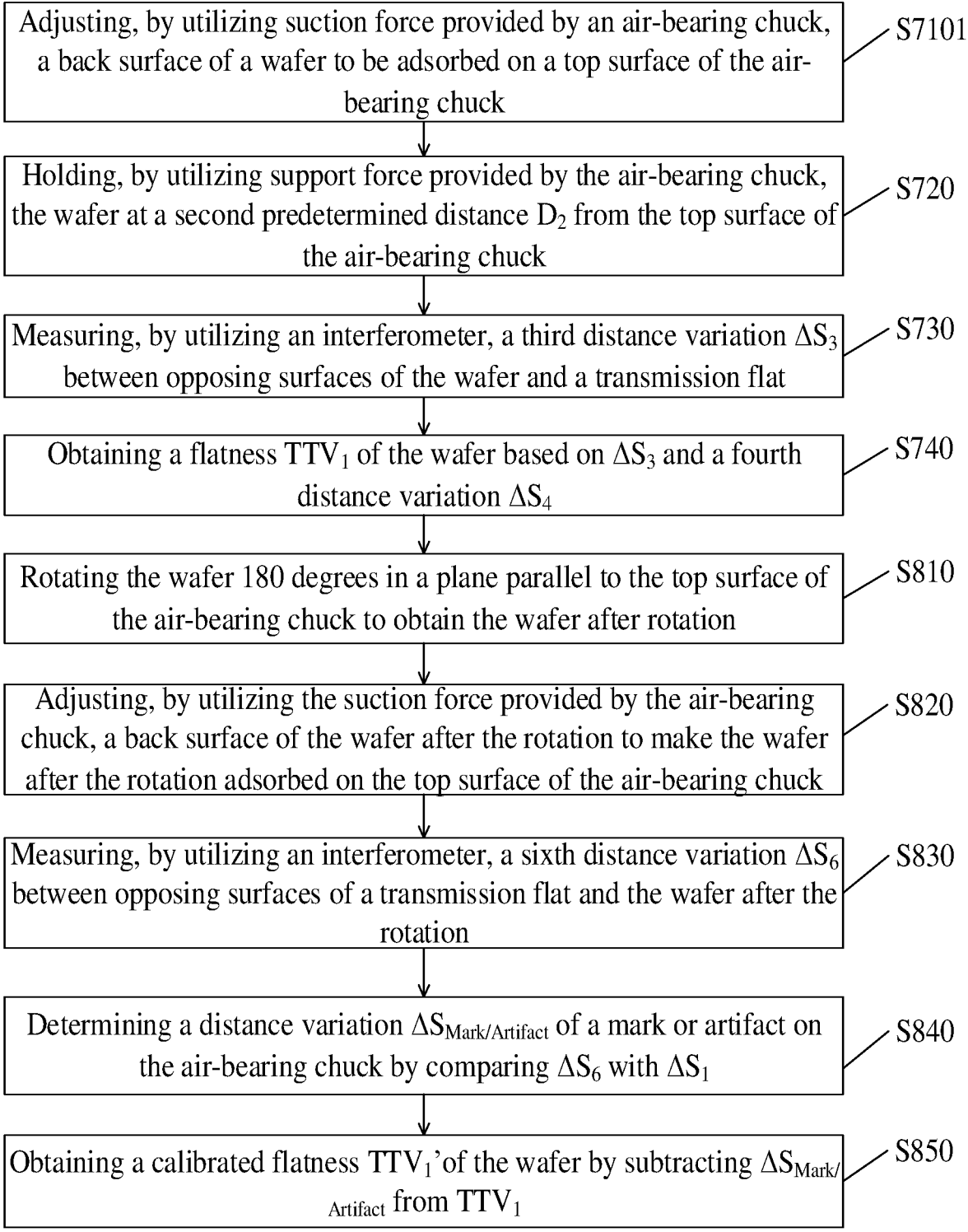
FIG. 49 is a schematic flow diagram of a measuring method of a wafer flatness according to still another embodiment of the present application.

FIG. 48a to FIG. 48c are schematic diagrams of a method for differentiating between real wafer surface features and chuck marks (or artifacts). FIG. 48a is a schematic diagram of wafer geometry measurement on a surface S1, where real features 2204 are mixed with chuck marks (or artifacts) 2206 during measurement of the interferometer. FIG. 48b is a schematic diagram of wafer geometry measurement on a surface S2, where the surface S2 is a chuck surface obtained by rotating a chuck, for example, an air-bearing chuck 110, 180 degrees from an original location where the measurement on the surface S1 is performed. When the chuck marks (or artifacts) 2206 rotate 180 degrees with the air-bearing chuck 110, the real features 2204 remain in the same location while a location of the chuck marks (or artifacts) 2206 is off by 180 degrees in a wafer coordinate system. Thus, a wafer 1 is placed on the chuck surface S2 (as shown in FIG. 48b) obtained after the rotation by 180 degrees, and a measurement result obtained when the wafer 1 is located on the surface S2 obtained by the rotation by 180 degrees is compared with a measurement result obtained when the wafer 1 is located on the surface S1 of 0 degrees (as shown in FIG. 48a), so that real wafer features 2204 (those remain in the same location in the wafer coordinate system before and after the rotation) may be identified.

FIG. 48c provides a S1 and S2 difference map showing a pair of chuck artifacts 2216 and 2220. These chuck artifacts can be calibrated if they do not move around on the chuck. These chuck artifacts also have specific features that allow them to be removed by using an algorithm if the chuck is clean and the chuck artifacts are isolated. When there are limited artifacts on one or more of the top surface of the chuck and the back surface of the wafer, a wafer or chuck rotation method may be configured to identify these artifacts and remove them.

According to the technical solution provided in the present application, a wafer is made adsorbed on a top surface of an air-bearing chuck at 0 degrees and the top surface obtained after the air-bearing chuck is rotated 180 degrees. Real wafer features remain in the same location before and after the top surface of the air-bearing chuck is rotated, and marks (or artifacts) on the top surface of the air-bearing chuck rotate with the rotation of the air-bearing chuck. Therefore, a distance variation $\Delta S_{Mark/Artifact}$ of a mark/artifact on the air-bearing chuck can be determined by subtracting $\Delta S_3$ from $\Delta S_5$, so that an impact of the mark (or artifact), generated when the back surface of the wafer is made adsorbed on the top surface of the air-bearing chuck by utilizing suction force provided by the air-bearing chuck, on the top surface of the air-bearing chuck on wafer flatness measurement is fully taken into consideration, which further makes a wafer flatness obtained by using the measuring method more accurate.

FIG. 49 is a schematic flow diagram of a measuring method of a wafer flatness according to still another embodiment of the present application. The embodiment illustrated in FIG. 49 is a modified example of the embodiment illustrated in FIG. 41. A difference between the two embodiments lies in that, in the embodiment illustrated in FIG. 49, Step S7101 in the embodiment illustrated in FIG. 49 is corresponding to Step S710 in the embodiment illustrated in FIG. 41. In addition, the measuring method of the wafer flatness may further include Step S810 to Step S850.

S7101: Adjusting, by utilizing suction force provided by an air-bearing chuck, a back surface of a wafer to be adsorbed on a top surface of the air-bearing chuck.

S810: Rotating the wafer 180 degrees in a plane parallel to the top surface of the air-bearing chuck to obtain the wafer after rotation.

S820: Adjusting, by utilizing the suction force provided by the air-bearing chuck, a back surface of the wafer after the rotation to make the wafer after the rotation adsorbed on the top surface of the air-bearing chuck.

S830: Measuring, by utilizing an interferometer, a sixth distance variation $\Delta S_6$ between opposing surfaces of a transmission flat and the wafer after the rotation.

S840: Determining a distance variation $\Delta S_{Mark/Artifact}$ of a mark (or artifact) on the air-bearing chuck by comparing $\Delta S_6$ with $\Delta S_1$.

Figure 50A:
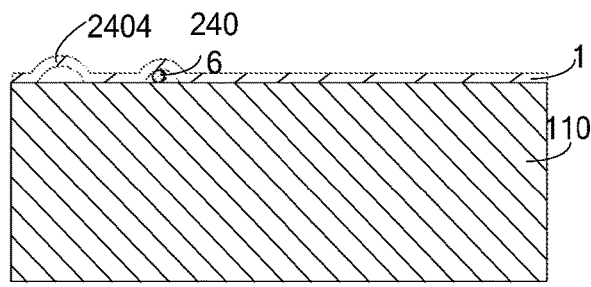
FIG. 50a is a schematic diagram of measuring a geometry of a wafer when the wafer is adsorbed on a top surface of an air-bearing chuck before the wafer is rotated.
Figure 50B:
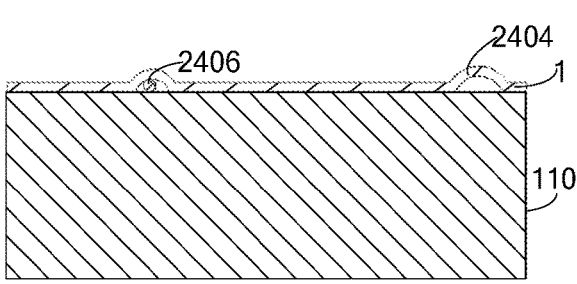
FIG. 50b is a schematic diagram of measuring a geometry of a wafer when the wafer is adsorbed on a top surface of an air-bearing chuck after the wafer is rotated 180 degrees.

For example, FIG. 50a is a schematic diagram of measuring a geometry of a wafer when the wafer is adsorbed on a top surface of an air-bearing chuck before the wafer is rotated. The air-bearing chuck 110 may be an air-bearing chuck in any one of above embodiments. Real features 2404 are mixed with chuck marks (or artifacts) 2406 during measurement of the interferometer. FIG. 50b is a schematic diagram of measuring a geometry of a wafer when the wafer is adsorbed on a top surface of an air-bearing chuck after the wafer is rotated 180 degrees. The geometry of the wafer may include a wafer shape, a wafer flatness, or the like. It can be learned from FIG. 50a and FIG. 50b, when a wafer 1 is rotated 180 degrees, a location of chuck marks (or artifacts) 2406 is off by 180 degrees in a wafer coordinate system, but remains in the same location in a chuck coordinate system. Therefore, a distance variation $\Delta S_{Mark/Artifact}$ of a mark (or artifact) on the air-bearing chuck can be determined by comparing $\Delta S_6$ with $\Delta S_3$.

S850: obtaining a calibrated flatness $TTV_{1'}$ of the wafer by subtracting $\Delta S_{Mark/Artifact}$ from $TTV_1$.

According to the technical solutions provided in the present application, a wafer at 0 degrees or rotated 180 degrees is adsorbed on a top surface of an air-bearing chuck, a distance variation $\Delta S_3$ between opposing surfaces of a transmission flat and the wafer at 0 degrees is measured, and a distance variation $\Delta S_6$ between opposing surfaces of the transmission flat and the wafer rotated 180 degrees is measured. Because a mark (or artifact) on the air-bearing chuck remains in the same location before and after the rotation of the wafer, and real wafer features rotate with the rotation of the wafer, a distance variation $\Delta S_{Mark/Artifact}$ of the mark (or artifact) on the air-bearing chuck can be determined by comparing $\Delta S_6$ with $\Delta S_3$. According to the embodiment of the present application, an impact, when the back surface of the wafer is made adsorbed on the top surface of the air-bearing chuck by utilizing suction force provided by the air-bearing chuck, of the mark (or artifact) on the top surface of the air-bearing chuck on wafer flatness measurement is fully taken into consideration, which further makes a wafer flatness measured by using the measuring method more accurate.

Figure 51:
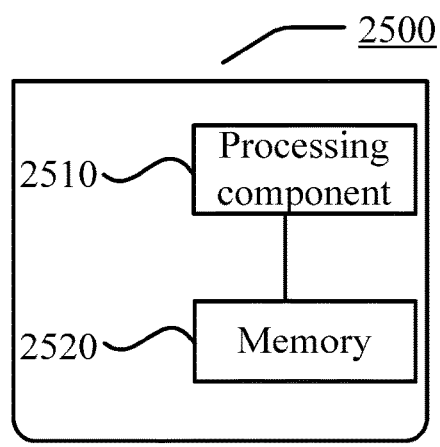
FIG. 51 is a block diagram of an electronic device for measuring a wafer geometry according to an embodiment of the present application.

FIG. 51 is a block diagram of an electronic device for measuring a wafer geometry according to an embodiment of the present application.

Referring to FIG. 51, the electronic device 2500 includes a processing component 2510, and further includes one or more processors, as well as memory resources represented by a memory 2520, which is configured to store an instruction, for example, an application, executable by the processing component 2510. The application stored in the memory 2520 may include one or more modules each corresponding to a set of instructions. In addition, the processing component 2510 is configured to execute an instruction, to perform the above measuring methods of the wafer geometry (including a shape, a thickness, a warp, and a flatness).

The electronic device 2500 may further include a power supply assembly, which is configured to perform power management of the electronic device 2500. A wired or wireless network interface is configured to connect the electronic device 2500 to a network and an input/output (I/O) interface. The measuring system 2500 may operate an operating system, for example, Windows Server™, Mac OS X™, Unix™, Linux™, FreeBSD™, or the like, stored in the memory 2520.

A non-transitory computer-readable storage medium is provided, when an instruction stored in the storage medium is executed by a processor in the above electronic device 2500, the above electronic device 2500 can perform one or more of the measuring method of the wafer shape, the measuring method of the wafer thickness, the measuring method of the wafer warp, the measuring method of the thickness of the mask layer on the wafer, and the measuring method of the wafer flatness in the above embodiments. The method is performed by an agent program.

A person of ordinary skill in the art may be aware that, in combination with the examples described in the embodiments disclosed in the present application, algorithm steps may be implemented by using electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

In the embodiments provided in the present application, it should be understood that the disclosed method, apparatus, and system may be implemented in other manners. For example, the described apparatus embodiment is merely an example. For example, the module division is merely logical function division and may be other division in actual implementation. For example, multiple modules may be combined or integrated into another system, or some features may be ignored or not performed.

When the functions are implemented in a form of a software functional unit and sold or configured as an independent product, the functions may be stored in a computer-readable storage medium. Based on this understanding, the essence of the technical solutions of the present application or the part contributing to the prior art, or some of the technical solutions may be represented in the form of software products. The computer software products are stored in a storage medium, and include a number of instructions to enable a computer device (which may be a personal computer, a server, a network device, or the like) to perform all or some of the steps of the methods described in various embodiments of the present application. The aforementioned storage medium includes various mediums that may store a program code, such as a USB flash drive, a mobile hard disk, a read-only memory (Read-only Memory, ROM), a random access memory (Random Access Memory, RAM), a magnetic disk, or an optical disk.

It may be clearly understood by a person skilled in the art that, for the purpose of convenient and brief description, for a detailed operating process of the above apparatus and unit, refer to a corresponding process in the above method embodiments. Details are not described herein again.

It should be further noted that, a combination of the technical features in the embodiments of the present application is not limited to the combinations described in the embodiments of the present application or the combinations described in specific embodiments of the present application. All the technical features described in the present application can be combined in any suitable form if such combination is not contradictory.

What is claimed is:

1. A measuring apparatus of a wafer geometry, comprising:
an air-bearing chuck, configured to generate an air cushion to keep a wafer to be measured floating up on a top surface of the air-bearing chuck; and
an interferometer, disposed on one side, away from the air-bearing chuck, of the wafer, and configured to obtain an interference fringe image of a front surface of the wafer to measure a geometry of the wafer based on the interference fringe image, wherein the front surface of the wafer is a surface, away from the air-bearing chuck, of the wafer, and the geometry of the wafer comprises one or more of a shape and a flatness of the wafer,
wherein the interferometer comprises a transmission flat close to the air-bearing chuck, and the measuring apparatus further comprises:
a second calibration wafer with a known flatness of $TTV_0$, configured to calibrate the top surface of the air-bearing chuck and a surface, opposite to the air-bearing chuck, of the transmission flat.

2. The measuring apparatus according to claim 1, wherein the air-bearing chuck comprises a plurality of support force nozzles, and the wafer is held at a first predetermined distance from the top surface of the air-bearing chuck by utilizing a first gas ejected from the plurality of support force nozzles, so as to measure the shape of the wafer.

3. The measuring apparatus according to claim 1, wherein the air-bearing chuck comprises a first porous layer composed of a porous material; and an air inlet layer, stacked with the first porous layer and connected to a first gas supply component for supplying a first gas, and configured to transmit the first gas to the first porous layer, so as to keep the wafer floating by utilizing support force provided by the first gas.

4. The measuring apparatus according to claim 2, further comprising:
a capacitive sensor, disposed at a middle of the air-bearing chuck and configured to: measure location information corresponding to at least one location point on a back surface of the wafer to obtain a capacitive sensor reading CPn, or measure the location information to obtain the capacitive sensor reading CPn and monitor whether the wafer is on the air-bearing chuck based on the capacitive sensor reading CPn, or measure the location information to obtain the capacitive sensor reading CPn and monitor the first predetermined distance based on the capacitive sensor reading CPn, wherein the back surface of the wafer is a surface, close to the air-bearing chuck, of the wafer.

5. The measuring apparatus according to claim 4, further comprising:
a laser, located at one side above the top surface of the air-bearing chuck and configured to emit first laser light towards the front surface of the wafer;
a position sensor, located at one side above the top surface of the air-bearing chuck and opposite to the laser, and configured to receive second laser light obtained after reflection of the first laser light from the front surface of the wafer and measure, based on the second laser light, location information corresponding to a first location point on the front surface of the wafer, so as to obtain a position sensor reading Vx, wherein the capacitive sensor is further configured to measure location information corresponding to a second location point on the back surface of the wafer, so as to obtain the capacitive sensor reading CPn, and the first location point and the second location point are two opposite location points representing a thickness of the wafer;
a first calibration wafer; and
a processor, connected to the position sensor and the capacitive sensor to obtain the position sensor reading Vx and the capacitive sensor reading CPn and substitute the position sensor reading Vx and the capacitive sensor reading CPn into a formula: $T_{Wafer}=T0+(CP0-CPn)+Sx(Vx-V0)$, so as to obtain a thickness $T_{Wafer}$ of the wafer, wherein in the formula, T0 denotes a thickness of the first calibration wafer, CP0 denotes a reference capacitive sensor reading obtained when the first calibration wafer is located at a reference predetermined distance, V0 denotes a reference position sensor reading obtained when the first calibration wafer is located at the reference predetermined distance, and S denotes a slope of a straight line in a relation graph composed of a horizontal coordinate representing the position sensor reading Vx obtained when the first calibration wafer is located at different predetermined distances and a vertical coordinate representing a difference hx between the reference capacitive sensor reading CP0 and the capacitive sensor reading CPn obtained when the first calibration wafer is located at different predetermined distances.

6. The measuring apparatus according to claim 5, wherein the air-bearing chuck is further configured to hold the first calibration wafer at different predetermined distances from the top surface of the air-bearing chuck;
the position sensor is further configured to measure location information of a third location point on a first surface of the first calibration wafer when the first calibration wafer is located at different predetermined distances, so as to obtain the position sensor reading Vx, wherein the first surface of the first calibration wafer is a surface, away from the air-bearing chuck, of the first calibration wafer;
the capacitive sensor is further configured to measure location information of a fourth location point on a second surface of the first calibration wafer when the first calibration wafer is located at different predetermined distances, so as to obtain the capacitive sensor reading CPn, wherein the second surface of the first calibration wafer is a surface, close to the air-bearing chuck, of the first calibration wafer, the fourth location point and the third location point are two opposite location points representing a thickness of the first calibration wafer, the different predetermined distances comprise the reference predetermined distance, and when the first calibration wafer is located at the reference predetermined distance, the reference capacitive sensor reading and the reference position sensor reading are denoted by CP0 and V0, respectively; and
the processor is further configured to build the relation graph composed of a horizontal coordinate representing the position sensor reading Vx and a vertical coordinate representing the difference hx between the capacitive sensor reading CPn and the reference capacitive sensor reading CP0, so as to determine the slope of the straight line in the relation graph.

7. The measuring apparatus according to claim 1, further comprising:
a mass sensor, configured to measure mass of the wafer to obtain an average thickness of the wafer.

8. The measuring apparatus according to claim 1, further comprising:
at least one tilt stage, located below the air-bearing chuck and configured to: tip and/or tilt the air-bearing chuck to align the air-bearing chuck with the interferometer; or tip and/or tilt the air-bearing chuck to adjust a distance between the air-bearing chuck and the interferometer, so as to implement mechanical phase shifting; or tip and/or tilt the air-bearing chuck to drive the wafer to be tipped and/or tilted, so as to measure warp of the front surface of the wafer.

9. The measuring apparatus according to claim 1, further comprising:
a plurality of lift pins, located on a periphery of the air-bearing chuck and configured to lift the wafer up from the top surface of the air-bearing chuck.

10. A measuring method of a wafer shape, comprising:
obtaining location information of a surface $S_{TF}$, close to an air-bearing chuck, of a transmission flat;
holding, by utilizing support force provided by the air-bearing chuck, a wafer at a first predetermined distance $D_1$ from a top surface of the air-bearing chuck, so that the wafer is located between the transmission flat and the air-bearing chuck, wherein $D_1>0$;
measuring, by utilizing an interferometer, a first distance variation $\Delta S_1$ between a front surface $S_{Front\ surface}$ of the wafer and the surface $S_{TF}$ of the transmission flat, wherein the front surface of the wafer is configured to reflect light, the front surface of the wafer is a surface, away from the air-bearing chuck, of the wafer, and the interferometer comprises the transmission flat; and
determining a shape of the front surface $S_{Front\ surface}$ of the wafer based on $\Delta S_1$ and the location information of $S_{TF}$, wherein the location information of the surface $S_{TF}$, close to the air-bearing chuck, of the transmission flat is a constant, or the location information of the surface $S_{TF}$, close to the air-bearing chuck, of the transmission flat is a distance variation between a bottom surface of the air-bearing chuck and the surface $S_{TF}$, close to the air-bearing chuck, of the transmission flat.

11. The measuring method of the wafer shape according to claim 10, wherein the obtaining location information of a surface $S_{TF}$, close to an air-bearing chuck, of a transmission flat comprises:
   measuring, by utilizing the interferometer, a second distance variation $\Delta S_2$ between the surface $S_{TF}$ of the transmission flat and a surface $S_{ref}$, close to the transmission flat, of a reference object; and
   determining, based on $\Delta S_2$ and location information of $S_{ref}$, the location information of the surface $S_{TF}$, close to the air-bearing chuck, of the transmission flat.

12. The measuring method of the wafer shape according to claim 11, wherein the reference object is a reference transmission flat, and before the measuring, by utilizing the interferometer, a second distance variation $\Delta S_2$ between the surface $S_{TF}$ of the transmission flat and a surface $S_{ref}$, close to the transmission flat, of a reference object, the measuring method further comprises:
   placing the reference transmission flat at a third predetermined distance $D_3$ from the top surface of the air-bearing chuck, so that the reference transmission flat being located between the transmission flat and the air-bearing chuck, wherein a flatness of the reference transmission flat is less than that of the wafer;
   the measuring, by utilizing the interferometer, a second distance variation $\Delta S_2$ between the surface $S_{TF}$ of the transmission flat and a surface $S_{ref}$, close to the transmission flat, of a reference object comprises:
   measuring, by utilizing the interferometer, the second distance variation $\Delta S_2$ between the surface $S_{TF}$ of the transmission flat and a reference transmission flat surface $S_{TF}$-ref close to the transmission flat; and
   the determining, based on $\Delta S_2$ and location information of $S_{ref}$, the location information of the surface $S_{TF}$, close to the air-bearing chuck, of the transmission flat comprises:
   determining, based on $\Delta S_2$ and location information of $S_{TF}$-ref, the location information of the surface $S_{TF}$, close to the air-bearing chuck, of the transmission flat.

13. The measuring method of the wafer shape according to claim 11, wherein the reference object is the air-bearing chuck, and the measuring, by utilizing the interferometer, a second distance variation $\Delta S_2$ between the surface $S_{TF}$ of the transmission flat and a surface $S_{ref}$, close to the transmission flat, of a reference object comprises:
   measuring, by utilizing the interferometer, the second distance variation $\Delta S_2$ between the surface $S_{TF}$ of the transmission flat and the top surface $S_{CK}$ of the air-bearing chuck, wherein the top surface of the air-bearing chuck is a surface, close to the transmission flat, of the air-bearing chuck, and the top surface of the air-bearing chuck is configured to reflect light; and
   the determining, based on $\Delta S_2$ and location information of $S_{ref}$, the location information of the surface $S_{TF}$, close to the air-bearing chuck, of the transmission flat comprises:
   determining, based on $\Delta S_2$ and location information of $S_{CK}$, the location information of the surface $S_{TF}$, close to the air-bearing chuck, of the transmission flat.

14. A measuring method of a wafer flatness, comprising:
   adjusting a back surface of a wafer by utilizing suction force provided by an air-bearing chuck to keep the back surface of the wafer flat or make the back surface of the wafer match a top surface of the air-bearing chuck, wherein the back surface of the wafer is a surface, close to the air-bearing chuck, of the wafer;
   holding, by utilizing support force provided by the air-bearing chuck, the wafer at a second predetermined distance $D_2$ from the top surface of the air-bearing chuck;
   measuring, by utilizing an interferometer, a third distance variation $\Delta S_3$ between opposing surfaces of the wafer and the transmission flat, wherein the interferometer is located on one side, away from the air-bearing chuck, of the transmission flat, the top surface of the air-bearing chuck and a front surface of the wafer are configured to reflect light, and the front surface of the wafer is a surface, away from the air-bearing chuck, of the wafer; and
   obtaining a flatness $TTV_1$ of the wafer based on $\Delta S_3$ and a fourth distance variation $\Delta S_4$, wherein $\Delta S_4$ denotes a distance variation, measured by utilizing the interferometer when the wafer is not loaded, between opposing surfaces of the air-bearing chuck and the transmission flat.

15. The measuring method of the wafer flatness according to claim 14, further comprising:
   obtaining a nonconforming item $S_{N.C.}$ between the back surface of the wafer and the top surface of the air-bearing chuck,
   wherein the obtaining a flatness $TTV_1$ of the wafer based on $\Delta S_3$ and a fourth distance variation $\Delta S_4$ comprises:
   obtaining the flatness $TTV_1$ of the wafer by subtracting $\Delta S_3$ and $S_{N.C.}$ from $\Delta S_4$.

16. The measuring method of the wafer flatness according to claim 15, wherein the obtaining a nonconforming item $S_{N.C.}$ between the back surface of the wafer and the top surface of the air-bearing chuck comprises:
   placing a calibration wafer with a known flatness of $TTV_0$ on the air-bearing chuck;
   measuring, by utilizing the interferometer, a distance variation $\Delta S_0$ between opposing surfaces of the calibration wafer and the transmission flat; and
   obtaining the nonconforming item $S_{N.C.}$ by subtracting $\Delta S_0$ and $TTV_0$ from $\Delta S_4$.

17. The measuring method of the wafer flatness according to claim 16, wherein the placing a calibration wafer with a known flatness of $TTV_0$ on the air-bearing chuck comprises:
   laying the calibration wafer with a known flatness of $TTV_0$ on the air-bearing chuck; or
   keeping, by utilizing support force provided by the air-bearing chuck, the calibration wafer with a known flatness of $TTV_0$ floating up on the air-bearing chuck.

18. The measuring method of the wafer flatness according to claim 14, wherein the adjusting a back surface of the wafer by utilizing suction force provided by an air-bearing chuck to keep the back surface of the wafer flat or make the back surface of the wafer match a top surface of the air-bearing chuck comprises:
   adjusting, by utilizing the suction force provided by the air-bearing chuck, the back surface of the wafer to be adsorbed on the top surface of the air-bearing chuck,
   wherein the measuring method of the wafer flatness further comprises:
   rotating the air-bearing chuck 180 degrees in a plane parallel to the top surface of the air-bearing chuck to obtain the air-bearing chuck after rotation;

making, by utilizing the air-bearing chuck after the rotation, the wafer adsorbed on a top surface of the air-bearing chuck after the rotation;

measuring, by utilizing the interferometer, a fifth distance variation $\Delta S_5$ between opposing surfaces of the transmission flat and the wafer;

determining a distance variation $\Delta S_{Mark/Artifact}$ of a mark or artifact on the air-bearing chuck by subtracting $\Delta S_3$ from $\Delta S_5$; and obtaining a calibrated flatness $TTV_1'$ of the wafer by subtracting $\Delta S_{Mark/Artifact}$ from $TTV_1$.

19. The measuring method of the wafer flatness according to claim 14, wherein the adjusting a back surface of the wafer by utilizing suction force provided by an air-bearing chuck to keep the back surface of the wafer flat or make the back surface of the wafer match a top surface of the air-bearing chuck comprises:

adjusting, by utilizing the suction force provided by the air-bearing chuck, the back surface of the wafer to be adsorbed on the top surface of the air-bearing chuck, wherein the measuring method of the wafer flatness further comprises:

rotating the wafer 180 degrees in a plane parallel to the top surface of the air-bearing chuck to obtain the wafer after rotation;

adjusting, by utilizing the suction force provided by the air-bearing chuck, a back surface of the wafer after the rotation to make the wafer after the rotation adsorbed on the top surface of the air-bearing chuck;

measuring, by utilizing the interferometer, a sixth distance variation $\Delta S_6$ between opposing surfaces of the transmission flat and the wafer after the rotation;

determining a distance variation $\Delta S_{Mark/Artifact}$ of a mark or artifact on the air-bearing chuck by comparing $\Delta S_6$ with $\Delta S_3$; and obtaining a calibrated flatness $TTV_1'$ of the wafer by subtracting $\Delta S_{Mark/Artifact}$ from $TTV_1$.

* * * * *